US012566376B2

(12) United States Patent
Sakata et al.

(10) Patent No.: US 12,566,376 B2
(45) Date of Patent: Mar. 3, 2026

(54) RESIST COMPOSITION AND RESIST PATTERN FORMING METHOD

(71) Applicant: TOKYO OHKA KOGYO CO., LTD., Kawasaki (JP)

(72) Inventors: Makoto Sakata, Kawasaki (JP); Masatoshi Arai, Kawasaki (JP); Takatoshi Inari, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 680 days.

(21) Appl. No.: 18/145,479

(22) Filed: Dec. 22, 2022

(65) Prior Publication Data

US 2023/0205084 A1 Jun. 29, 2023

(30) Foreign Application Priority Data

Dec. 27, 2021 (JP) ................................ 2021-213455

(51) Int. Cl.
*G03F 7/029* (2006.01)

(52) U.S. Cl.
CPC .................................. *G03F 7/029* (2013.01)

(58) Field of Classification Search
None
See application file for complete search history.

(56) References Cited

U.S. PATENT DOCUMENTS

| | | | | |
|---|---|---|---|---|
| 2008/0268370 | A1* | 10/2008 | Tanaka | G03F 7/0397 430/322 |
| 2014/0308605 | A1 | 10/2014 | Ito et al. | |
| 2017/0059995 | A1 | 3/2017 | Furutani et al. | |
| 2019/0196329 | A1 | 6/2019 | Nagamine et al. | |
| 2020/0192223 | A1 | 6/2020 | Motoike et al. | |
| 2021/0271162 | A1 | 9/2021 | Ou et al. | |

FOREIGN PATENT DOCUMENTS

| | | | |
|---|---|---|---|
| JP | 2013-152450 | A | 8/2013 |
| JP | 2020-098250 | A | 6/2020 |
| TW | A-200900861 | | 1/2009 |
| TW | A-201937276 | | 9/2019 |
| WO | WO 2015/190174 | A1 | 12/2015 |
| WO | WO 2020/105505 | A1 | 5/2020 |

* cited by examiner

*Primary Examiner* — Anca Eoff
(74) *Attorney, Agent, or Firm* — Knobbe, Martens, Olson & Bear, LLP

(57) ABSTRACT

A resist composition which generates an acid when the resist composition is exposed and whose solubility with respect to a developing liquid varies by action of the acid. The resist composition contains a base material component whose solubility with respect to a developing liquid is varied by action of an acid and an acid generator component that generates an acid when the acid generator component is exposed. The base material component contains a polymer compound that includes a constituent represented by a general formula (a-1) described in the specification and a constituent (a2) represented by a general formula (a-2) described in the specification. The acid generator component contains a compound represented by a general formula (b1) described in the specification.

4 Claims, No Drawings

RESIST COMPOSITION AND RESIST PATTERN FORMING METHOD

CROSS-REFERENCE TO RELATED APPLICATIONS

This application claims priority from Japanese Patent Application No. 2021-213455 filed on Dec. 27, 2021, the entire subject matter of which is incorporated herein by reference.

TECHNICAL FIELD

The present invention relates to a resist composition and a resist pattern forming method.

BACKGROUND ART

In lithography technologies, for example, a process of forming a resist pattern having prescribed shapes in a resist film is performed by forming the resist film made of a resist material on a substrate and exposing the resist film selectively and then developing the exposed resist film. A resist material in which exposed portions of the resist film are changed in properties so as to be dissolved in a developing liquid is called a positive resist and a resist material in which exposed portions of the resist film are changed in properties so as not to be dissolved in a developing liquid is called a negative resist.

In recent years, in manufacture of semiconductor devices and liquid crystal display devices, the degree of miniaturization of patterns has increased rapidly by virtue of the development of lithography technologies.

A common miniaturization technique is wavelength shortening (energy increase) of an exposing light source. More specifically, whereas ultraviolet light as typified by a g-line and an i-line is used conventionally, mass production of semiconductor devices using a KrF excimer laser or an ArF excimer laser has already started. The use of an EUV (extreme ultraviolet light), an EB (electron beam), an X-ray, etc. that are shorter in wavelength or higher in energy than these kinds of excimer lasers is also being studied.

In this situation, resist materials are required to be high in the sensitivity for such an exposing light or energy source and provide lithographic properties such as a resolution that enable reproduction of patterns having very small dimensions.

Used conventionally as resist materials that satisfy such requirements are chemically amplified resist compositions that contain an acid generator component that generates an acid when the acid generator component is exposed and a base material component whose solubility with respect to a developing liquid is varied by action of an acid.

In general, a base resin that is used in a chemically amplified resist composition has plural constituents to improve lithography properties etc.

For example, in Patent document 1, a resist composition that is high in sensitivity and is so high in lithographic properties as to enable formation of a resist pattern having good shapes as well as a related resist pattern forming method are discussed. Patent document 1 also discloses, for example, a resist composition that employs a polymer compound that includes plural constituents having particular structures, and that is increased in the dissociation property with respect to an acid.

Patent document 1: JP-A-2020-098250

SUMMARY OF INVENTION

In a situation that lithography technologies are advancing further and resist patterns are being miniaturized further, resist compositions are required to be high in the sensitivity for an exposing light (energy) source and have excellent lithographic properties that enable roughness reduction etc.

However, to satisfy both of high sensitivity and excellent lithographic properties, conventional resist compositions as exemplified by the one disclosed in Patent document 1 have room for improvements.

The present invention has been made in view of the above circumstances, and an object of the present invention is therefore to provide a resist composition that enables increase in sensitivity and is so high in lithographic properties as to enable formation of an excellent resist pattern, as well as a related resist pattern forming method.

The present inventors have studied diligently to solve the above problem and completed the invention by finding out that a resist composition that is high in sensitivity and is so high in lithographic properties as to enable formation of an excellent resist pattern as well as a related resist pattern forming method can be obtained by the following configurations and method.

That is, the invention provides the following:

[1] A resist composition which generates an acid when the resist composition is exposed and whose solubility with respect to a developing liquid is varied by action of the acid, in which:

the resist composition contains a base material component (A) whose solubility with respect to a developing liquid is varied by action of an acid and an acid generator component (B) that generates an acid when the acid generator component (B) is exposed;

the base material component (A) contains a polymer compound (A1) that contains a constituent (a1) represented by the following general formula (a-1):

(a-1)

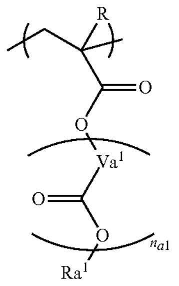

in the general formula (a-1), R represents a hydrogen atom, an alkyl group having a carbon atom number of 1 to 5, or an alkyl halide group having a carbon atom number of 1 to 5, $Va^1$ represents a divalent hydrocarbon group that may have an ether bond, $n_{a1}$ represents an integer of 0 to 2, and $Ra^1$ represents a substituent that is represented by one of the following formulae (y-1) and (y-2):

(y-1)

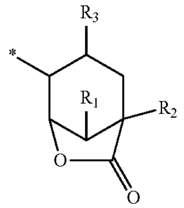

(y-2)

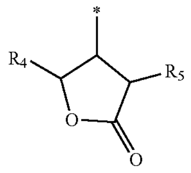

in the formulae (y-1) and (y-2), each of $R_1$, $R_2$ and $R_3$ represents an alkyl group that may include a hetero atom, a hetero atom, a cyano group, or a hydrogen atom, $R_1$ and $R_3$ may be connected to each other to form a ring and may be an alkylene group having a carbon atom number of 1 to 6 that may include an oxygen atom (—O—) or a sulfur atom (—S—), an ether bond, or a thioether bond, with the proviso that at least one of $R_1$ and $R_2$ includes a hetero atom or $R_1$ and $R_3$ are connected to each other so as to represent a hetero atom, each of $R_4$ and $R_5$ represents an alkyl group that may include a hydrogen atom or a hetero atom, and symbol "*" represents a bond;

the polymer compound (A1) further contains a constituent (a2) represented by the following general formula (a-2):

(a-2)

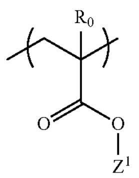

in the general formula (a-2), $R_0$ represents a hydrogen atom, an alkyl group having a carbon atom number of 1 to 5, or an alkyl halide group having a carbon atom number of 1 to 5, $Z_1$ represents an organic group including a polycyclic hydrocarbon group to which at least two hydroxyl groups are connected, and a carbon atom of the organic group may be replaced by a hetero atom; and the acid generator component (B) contains a compound that is represented by the following general formula (b1):

(b1)

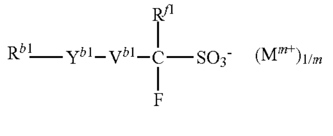

in the general formula (b1), $R^{b1}$ represents a monovalent hydrocarbon group having a carbon atom number of 17 to 50 that has a steroid framework and may include a heteroatom, $Y^{b1}$ represents a single bond or a divalent linking group including a hetero atom, $V^{b1}$ represents an alkylene having a carbon atom number of 2 or larger, a fluorinated alkylene group or an ester group, $R^{f1}$ represents a hydrogen atom, a fluorine atom, or an alkyl group that may include a fluorine atom, m is an integer of 1 or larger, and $M^{m+}$ represents an m-valent organic cation.

[2] The resist composition according to item [1], in which $M^{m+}$ in the general formula (b1) is a cation that is represented by the following formula (b-2):

(b-2)

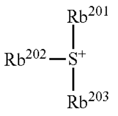

in the formula (b-2), each of $Rb^{201}$ and $Rb^{202}$ represents an aryl group that may include a substituent, $Rb^{203}$ represents an aryl group that may include a substituent, an alkyl group that may include a substituent, or an alkenyl group that may include a substituent, and $Rb^{201}$ to $Rb^{203}$ may be connected to each other to form a ring together with a sulfur atom in the formula (b-2).

[3] The resist composition according to item [1] or [2], in which the polymer compound (A1) further contains a constituent (a3) represented by the following general formula (a-3):

(a-3)

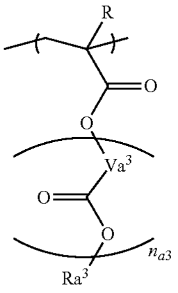

in the general formula (a-3), R represents a hydrogen atom, an alkyl group having a carbon atom number of 1 to 5, or an alkyl halide group having a carbon atom number of 1 to 5, $Va^3$ represents a divalent hydrocarbon group that may have an ether bond, $n_{a3}$ represents an integer of 0 to 2, and $Ra^3$ represents an acid-dissociable group including an alicyclic hydrocarbon group.

[4] A resist pattern forming method including:

forming a resist film on a support body using the resist composition according to any one of items [1] to [3];

exposing the resist film; and forming a resist pattern by developing the resist film.

The invention can provide a resist composition that is high in sensitivity and is so high in lithographic properties as to enable formation of an excellent resist pattern, as well as a related resist pattern forming method.

DETAILED DESCRIPTION OF THE EMBODIMENTS

Embodiments of the present invention will be hereinafter described in detail. However, the invention should not be limited to the following embodiments.

In this disclosure, the term "aliphatic" is a concept that is relative to "aromatic" and is defined as a group, a compound, or the like that has no aromaticity.

The term "alkyl group" is defined as including a linear, branched, or cyclic monovalent saturated hydrocarbon group unless otherwise specified. An alkyl group in an alkoxy group is defined is the same manner.

The term "alkylene group" is defined as including a linear, branched, or cyclic divalent saturated hydrocarbon group unless otherwise specified.

The term "alkyl halide group" means a group obtained by replacing all or part of the hydrogen atoms of an alkyl group with a halogen atom, examples of which include a fluorine atom, a chlorine atom, a bromine atom and an iodine atom.

The term "fluorinated alkyl group" or "fluorinated alkylene group" means a group obtained by replacing all or part of the hydrogen atoms of an alkyl group or an alkylene group with a fluorine atom.

The term "constituent" means a monomer unit that constitutes a polymer compound (resin, polymer, or copolymer).

The expression "may include a substituent" includes both of a case that a hydrogen atom (—H) is replaced by a monovalent group and a case that a methylene group ($—CH_2—$) is replaced by a divalent group.

The term "exposure" is a concept including whole irradiation with radiation.

The expression "constituent derived from an acrylic acid ester" means a constituent that is formed when the ethylenic double bond of an acrylic acid ester is broken.

"Acrylic acid ester" is a compound obtained by replacing the hydrogen atom at the end of the carboxy group of acrylic acid ($CH_2{=}CH—COOH$) with an organic group.

"Acrylic acid ester" may be a compound obtained by replacing, with a substituent, the hydrogen atom that is connected to the carbon atom located at the α position. The substituent ($R^{\alpha 0}$) to replace the hydrogen atom that is connected to the carbon atom located at the α position is an atom other than a hydrogen atom or a group, examples of which include an alkyl group having a carbon atom number of 1 to 5 and an alkyl halide group having a carbon atom number of 1 to 5. "Acrylic acid ester" includes itaconic acid diester obtained by replacing the substituent $R^{\alpha 0}$ with a substituent including an ester bond and σc-hydroxy acrylic ester obtained by replacing the substituent $R^{\alpha 0}$ with a hydroxy alkyl group or a group obtained by modifying its hydroxyl group. It is noted that the carbon atom located at the α position of "acrylic acid ester" is the carbon atom, to which the carbonyl group is connected, of "acrylic acid ester" unless otherwise specified.

In the following, acrylic acid ester obtained by replacing, with a substituent, the hydrogen atom that is connected to the carbon atom located at the α position may be referred to as "α-replaced acrylic acid ester." Furthermore, acrylic acid ester and α-replaced acrylic acid ester may be referred to together as "(α-replaced) acrylic acid ester."

An alkyl group as the above-mentioned substituent located at the α position is preferably a linear or branched alkyl group, specific examples of which include alkyl groups (methyl group, ethyl group, propyl group, isopropyl group, n-butyl group, isobutyl group, tert-butyl group, pentyl group, isopentyl group and neopentyl group) having a carbon atom number of 1 to 5.

Specific examples of an alkyl halide group as the substituent located at the α position include groups obtained by replacing, with a halogen atom, all or part of the hydrogen atoms of the above-mentioned "alkyl group as the substituent located at the α position." Examples of such a halogen atom include a fluorine atom, a chlorine atom, a bromine atom and an iodine atom, among which a fluorine atom is particularly preferable.

Specific examples of a hydroxy alkyl group as the substituent located at the α position include groups obtained by replacing, with a hydroxyl group, all or part of the hydrogen atoms of the above-mentioned "alkyl group as the substituent located at the α position." It is preferable that the number of hydroxyl groups in the hydroxy alkyl group be 1 to 5, most preferably 1.

In this disclosure, a numerical range indicated using the symbol "-" (or word "to") means a range that includes numerical values written before and after the symbol "-" (or word "to") as the lower limit value and the upper limit value, respectively.

Furthermore, in this disclosure, in the case where a composition contains plural substances corresponding to each component of the composition, the amount of the component of the composition means the sum of contents of the plural substances existing in the composition, unless otherwise specified.

Still further, in this disclosure, a chemical structural formula may be written in the form of a simplified structural formula in which hydrogen atoms are omitted.

In this disclosure, depending on a structure of a chemical formula, a chiral carbon may exist and hence enantiomers or diastereomers may exist. In this case, such isomers are represented by a single chemical formula. Such isomers may be used either singly or in the form of a mixture.

In this disclosure, "mass %" and "weight %" are the same in meaning and "parts by mass" and "parts by weight" are also the same in meaning.

[Resist Composition]

A resist composition according to an embodiment of the invention is a resist composition that generates an acid when the resist composition is exposed and whose solubility with respect to a developing liquid is varied by action of the acid, in which:

- the resist composition contains a base material component (A) (hereinafter may be referred to as a "component (A)") whose solubility with respect to a developing liquid is varied by action of an acid and an acid generator component (B) (hereinafter may be referred to as a "component (B)") that generates an acid when the component (B) is exposed;
- the base material component (A) contains a polymer compound (A1) (hereinafter may be referred to as a "component (A1)") that includes a constituent (a1) represented by the general formula (a-1) and a constituent (a2) represented by the general formula (a-2); and
- the acid generator component (B) contains a compound that is represented by the general formula (b1).

When a resist film is formed using the resist composition according to the embodiment and the resist film is exposed selectively, in exposed portions of the resist film an acid is generated and the solubility of the component (A) with respect to a developing liquid is changed by action of the generated acid and, on the other hand, in unexposed portions of the resist film the solubility of the component (A) with respect to the developing liquid is not changed. As a result, a difference occurs in the solubility with respect to the developing liquid between the exposed portions and the unexposed portions of the resist film. Thus, when the resist film is developed, if the resist composition is of a positive type, the exposed portions of the resist film are dissolved and removed, whereby a positive resist pattern is formed. On the other hand, if the resist composition is of a negative type, the unexposed portions of the resist film are dissolved and removed, whereby a negative resist pattern is formed.

In this specification, a resist composition that forms a positive resist pattern by dissolution and removal of exposed portions of a resist film is called a positive resist composition and a resist composition that forms a negative resist pattern by dissolution and removal of unexposed portions of a resist film is called a negative resist composition.

The resist composition according to the embodiment may be either a positive resist composition or a negative resist composition.

The resist composition according to the embodiment may be either for use in an alkali development process that is carried out with an alkali developing liquid in a development step for formation of a resist pattern or for use in a solvent development process that is carried out with a developing liquid containing an organic solvent (i.e., organic developing liquid) in the development step.

That is, the resist composition according to the embodiment serves as a “positive resist composition for an alkali development process” that forms a positive resist pattern in an alkali development process and serves as a “negative resist composition for a solvent development process” that forms a negative resist pattern in a solvent development process.

The resist composition according to the embodiment is a resist composition that generates an acid when the resist composition is exposed and whose solubility with respect to a developing liquid is varied by action of the acid, and contains the base material component (A) whose solubility with respect to a developing liquid is varied by action of an acid and the acid generator component (B) that generates an acid when the acid generator component (B) is exposed.

The component (A) may generate an acid when the component (A) is exposed, in which case the component (A) serves as a “base material component that generates an acid when the base material component is exposed and whose solubility with respect to a developing liquid is varied by action of the acid”. In the case where the component (A) is a base material component that generates an acid when the base material component is exposed and whose solubility with respect to a developing liquid is varied by action of the acid, it is preferable that the component (A1) (described later) be a polymer compound that generates an acid when the component (A1) is exposed and whose solubility with respect to a developing liquid is varied by action of the acid. A copolymer having a constituent that generates an acid when the constituent is exposed can be used as such the polymer compound. Examples of the constituent that generates an acid when the constituent is exposed includes known ones.

Since the constituent (a1) contained in the base material component (A) contains a lactone-containing cyclic group having a particular structure, the resist composition according to the embodiment is effective in increasing the adhesion of a resist film to a substrate when the component (A) is used for formation of the resist film. Furthermore, in an alkali development process, the solubility of a resist film with respect to an alkali developing liquid is increased at the time of development. In addition, having at least two hydroxyl groups, the constituent (a2) can satisfactorily control diffusion of an acid generated by exposure.

Furthermore, the resist composition according to the embodiment contains a compound that is represented by the general formula (b1) (described later) as the acid generator component (B). Having a steroid structure, the acid generator that is represented by the general formula (b1) can control diffusion of an acid generated by exposure more satisfactorily. As a result, it is inferred that the resist composition according to the embodiment can increase the sensitivity and is so high in lithographic properties as to enable formation of an excellent resist pattern.

<<Component (A)>>

In the resist composition according to the embodiment, the component (A) is a base material component whose solubility with respect to a developing liquid is varied by action of an acid and contains the above-mentioned component (A1). The component (A) may be either one whose solubility with respect to a developing liquid is increased by action of an acid or one whose solubility with respect to a developing liquid is decreased by action of an acid. Since the polarity of the base material component (A) after exposure is changed from that before the exposure, high development contrast can be obtained in not only an alkali development process but also a solvent development process.

In the case where an alkali development process is employed, the base material component (A) containing the component (A1) is poorly soluble with respect to an alkali developing liquid before exposure. When an acid is generated from the component (B) by exposure, the solubility of the base material component (A) with respect to an alkali developing liquid increases because the polarity of the base material component (A) is increased by action of the acid. Thus, in formation of resist pattern, when a resist film obtained by applying the resist composition to a support body is exposed selectively, unexposed portions of the resist film remain poorly soluble with respect to an alkali while exposed portions of the resist film are changed from poorly soluble with respect to an alkali developing liquid to soluble, whereby a positive resist pattern is formed by alkali development.

On the other hand, in the case where a solvent development process is employed, the base material component (A) containing the component (A1) is highly soluble with respect to an organic developing liquid before exposure. When an acid is generated from the component (B) by exposure, the solubility of the base material component (A) with respect to an organic developing liquid decreases because the polarity of the base material component (A) is increased by action of the acid. Thus, in formation of resist pattern, when a resist film obtained by applying the resist composition to a support body is exposed selectively, unexposed portions of the resist film remain soluble while exposed portions of the resist film are changed from soluble with respect to an organic developing liquid to poorly soluble. Thus, contrast can be established between the exposed portions and the unexposed portions by development using an organic developing liquid, whereby a negative resist pattern is formed.

In the resist composition according to the embodiment of the invention, one kind of the component (A) may be used singly or two or more kinds of the components (A) may be used in combination.

About Component (A1):

In the resist composition according to the embodiment of the invention, the component (A) contains a polymer compound (A1) that includes a constituent (a1) represented by the following general formula (a-1) and a constituent (a2) represented by the following general formula (a-2).

(Constituent (a1) Represented by General Formula (a-1))

The constituent (a1) is represented by the following general formula (a-1).

Since the constituent (a1) contains a lactone-containing cyclic group represented by formula (y-1) or (y-2), it is effective in increasing the adhesion of a resist film to a substrate in the case where the component (A1) is used in forming the resist film. In an alkali development process, the solubility of a resist film with respect to an alkali developing liquid is increased at the time of development.

The "lactone-containing cyclic group" is a cyclic group having, in its ring framework, a ring (lactone ring) including —O—C(═O)—. With the lactone ring regarded as the first ring, the lactone-containing cyclic group is called a monocyclic group if it contains only the lactone ring and is called a polycyclic group irrespective of its structure if it contains another or other ring structures.

(a-1)

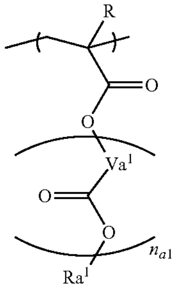

In the general formula (a-1), R represents a hydrogen atom, an alkyl group having a carbon atom number of 1 to 5, or an alkyl halide group having a carbon atom number of 1 to 5. $Va^1$ represents a divalent hydrocarbon group that may have an ether bond. Symbol "$n_{a1}$" represents an integer of 0 to 2. $Ra^1$ represents a substituent that is represented by one of the following formulae (y-1) and (y-2).

(y-1)

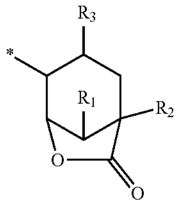

(y-2)

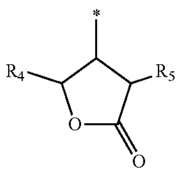

In the formulae (y-1) and (y-2), each of $R_1$, $R_2$ and $R_3$ represents an alkyl group that may include a hetero atom, a hetero atom, a cyano group, or a hydrogen atom. $R_1$ and $R_3$ may be connected to each other to form a ring and may be an alkylene group having a carbon atom number of 1 to 6 that may include an oxygen atom (—O—) or a sulfur atom (—S—), an ether bond, or a thioether bond. However, at least one of $R_1$ and $R_2$ includes a hetero atom or $R_1$ and $R_3$ are connected to each other so as to represent a hetero atom. Each of $R_4$ and $R_5$ represents an alkyl group that may include a hydrogen atom or a hetero atom. Symbol "*" represents a bond.

In the general formula (a-1), the alkyl group having a carbon atom number of 1 to 5 that is represented by R is preferably a linear or branched alkyl group having a carbon atom number of 1 to 5; specific examples include a methyl group, an ethyl group, a propyl group, an isopropyl group, an n-butyl group, an isobutyl group, a tert-butyl group, a pentyl group, an isopentyl group and a neopentyl group. An alkyl halide group having a carbon atom number of 1 to 5 is a group obtained by replacing all or part of the hydrogen atoms of the alkyl group having a carbon atom number of 1 to 5 with a halogen atom. Examples of the halogen atom include a fluorine atom, a chlorine atom, a bromine atom and an iodine atom, among which a fluorine atom is particularly preferably.

It is preferable that R represent a hydrogen atom, an alkyl group having a carbon atom number of 1 to 5, or a fluorinated alkyl group having a carbon atom number of 1 to 5, a hydrogen atom and a methyl group are most preferable from the viewpoint of the ease of acquisition in an industrial sense.

In the general formula (a-1), $Va^1$ represents a divalent hydrocarbon group that may have an ether bond. The divalent hydrocarbon group represented by $Va^1$ may be either an aliphatic hydrocarbon group or an aromatic hydrocarbon group, each of which may have an ether bond.

The aliphatic hydrocarbon group as the divalent hydrocarbon group represented by $Va^1$ may be either saturated or unsaturated; usually a state of saturation is preferable.

More specific examples of the aliphatic hydrocarbon group include a linear or branched aliphatic hydrocarbon groups and an aliphatic hydrocarbon group having a ring in its structure.

It is preferable that the carbon atom number of the above-mentioned linear aliphatic hydrocarbon group be 1 to 10, more preferably 1 to 6, further preferably 1 to 4, and most preferably 1 to 3.

The linear aliphatic hydrocarbon group is preferably a linear alkylene group, specific examples of which include a methylene group ($—CH_2—$), an ethylene group ($—(CH_2)_2—$), a trimethylene group ($—(CH_2)_3—$), a tetramethylene group ($—(CH_2)_4—$) and a pentamethylene group ($—(CH_2)_5—$).

It is preferable that the carbon atom number of the above-mentioned branched aliphatic hydrocarbon group be 3 to 10, more preferably 3 to 6, further preferably 3 or 4, and most preferably 3.

The branched aliphatic hydrocarbon group is preferably a branched alkylene group, specific examples of which include alkyl alkylene groups such as, alkyl methylene groups such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$ and $—C(CH_2CH_3)_2—$; alkyl ethylene groups such as $—CH(CH_3)CH_2—$, $—CH(CH_3)CH(CH_3)—$, $—C(CH_3)_2CH_2—$, $—CH(CH_2CH_3)CH_2—$ and $—C(CH_2CH_3)_2CH_2—$; alkyl trimethylene groups such as $—CH(CH_3)CH_2CH_2—$ and $—CH_2CH(CH_3)CH_2—$; and alkyl tetramethylene groups such as $—CH(CH_3)CH_2CH_2CH_2—$ and $—CH_2CH(CH_3)CH_2CH_2—$. The alkyl group in the alkyl alkylene group is preferably a linear alkyl group having a carbon atom number of 1 to 5.

Examples of the aliphatic hydrocarbon group having a ring in its structure include an alicyclic hydrocarbon group (i.e., a group obtained by removing two hydrogen atoms from an aliphatic hydrocarbon ring), a group in which an alicyclic hydrocarbon group is connected to the end of a linear or branched aliphatic hydrocarbon group, and a group in which an alicyclic hydrocarbon group exists at an intermediate position of a linear or branched aliphatic hydrocarbon group. Examples of this linear or branched aliphatic hydrocarbon group are the same as the above-mentioned examples of the linear aliphatic hydrocarbon group or the branched aliphatic hydrocarbon group.

It is preferable that the carbon atom number of this alicyclic hydrocarbon group be 3 to 20, more preferably 3 to 12.

This alicyclic hydrocarbon group may be either polycyclic or monocyclic. The monocyclic alicyclic hydrocarbon group is preferably a group obtained by removing two hydrogen atoms from a monocycloalkane. It is preferable that the carbon atom number of the monocycloalkane be 3 to 6; specific examples include cyclopentane and cyclohexane. The polycyclic alicyclic hydrocarbon group is preferably a group obtained by removing two hydrogen atoms from a polycycloalkane. It is preferable that the carbon atom number of the polycycloalkane be 7 to 12; specific examples include adamantane, norbornane, isobornane, tricyclodecane and tetracyclododecane.

The aromatic hydrocarbon group as the divalent hydrocarbon group represented by $Va^1$ is a hydrocarbon group having an aromatic ring. It is preferable that the carbon atom number of such an aromatic hydrocarbon group be 3 to 30, more preferably 5 to 30, further preferably 5 to 20, particularly preferably 6 to 15, and most preferably 6 to 10. However, the carbon atom number does not include the number of carbons existing in a substituent(s).

Specific examples of the aromatic ring of the aromatic hydrocarbon group include aromatic hydrocarbon rings such as benzene, biphenyl, fluorene, naphthalene, anthracene, and phenanthrene and aromatic heterocycles obtained by replacing part of the carbon atoms constituting the aromatic hydrocarbon rings with a hetero atom. Examples of the hetero atom in such an aromatic hydrocarbon ring include an oxygen atom, a sulfur atom and a nitrogen atom.

Specific examples of such an aromatic hydrocarbon group include a group (arylene group) obtained by replacing two hydrogen atoms from the above aromatic hydrocarbon ring and a group (e.g., a group obtained by further removing one hydrogen atom from an aryl group of an arylalkyl group such as a benzyl group, a phenethyl group, a 1-naphthylmethyl group, a 2-naphthylmethyl group, a 1-naphthylethyl group and a 2-naphthylethyl group) obtained by replacing, with an alkylene group, another one of the hydrogen atoms of a group (aryl group) obtained by removing one hydrogen atom from the above aromatic hydrocarbon ring. It is preferable that the carbon atom number of the above alkylene group (i.e., an alkyl chain in the arylalkyl group) be 1 to 4, more preferably 1 or 2, and particularly preferably 1.

In the above-mentioned general formula (a-1), $n_{a1}$ is an integer of 0 to 2, preferably 0 or 1, and more preferably 0.

In the above-mentioned general formula (a-1), $Ra^1$ represents a substituent represented by one of the above-described formulae (y-1) and (y-2).

In the formula (y-1), each of $R_1$, $R_2$ and $R_3$ represents an alkyl group that may include a hetero atom, a hetero atom, a cyano group, or a hydrogen atom. $R_1$ and $R_3$ may be connected to each other to form a ring and may be an alkylene group having a carbon atom number of 1 to 6 that may include an oxygen atom (—O—) or a sulfur atom (—S—), an ether bond, or a thioether bond. However, at least one of $R_1$ and $R_2$ includes a hetero atom or $R_1$ and $R_3$ are connected to each other so as to represent a hetero atom.

It is preferable that the hetero atom in each of $R_1$, $R_2$ and $R_3$ be an oxygen atom, a sulfur atom, a nitrogen atom, or a fluorine atom, more preferably an oxygen atom, a sulfur atom, or a nitrogen atom, further preferably an oxygen atom or a sulfur atom, and most preferably an oxygen atom.

Examples of the alkyl group in $R_1$, $R_2$ and $R_3$ include an alkyl group having a carbon atom number of 1 to 6, preferably a linear or branched alkyl group such as a methyl group, an ethyl group, an n-propyl group and an isopropyl group.

Examples of the alkyl group containing a hetero atom in $R_1$, $R_2$ and $R_3$ include a group in which —O— or —S— exists between carbon atoms of the alkyl group, a group in which —S— exists at the end, on the side of connection to a lactone ring, of the alkyl group, an alkoxy group and a fluorinated alkyl group.

Examples of the group in which —O— or —S— exists between carbon atoms of the alkyl group include $—CH_2—O—CH_3$, $—CH_2—S—CH_3$.

Examples of the group in which —S— exists at the end, on the side of connection to a lactone ring, of the alkyl group include a group obtained by connecting a sulfur atom —S— to the alkyl group that was mentioned above as the alkyl group in $R_1$, $R_2$ and $R_3$, such as $—S—CH_3$.

The alkoxy group is preferably an alkoxy group having a carbon atom number of 1 to 6. It is preferable that the alkoxy group be linear or branched. Specific examples include a group obtained by connecting an oxygen atom —O— to the alkyl group that was mentioned above as the alkyl group in $R_1$, $R_2$ and $R_3$.

Examples of the fluorinated alkyl group include a group obtained by replacing all or part of the hydrogen atoms of the above alkyl group with a fluorine atom. The fluorinated alkyl group in $R_1$, $R_2$ and $R_3$ is preferably a trifluoromethyl group.

As for $R_1$, $R_2$ and $R_3$, it is preferable that $R_1$ and $R_3$ be connected to represent a hetero atom (preferably an oxygen atom) and $R_2$ represent a hydrogen atom or that $R_1$ and $R_3$ be connected to represent a methylene group and $R_2$ represent a cyano group.

In the formula (y-2), each of $R_4$ and $R_5$ represents an alkyl group that may include a hydrogen atom or a hetero atom.

Examples of the hetero atom that may be included in the alkyl group in $R_4$ and $R_5$ include an oxygen atom, a sulfur atom, a nitrogen atom and a fluorine atom, among which an oxygen atom, a sulfur atom and a nitrogen atom are preferable, an oxygen atom and a sulfur atom are more preferable, and an oxygen atom is further preferable.

Examples of the alkyl group in $R_4$ and $R_5$ include an alkyl group having a carbon atom number of 1 to 6; a linear or branched alkyl group is preferable, examples of which include a methyl group, an ethyl group, a propyl group, an isopropyl group, an n-butyl group, an isobutyl group, a tert-butyl group, a pentyl group, an isopentyl group, a neopentyl group and a hexyl group. Among these examples, a methyl group and an ethyl group are preferable and a methyl group is particularly preferable. Specific examples of a case that the alkyl group has a hetero atom include a group in which —O— or —S— exists at the end on the side of connection to a lactone ring of the alkyl group or between carbon atoms; examples of such a group include $—O—CH_3$, $—CH_2—O—CH_3$, $—S—CH_3$ and $—CH_2—S—CH_3$.

In the formula (y-2), it is preferable that each of $R_4$ and $R_5$ represent a hydrogen atom.

Specific examples of the group represented by the formula (y-1) or (y-2) will be shown below. Symbol "*" represents a bond.

-continued
(Y-1-1)
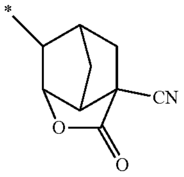
(Y-1-2)
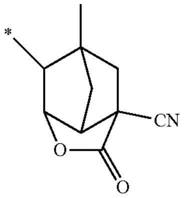
(Y-1-3)
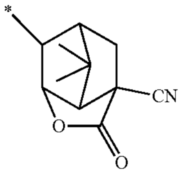
(Y-1-4)
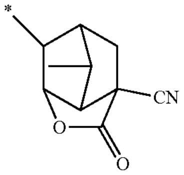
(Y-1-5)
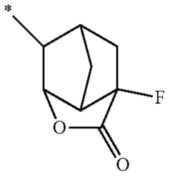
(Y-1-6)
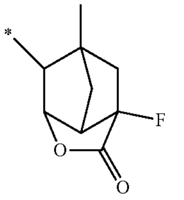
(Y-1-7)
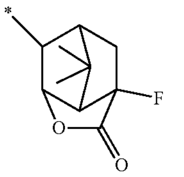
(Y-1-8)
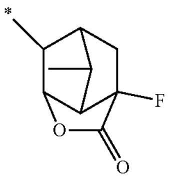
(Y-1-9)
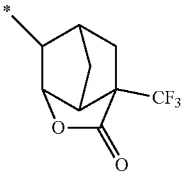
(Y-1-10)
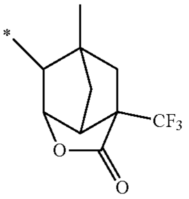
(Y-1-11)
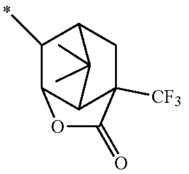
(Y-1-12)
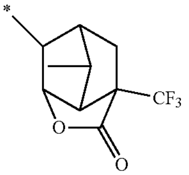
(Y-1-13)
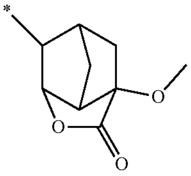
(Y-1-14)
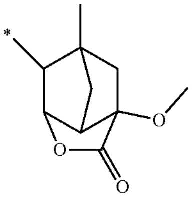
(Y-1-15)
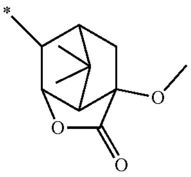
(Y-1-16)
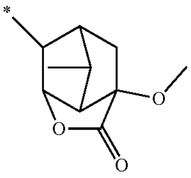

-continued
(Y-1-17)
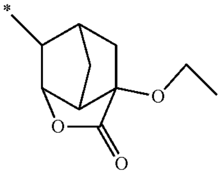
(Y-1-18)
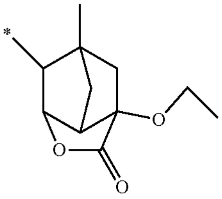
(Y-1-19)
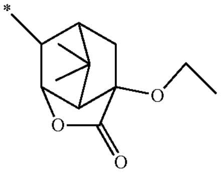
(Y-1-20)
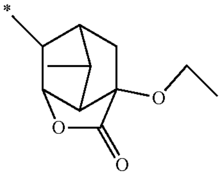
(Y-1-21)
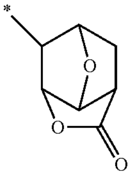
(Y-1-22)
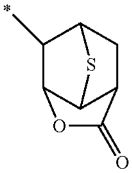
(Y-1-23)
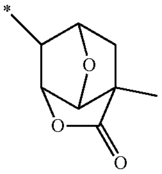
(Y-1-24)
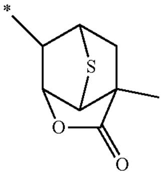
-continued
(Y-1-25)
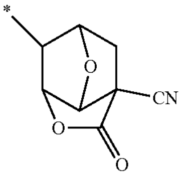
(Y-1-26)
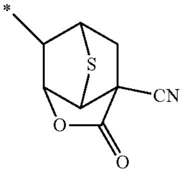
(Y-1-27)
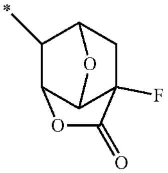
(Y-1-28)
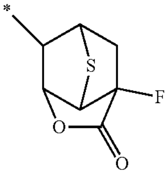
(Y-1-29)
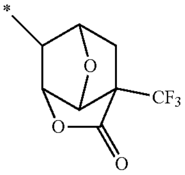
(Y-1-30)
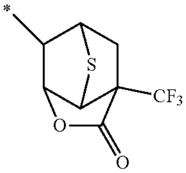
(Y-2-1)
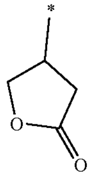
(Y-2-2)
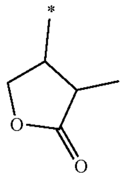

-continued (Y-2-3)

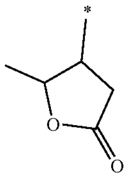

(Y-2-4)

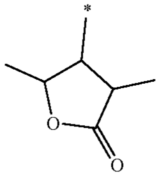

(Y-2-5)

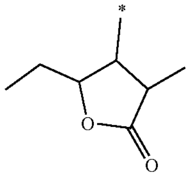

(Y-2-6)

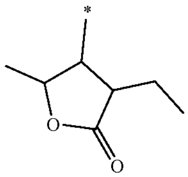

(Y-2-7)

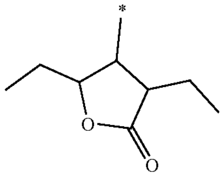

(Y-2-8)

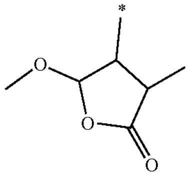

(Y-2-9)

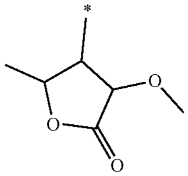

(Y-2-10)

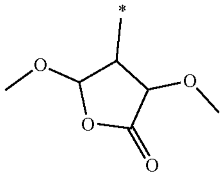

Among the above examples, (Y-1-1), (Y-1-21) and (Y-2-1) are preferable examples of $Ra^1$ in the general formula (a-1).

Although examples of the constituent (a1) will be shown below, the constituent (a1) should not be limited to them. It is noted that in examples of the following constituents R represents a hydrogen atom, an alkyl group having a carbon atom number of 1 to 5, or an alkyl halide group having a carbon atom number of 1 to 5.

Specific examples of the constituent (a1) include constituents represented by the following general formulae (a1-1) to (a1-23), among which a constituent represented by one of (a1-1) to (a1-4), (a1-8) and (a1-12) is preferable. In the following general formulae, $R^a$ represents a hydrogen atom, a methyl group, or a trifluoromethyl group.

(a1-1)

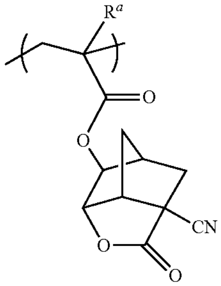

(a1-2)

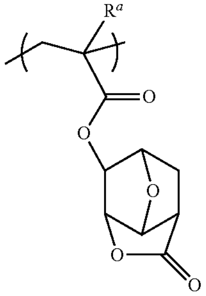

(a1-3)

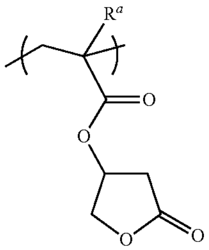

(a1-4)

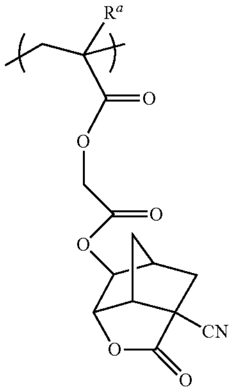

-continued
(a1-5)
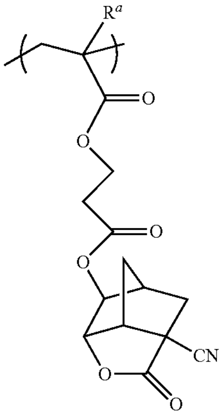
(a1-6)
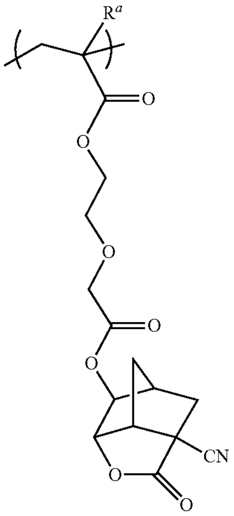
(a1-7)
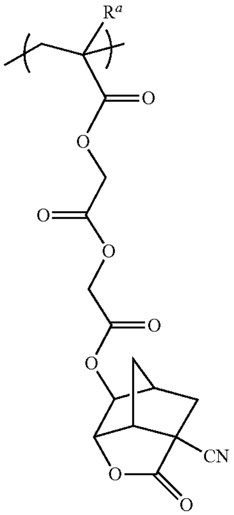
-continued
(a1-8)
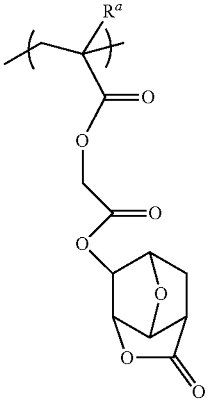
(a1-9)
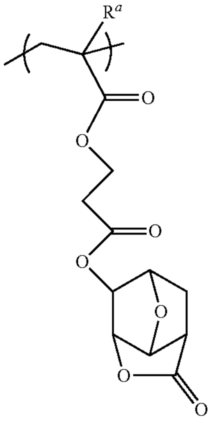
(a1-10)
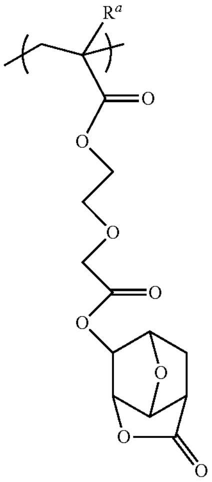

-continued
(a1-11)
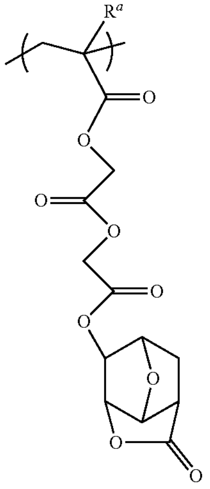
(a1-12)
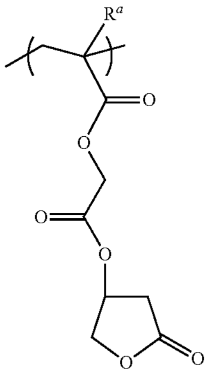
(a1-13)
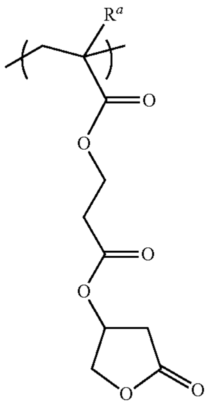
-continued
(a1-14)
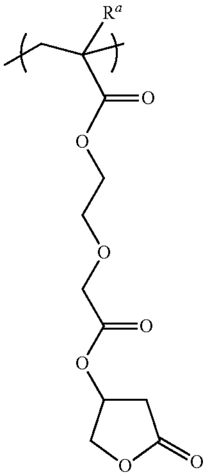
(a1-15)
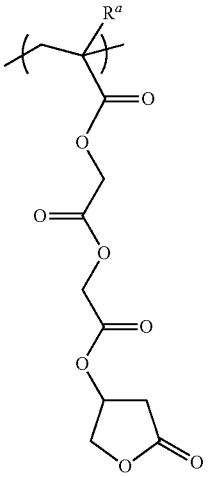
(a1-16)
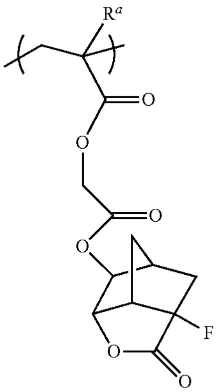

-continued
(a1-17)
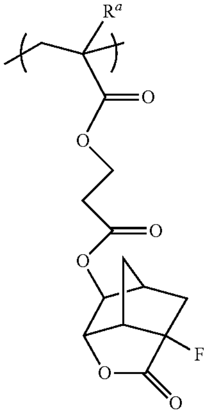
(a1-18)
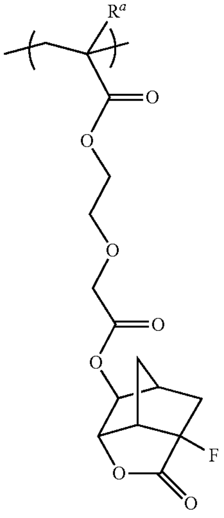
(a1-19)
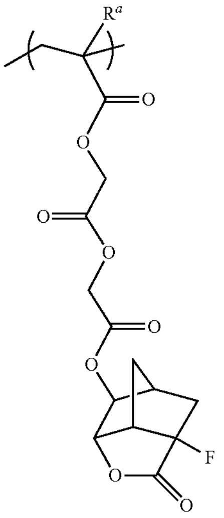
-continued
(a1-20)
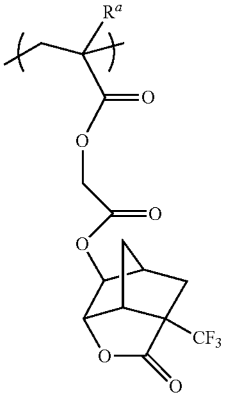
(a1-21)
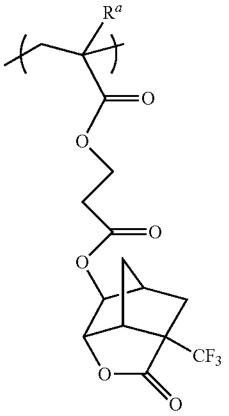
(a1-22)
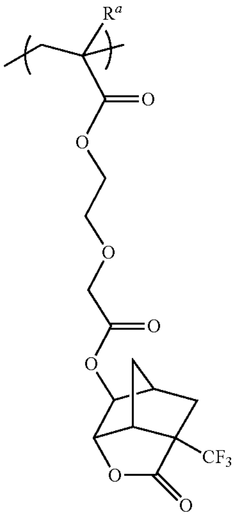

-continued (a1-23)

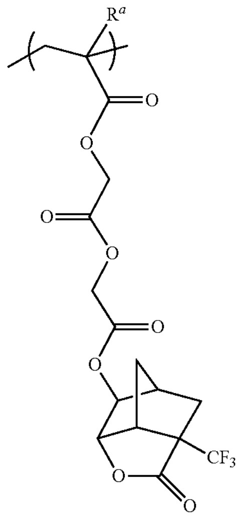

The constituent (a1) of the component (A1) may be of either one kind or two or more kinds.

It is preferable that the proportion of the constituent (a1) of the component (A1) to the sum (100 mol %) of all constituents of the component (A1) be 10 to 80 mol %, more preferably 10 to 70 mol %, further preferably 20 to 65 mol %, and particularly preferably 25 to 55 mol %.

In the case where the proportion of the constituent (a1) is set larger than or equal to the lower limit value of the above preferable range, the advantages of containing of the constituent (a1) can be obtained satisfactorily and lithography properties such as sensitivity and CDU (Critical Dimension Uniformity) can be improved. On the other hand, in the case where the proportion of the constituent (a1) is set smaller than or equal to the upper limit value of the above preferable range, a proper balance is taken with the other constituents, whereby various lithographic properties are made so high as to enable formation of good pattern shapes.

(Constituent (a2) Represented by General Formula (a-2))

The constituent (a2) is represented by the following general formula (a-2).

The constituent (a2) is a constituent containing a polycyclic hydrocarbon group obtained by connecting at least two hydroxyl groups (with the proviso that ones that are the same as constituents (a1) are excluded). Having at least two hydroxyl groups, the constituent (a2) can control diffusion of an acid satisfactorily. Furthermore, being proper in bulkiness, the polycyclic hydrocarbon group is not prone to cause deterioration of resolution or LWR (linewise roughness) due to lowering of solubility with respect to a developing liquid.

(a-2)

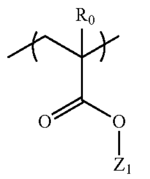

In the general formula (a-2), $R_0$ represents a hydrogen atom, an alkyl group having a carbon atom number of 1 to 5, or an alkyl halide group having a carbon atom number of 1 to 5. $Z_1$ represents an organic group including a polycyclic hydrocarbon group to which at least two hydroxyl groups are connected, and a carbon atom of the organic group may be replaced by a hetero atom.

The alkyl group having a carbon atom number of 1 to 5 that is represented by $R_0$ is preferably a linear or branched alkyl group having a carbon atom number of 1 to 5, specific examples of which include a methyl group, an ethyl group, a propyl group, an isopropyl group, an n-butyl group, an isobutyl group, a tert-butyl group, a pentyl group, an isopentyl group and a neopentyl group.

The alkyl halide group having a carbon atom number of 1 to 5 that is represented by $R_0$ is preferably a group obtained by replacing all or part of the hydrogen atoms of the above alkyl group having a carbon atom number of 1 to 5 with a halogen atom. Examples of the halogen atom include a fluorine atom, a chlorine atom, a bromine atom and an iodine atom, among which a fluorine atom is particularly preferable.

$R_0$ is preferably a hydrogen atom, an alkyl group having a carbon atom number of 1 to 3, or a fluorinated alkyl group having a carbon atom number of 1 to 3, a hydrogen atom and a methyl group are most preferable from the viewpoint of the ease of acquisition in an industrial sense.

Examples of the polycyclic hydrocarbon group in the organic group represented by $Z_1$ include groups obtained by removing three or more hydrogen atoms from a bicycloalkane, a tricycloalkane, a tetracycloalkane, or the like having a carbon atom number of 7 to 30. Specific examples include groups obtained by removing three or more hydrogen atoms from a polycycloalkane such as adamantane, norbornane, isobornane, tricyclodecane and tetracyclododecane. Among these polycyclic hydrocarbon groups, a group obtained by removing three or more hydrogen atoms from adamantane, a group obtained by removing three or more hydrogen atoms from norbornane, and a group obtained by removing three or more hydrogen atoms from a tetracycloalkane are preferable in an industrial sense. These polycyclic hydrocarbon groups may include, as a substituent, a linear or branched alkyl group having a carbon atom number of 1 to 5.

Carbon atoms of the organic group represented by $Z_1$ may be replaced by a hetero atom, examples of which include an oxygen atom, a sulfur atom and a nitrogen atom, among which an oxygen atom and a sulfur atom are preferable, and an oxygen atom is more preferable.

The number of hydroxyl groups connected to the polycyclic hydrocarbon group in $Z_1$ is two or more, more preferably two or three, and further preferably two.

The organic group represented by $Z_1$ may contain a divalent linking group in addition to the polycyclic hydrocarbon group to which at least two hydroxyl groups are connected.

Although there are no particular limitations on the divalent linking group that may be contained in the organic group represented by $Z_1$, examples of which include a divalent hydrocarbon group that may include a substituent (described later) and a divalent linking group including a hetero atom.

That is, the constituent (a2) may be a constituent (a2-1) represented by the following general formula (a-2-1):

(a-2-1)

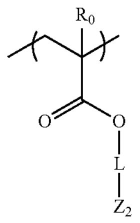

In the general formula (a-2-1), $R_0$ represents a hydrogen atom, an alkyl group having a carbon atom number of 1 to 5, or an alkyl halide group having a carbon atom number of 1 to 5. L represents a single bond or a divalent linking group. $Z_2$ represents a polycyclic hydrocarbon group to which at least two hydroxyl groups are connected.

Although there are no particular limitations on the divalent linking group represented by L, preferable examples of which include a divalent hydrocarbon group that may include a substituent and a divalent linking group including a hetero atom.

Divalent Hydrocarbon Group that May Include a Substituent:

The hydrocarbon group may be either an aliphatic hydrocarbon group or an aromatic hydrocarbon group.

Aliphatic Hydrocarbon Group in L

The aliphatic hydrocarbon group means a hydrocarbon group that is not aromatic. The aliphatic hydrocarbon group may be either saturated or unsaturated; it is usually preferable that the aliphatic hydrocarbon group be saturated.

Examples of the aliphatic hydrocarbon group include a linear or branched aliphatic hydrocarbon group and an aliphatic hydrocarbon group including a ring in its structure.

Linear or Branched Aliphatic Hydrocarbon Group

It is preferable that the carbon atom number of the linear aliphatic hydrocarbon group be 1 to 10, more preferably 1 to 6, further preferably 1 to 4, and most preferably 1 to 3.

The linear aliphatic hydrocarbon group is preferably a linear alkylene group, specific examples of which include a methylene group ($-CH_2-$), an ethylene group ($-(CH_2)_2-$), a trimethylene group ($-(CH_2)_3-$), a tetramethylene group ($-(CH_2)_4-$) and a pentamethylene group ($-(CH_2)_5-$), among which a methylene group is preferable.

It is preferable that the carbon atom number of the branched aliphatic hydrocarbon group be 3 to 10, more preferably 3 to 6, further preferably 3 or 4, and most preferably 3.

A preferable branched aliphatic hydrocarbon group is a branched alkylene group, specific examples of which include alkyl alkylene groups such as, alkyl methylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$ and $-C(CH_2CH_3)_2-$; alkyl ethylene groups such as $-CH(CH_3)CH_2-$, $-CH(CH_3)CH(CH_3)-$, $-C(CH_3)_2CH_2-$, $-CH(CH_2CH_3)CH_2-$ and $-C(CH_2CH_3)_2CH_2-$; alkyl trimethylene groups such as $-CH(CH_3)CH_2CH_2-$ and $-CH_2CH(CH_3)CH_2-$; and alkyl tetramethylene groups such as $-CH(CH_3)CH_2CH_2CH_2-$ and $-CH_2CH(CH_3)CH_2CH_2-$. The alkyl group in the alkyl alkylene group is preferably a linear alkyl group having a carbon atom number of 1 to 5.

The above linear or branched aliphatic hydrocarbon group may either include or not include a substituent. Examples of the substituent include a fluorine atom, a fluorinated alkyl group in which the number of carbon atoms replaced by a fluorine atom is 1 to 5, and a carbonyl group.

Aliphatic Hydrocarbon Group Including a Ring in its Structure

Examples of the above aliphatic hydrocarbon group including a ring in its structure include a cyclic aliphatic hydrocarbon group that may include a substituent having a hetero atom in the ring structure (i.e., a group obtained by removing two hydrogen atoms from an aliphatic hydrocarbon ring), a group in which such a cyclic aliphatic hydrocarbon group is connected to a linear or branched aliphatic hydrocarbon group at its end, and a group in which such a cyclic aliphatic hydrocarbon group exists in a linear or branched aliphatic hydrocarbon group at a halfway position. Examples of the linear or branched aliphatic hydrocarbon group are the same as the above-mentioned examples.

It is preferable that the number of carbons of the cyclic aliphatic hydrocarbon group be 3 to 20, more preferably 3 to 12.

The cyclic aliphatic hydrocarbon group may be either a polycyclic group or a monocyclic group. Preferable examples of the monocyclic alicyclic hydrocarbon group include a group obtained by removing two hydrogen atoms from a monocycloalkane. Preferable examples of the monocycloalkane include ones having a carbon atom number of 3 to 6 such as cyclopentane and cyclohexane. Preferable examples of the polycyclic alicyclic hydrocarbon group include a group obtained by removing two hydrogen atoms from a polycycloalkane. Preferable examples of the polycycloalkane include ones having a carbon atom number of 7 to 12 such as adamantane, norbornane, isobornane, tricyclodecane and tetracyclododecane.

The cyclic aliphatic hydrocarbon group may either include or not include a substituent. Examples of the substituent include an alkyl group, an alkoxy group, a halogen atom, an alkyl halide group, a hydroxyl group and a carbonyl group.

Preferable examples of the alkyl group as the substituent include alkyl groups having a carbon atom number of 1 to 5, most preferably a methyl group, an ethyl group, a propyl group, an n-butyl group and a tert-butyl group.

Preferable examples of the alkoxy group as the substituent include alkoxy groups having a carbon atom number of 1 to 5, more preferably a methoxy group, an ethoxy group, an n-propoxy group, an iso-propoxy group, an n-butoxy group and a tert-butoxy group, and most preferably a methoxy group and an ethoxy group.

Examples of the halogen atom as the substituent include a fluorine atom, a chlorine atom, a bromine atom and an iodine atom, preferably a fluorine atom.

Examples of the alkyl halide group as the substituent include a group obtained by replacing all or part of the hydrogen atoms of the above alkyl group with the above halogen atom.

The cyclic aliphatic hydrocarbon group may be such that part of the carbon atoms constituting its ring structure are replaced by a substituent having a hetero atom. Examples of the substituent having a hetero atom include $-O-$, $-C(=O)-O-$, $-S-$, $-S(=O)_2-$ and $-S(=O)_2-O-$.

Aromatic Hydrocarbon Group in L

The above aromatic hydrocarbon group is a hydrocarbon group having at least one aromatic ring.

There are no particular limitations on this aromatic ring except that it should be of a cyclic conjugated system having (4n+2) $\pi$ electrons, and it may be either monocyclic or polycyclic. It is preferable that the carbon atom number of the aromatic ring be 5 to 30, more preferably 5 to 20, further preferably 6 to 15, and particularly preferably 6 to 12. It is noted that the carbon atom number does not include that of a substituent(s). Specific examples of the aromatic ring include aromatic hydrocarbon rings such as benzene, naphthalene, anthracene, and phenanthrene, and aromatic heterocycles obtained by replacing part of the carbon atoms constituting such aromatic hydrocarbon rings with a hetero atom. Examples of the hetero atom in such aromatic heterocycles include an oxygen atom, a sulfur atom and a nitrogen atom. Specific examples of the aromatic heterocycles include a pyridine ring and a thiophene ring.

Specific examples of the aromatic hydrocarbon group include a group (arylene group or heteroarylene group) obtained by removing two hydrogen atoms from the above aromatic hydrocarbon ring or aromatic heterocycle; a group obtained by removing two hydrogen atoms from an aromatic compound (e.g., biphenyl or fluorene) containing two or more aromatic rings; and a group (e.g., a group obtained by further removing one hydrogen atom from the aryl group of an arylalkyl group such as a benzyl group, a phenethyl group, a 1-naphthylmethyl group, a 2-naphthylmethyl group, a 1-naphthylethyl group, or a 2-naphthylethyl group) obtained by replacing, with an alkylene group, one of the hydrogen atoms of a group (aryl group or heteroaryl group) obtained by removing one hydrogen atom from the above aromatic hydrocarbon ring or aromatic heterocycle. It is preferable that the carbon atom number of an alkylene group connected to the above aryl group or heteroaryl group be 1 to 4, more preferably 1 or 2, and particularly preferably 1.

The above aromatic hydrocarbon group may be such that a hydrogen atom of it is replaced by a substituent. For example, a hydrogen atom that is connected to an aromatic ring in the aromatic hydrocarbon group may be replaced by a substituent. Examples of the substituent include an alkyl group, an alkoxy group, a halogen atom, an alkyl halide group and a hydroxy group.

It is preferable that the alkyl group as the above substituent be an alkyl group having a carbon atom number of 1 to 5, most preferably a methyl group, an ethyl group, a propyl group, an n-butyl group and a tert-butyl group.

Examples of the alkoxy group, the halogen atom and the alkyl halide group as the above substituent are the same as the examples that were mentioned above as the examples of the substituents for replacing a hydrogen atom of the above cyclic aliphatic hydrocarbon group.

Divalent Linking Group Including a Hetero Atom:

In the case where L is a divalent linking group including a hetero atom, preferable examples of that linking group include —O—, —C(═O)—O—, —C(═O)—, —C(═O)—NH—, —NH—, —NH—C(═NH)— (H may be replaced by a substituent such as an alkyl group and an acyl group), —S—, $—S(═O)_2—$, $—S(═O)_2—O—$, $—CH_2—C(═O)—O—$ and $—CH_2—O—C(═O)—$.

Among these examples, from the viewpoint of solubility with respect to a developing liquid, —O—, —C(═O)—O—, —C(═O)—, —O—C(═O)—O—, $—CH_2—C(═O)—O—$ and $—CH_2—O—C(═O)—$ are preferable and $—CH_2—C(═O)—O—$ and $—CH_2—O—C(═O)—$ are particularly preferable.

It is preferable that L be a single bond, $—CH_2—C(═O)—O—$, $—CH_2—O—C(═O)—$, or $—CH_2—$, more preferably a single bond.

Examples of the polycyclic hydrocarbon group represented by $Z_2$ to which at least two hydroxyl groups are connected are the same as the examples that were mentioned above as the examples of the polycyclic hydrocarbon group represented by $Z_1$ to which at least two hydroxyl groups are connected.

More specifically, examples of the polycyclic hydrocarbon group represented by each of $Z_1$ and $Z_2$ to which at least two hydroxyl groups are connected include a group represented by one of the following formulae (r-pr-m1) to (r-pr-m26) in which symbol "*" represents a bond and character i is an integer of 2 or 3:

(r-pr-m1)

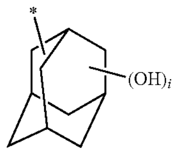

(r-pr-m2)

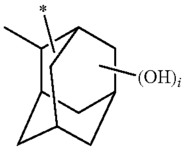

(r-pr-m3)

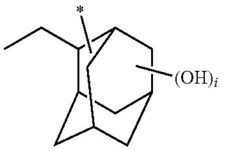

(r-pr-m4)

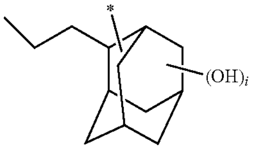

(r-pr-m5)

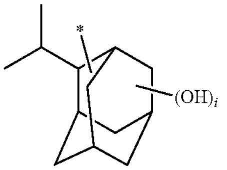

(r-pr-m6)

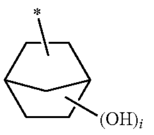

(r-pr-m7)

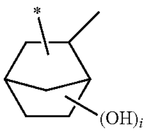

(r-pr-m8)

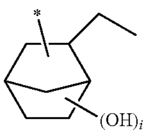

-continued (r-pr-m9)

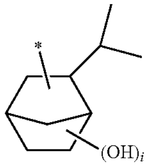

(r-pr-m10)

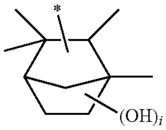

(r-pr-m11)

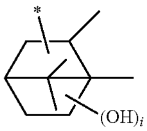

(r-pr-m12)

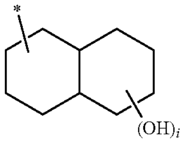

(r-pr-m13)

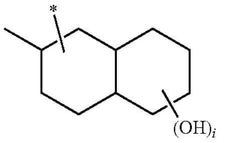

(r-pr-m14)

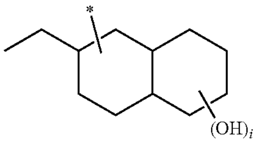

(r-pr-m15)

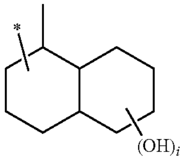

(r-pr-m16)

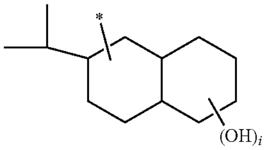

(r-pr-m17)

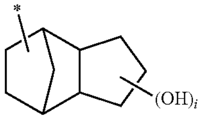

(r-pr-m18)

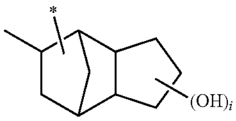

-continued (r-pr-m19)

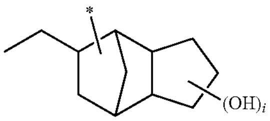

(r-pr-m20)

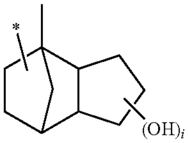

(r-pr-m21)

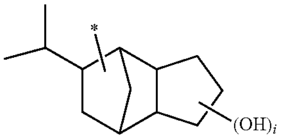

(r-pr-m22)

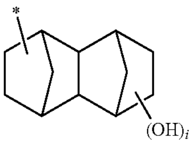

(r-pr-m23)

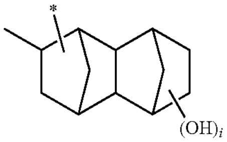

(r-pr-m24)

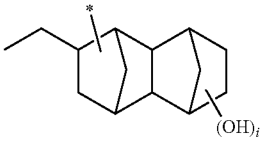

(r-pr-m25)

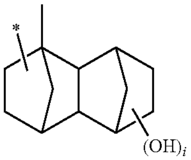

(r-pr-m26)

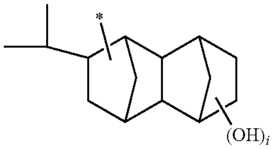

The organic groups represented by formulae (r-pr-m1) and (r-pr-m6) are preferable as organic groups represented by $Z_1$ and $Z_2$, and the organic group represented by formula (r-pr-m1) is more preferable.

Preferable examples of the constituent (a2) include a constituent represented by the following general formula (a-2-2) and a constituent represented by the following general formula (a-2-3):

(a-2-2)

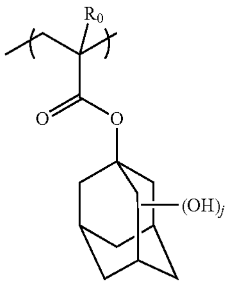

(a-2-3)

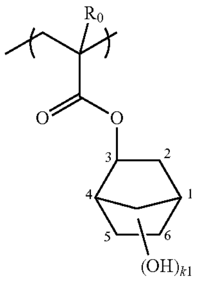

$R_0$ in the general formulae (a-2-2) and (a-2-3) is the same as $R_0$ in the general formula (a-2-1). Character j is an integer of 2 or larger and k1 is also an integer of 2 or larger.

In the general formula (a-2-2), character j, which is an integer of 2 or larger, is preferably 2 or 3, and more preferably 2. In the case where j is 2, it is preferable that the hydroxyl groups be connected to an adamantyl group at the positions 3 and 5.

In the general formula (a-2-3), k1 is an integer of 2 or larger, preferably 2 or 3, and more preferably 2.

An adamantyl group and a norbornyl group in the general formulae (a-2-2) and (a-2-3) may include, as a substituent, a linear or branched alkyl group having a carbon atom number of 1 to 5.

Specifically, it is preferable that the constituent (a2) be ones represented by the following general formulae in which $R^a$ represents a hydrogen atom, a methyl group or a trifluoromethyl group, and character i is an integer 2 or 3.

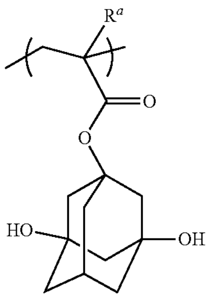

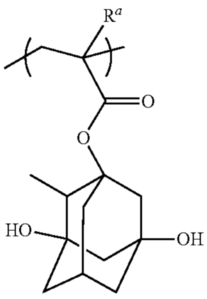

-continued

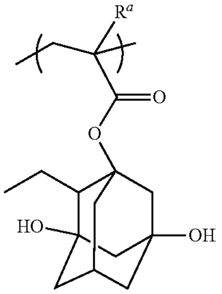

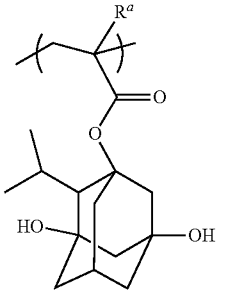

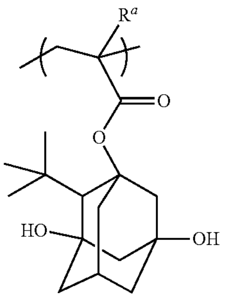

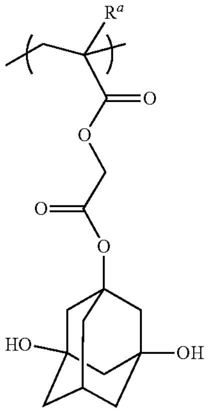

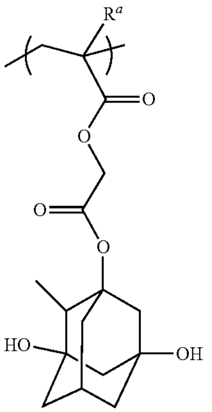

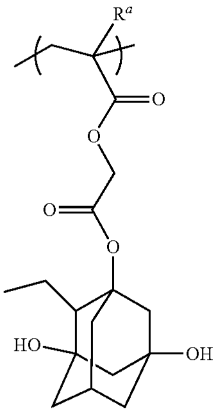

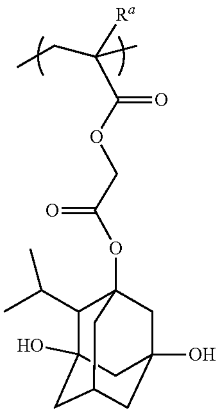

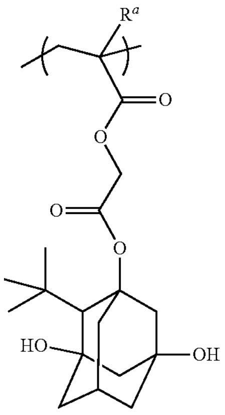

-continued
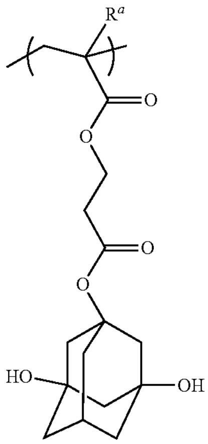
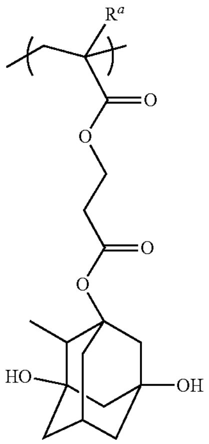
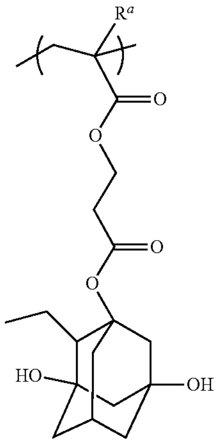
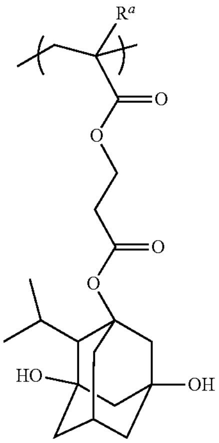
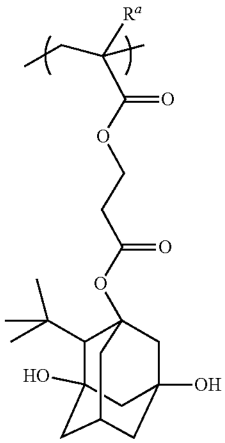
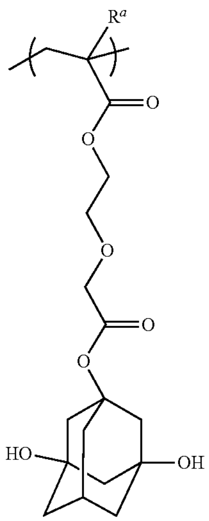
-continued
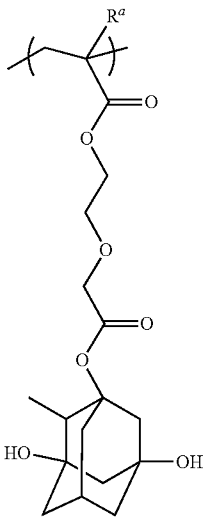
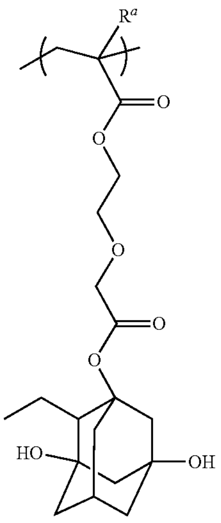
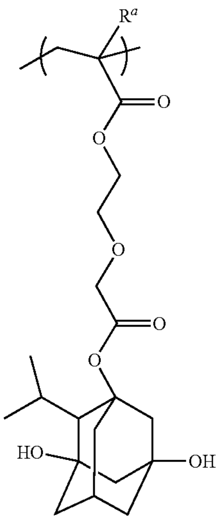
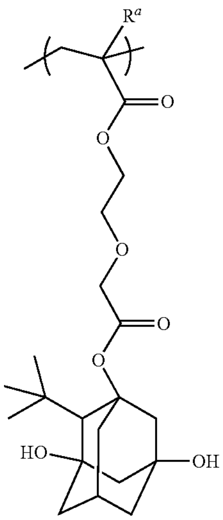
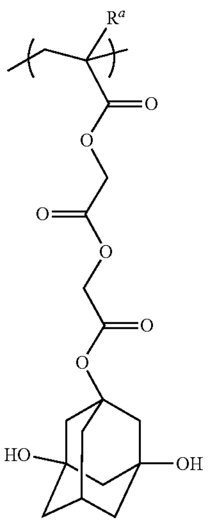
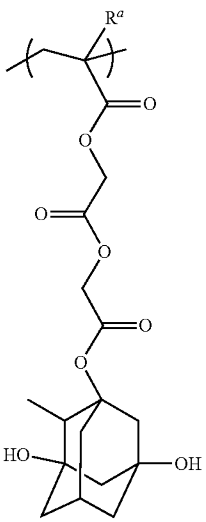

-continued
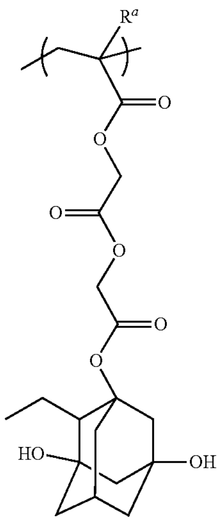
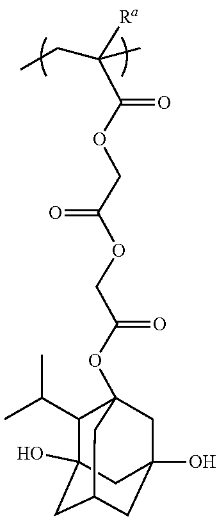
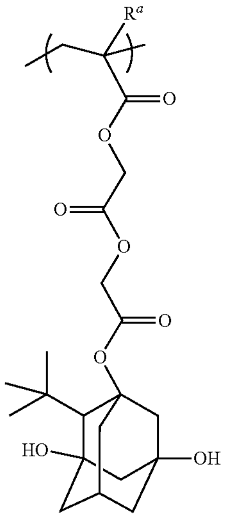
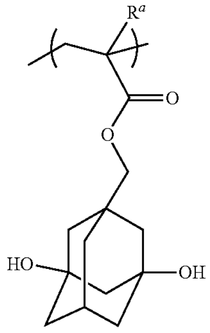
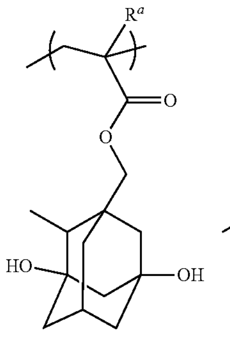
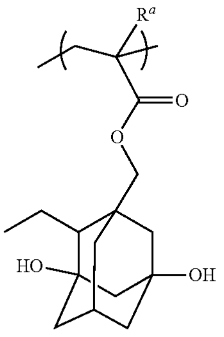
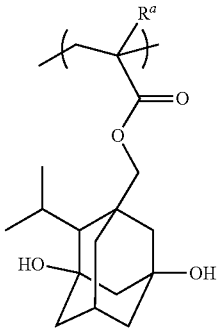
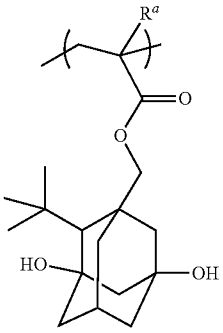
-continued
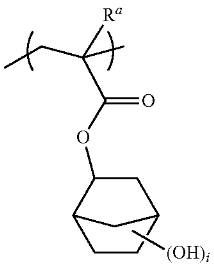
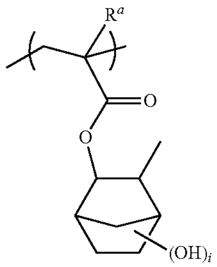
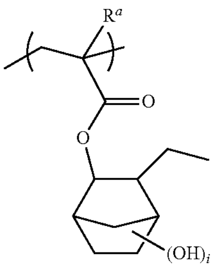
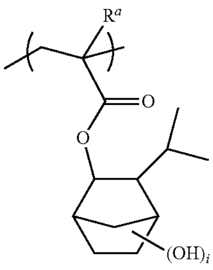
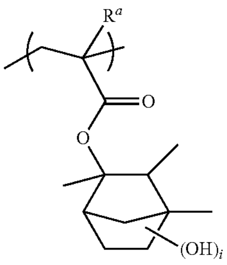
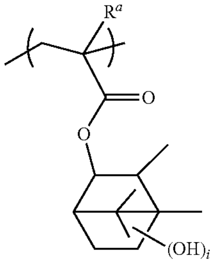
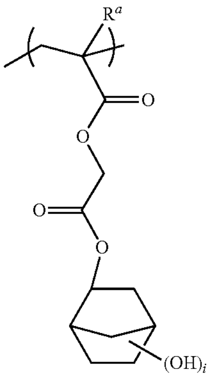
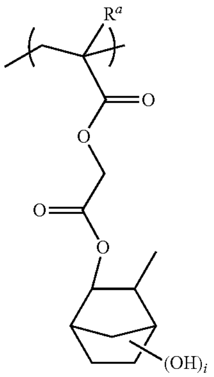
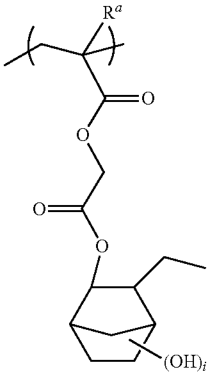
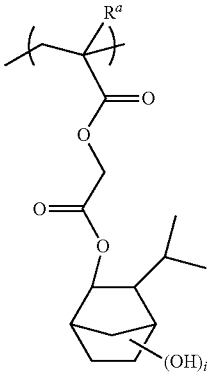

-continued
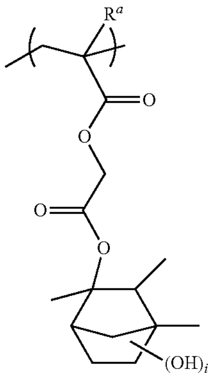
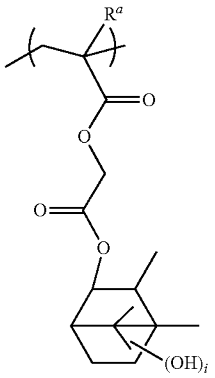
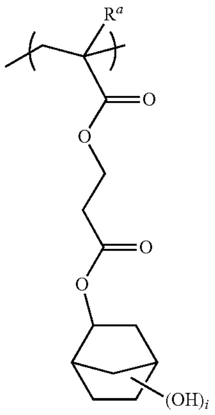
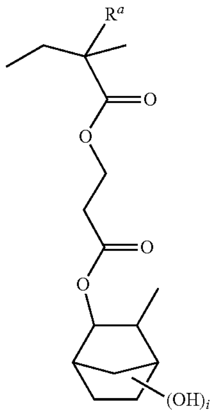
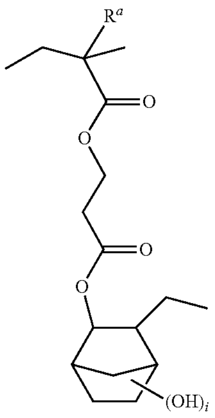
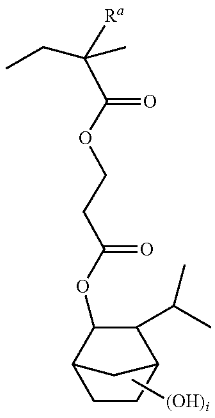
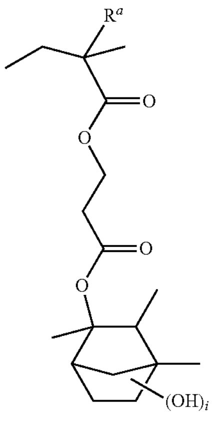
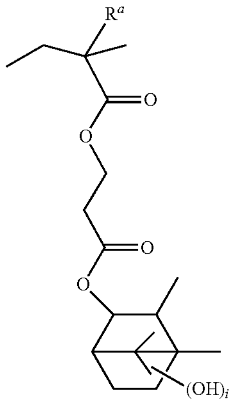
-continued
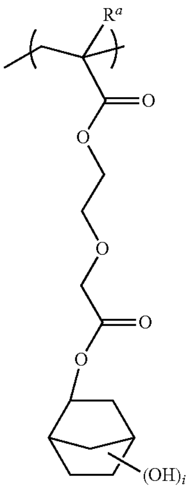
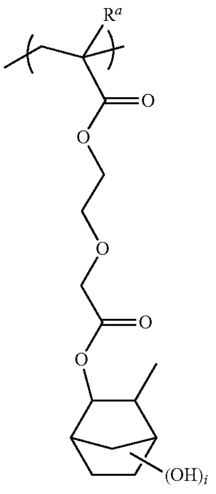
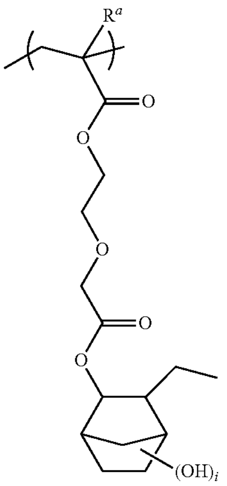
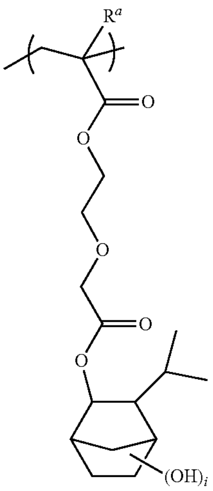
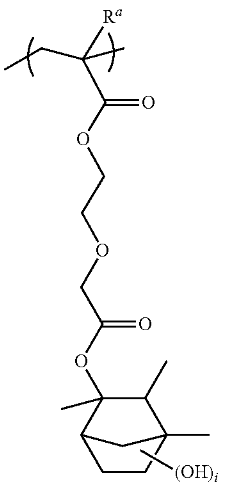
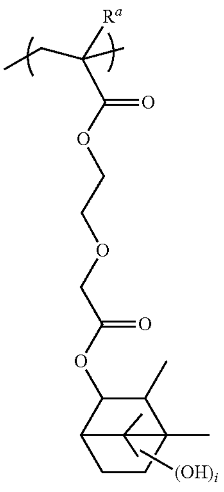

-continued

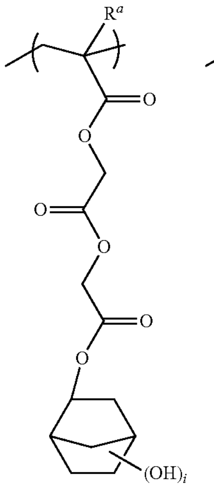

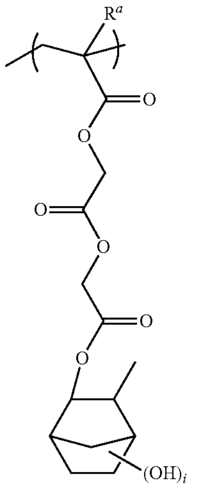

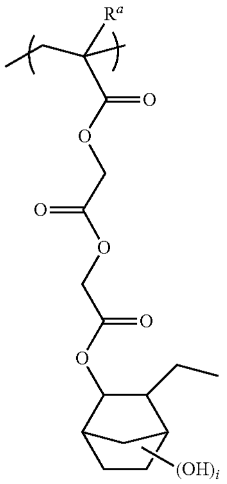

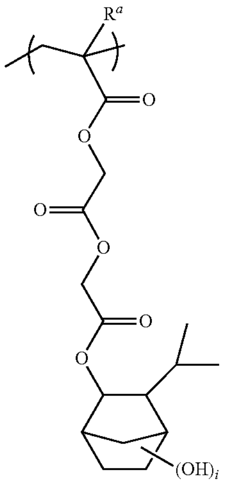

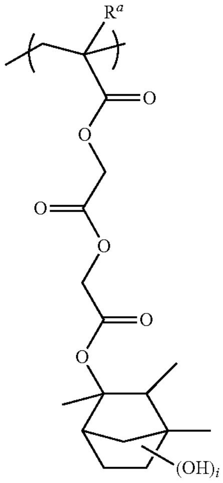

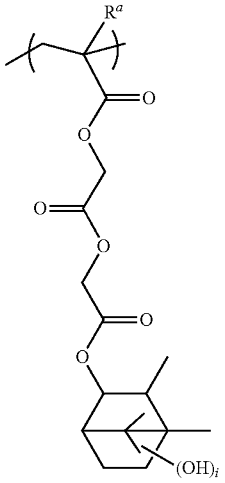

-continued

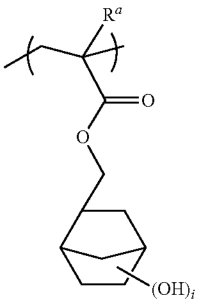

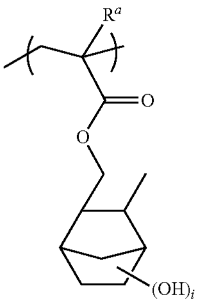

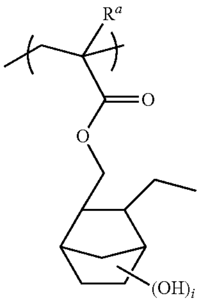

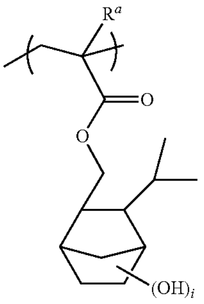

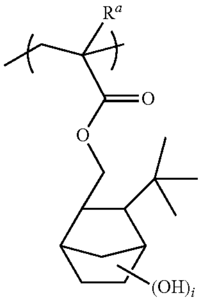

The constituent (a2) of the component (A1) may be of either one kind or two or more kinds.

It is preferable that the proportion of the constituent (a2) of the component (A1) to the sum (100 mol %) of all constituents of the component (A1) be 5 to 50 mol %, more preferably 5 to 40 mol %, and further preferably 5 to 25 mol %.

The advantages of the inclusion of the constituent (a2) can be obtained sufficiently by setting the proportion of the constituent (a2) larger than or equal to the lower limit value of the above preferable range, and it is made easier to balance the constituent (a2) with the other constituents by setting the proportion of the constituent (a2) smaller than or equal to the upper limit value of the above preferable range.

(Constituent (a3) Represented by General Formula (a-3))

The polymer compound (A1) may further contain a constituent (a3) that is represented by the following general formula (a-3).

(a-3)

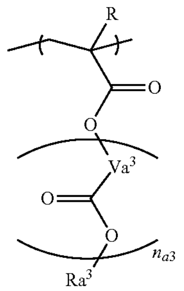

In the general formula (a-3), R represents a hydrogen atom, an alkyl group having a carbon atom number of 1 to 5, or an alkyl halide group having a carbon atom number of 1 to 5. $Va^3$ represents a divalent hydrocarbon group that may have an ether bond. Symbol "$n_{a3}$" represents an integer of 0 to 2. $Ra^3$ represents an acid-dissociable group including an alicyclic hydrocarbon group.

The constituent (a3) is a constituent that contains an acid-decomposable group whose polarity is increased by action of an acid and that contains an alicyclic hydrocarbon group (with the proviso that constituents falling under the categories of the constituents (a1) and (a2) are excluded).

The term "acid-decomposable group" means a group having acid decomposability that at least part of the bonds in the structure of this acid-decomposable group can be broken by action of an acid.

Examples of the acid-decomposable group whose polarity is increased by action of an acid include a group that produces a polar group when decomposed by action of an acid.

Examples of such a polar group include a carboxy group, a hydroxyl group, an amino group and a sulfo group ($—SO_3H$). Among these example, polar groups having —OH in the structure (hereinafter may be referred to as "OH-containing polar groups") are preferable, more preferably a carboxy group and a hydroxyl group, and particularly preferably a carboxy group.

A more specific example of the acid-decomposable group includes a group in which such a polar group is protected by an acid-dissociable group (e.g., a group in which the hydrogen atoms of an OH-containing polar group are protected by an acid-dissociable group).

The term "acid-dissociable group" mentioned above means both of (i) a group having acid dissociability that the bonds between this acid-dissociable group and atoms adjacent to it can be broken by action of an acid and (ii) a group in which the bonds between this acid-dissociable group and atoms adjacent to it can be broken in such a manner that part of the bonds are broken by action of an acid and then a decarboxylation reaction occurs.

The acid-dissociable group that constitutes the acid-decomposable group needs to be a group that is lower in polarity than a polar group that is produced by dissociation of the acid-dissociable group. With this feature, when the acid-dissociable group is dissociated by action of an acid, a polar group that is higher in polarity than the acid-dissociable group is produced, whereby the polarity is increased. As a result, the polarity of the entire component (A1) is increased. As a result of the increase in the polarity, the solubility with respect to a developing liquid is varied relatively, that is, the solubility increases in the case of an alkali developing liquid, and the solubility decreases in the case of an organic developing liquid.

The constituent (a3) contains an acid-decomposable group having an alicyclic hydrocarbon group, preferably contains an acid-decomposable group having a monocyclic alicyclic hydrocarbon group, and more preferably contains an acid-dissociable group having a monocyclic alicyclic hydrocarbon group.

Since the acid-decomposable group (or acid-dissociable group) of the constituent (a3) is proper in bulkiness, it becomes possible to properly adjust an acid diffusion control and the solubility with respect to a developing liquid and hence to lower the degree of its roughness in forming a resist pattern.

Examples of the acid-dissociable group in the constituent (a3) include ones that have been proposed so far as acid-dissociable groups of base resins for a chemically amplified resist.

Specific examples of the acid-dissociable group in the constituent (a3) that have been proposed as acid-dissociable groups of base resins for a chemically amplified resist include an "acetal acid-dissociable group" and a "tertiary alkyl ester acid-dissociable group" described below.

Acetal Acid-Dissociable Group:

Examples of acid-dissociable group that protects a carboxy group or a hydroxy group among the above polar groups include an acid-dissociable group represented by the following formula (a3-r-1) (hereinafter may be referred to as an "acetal acid-dissociable group").

(a3-r-1)

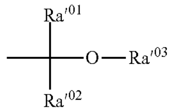

In the formula (a3-r-1), each of $Ra'^{01}$ and $Ra'^{02}$ represents a hydrogen atom or an alkyl group. $Ra'^{03}$ represents an alicyclic hydrocarbon group that may form a ring by connecting to $Ra'^{01}$ or $Ra'^{02}$.

In the formula (a3-r-1), it is preferable that at least one of $Ra'^{01}$ and $Ra'^{02}$ be a hydrogen atom and it is more preferable that both of them be a hydrogen atom.

In the case where $Ra'^{01}$ or $Ra'^{02}$ is an alkyl group, its examples are the same as the examples of the alkyl group that were mentioned above as substituents that may be connected to the carbon atom at the α position in the description of the α-replaced acrylic acid ester; an alkyl group having a carbon atom number of 1 to 5 is preferable. More specifically, a linear or branched alkyl group is preferable. Even more specific examples include a methyl group, an ethyl group, a propyl group, an isopropyl group, an n-butyl group, an isobutyl group, a tert-butyl group, a pentyl group, an isopentyl group and a neopentyl group, among which a methyl group and an ethyl group are more preferable, and a methyl group is particularly preferable.

In the formula (a3-r-1), the alicyclic hydrocarbon group represented by $Ra'^{03}$ may be either a polycyclic group or a monocyclic group, preferably a monocyclic group.

Preferable examples of the monocyclic aliphatic hydrocarbon group include a group obtained by removing one hydrogen atom from a monocycloalkane. Preferable examples of the monocycloalkane include ones having a carbon atom number of 3 to 6, for example, cyclopentane and cyclohexane.

Preferable examples of a polycyclic aliphatic hydrocarbon group include a group obtained by removing one hydrogen atom from a polycycloalkane. Preferable examples of the polycycloalkane include ones having a carbon atom number of 7 to 12, for example, adamantane, norbornane, isobornane, tricyclodecane and tetracyclododecane.

The alicyclic hydrocarbon group represented by Ra'$^{03}$ may include a substituent, examples of which include —$R^{P1}$, —$R^{P2}$—O—$R^{P1}$, —$R^{P2}$—CO—$R^{P1}$, —$R^{P2}$—CO—O—$R^{P1}$, —$R^{P2}$—O—CO—$R^{P1}$, —$R^{P2}$—OH, —$R^{P2}$—CN and —$R^{P2}$—COOH (these substituents may be hereinafter referred to as "Ra$^{05}$" together).

$R^{P1}$ in the above formulae represents a monovalent chain saturated hydrocarbon group having a carbon atom number of 1 to 10, a monovalent aliphatic cyclic saturated hydrocarbon group having a carbon atom number of 3 to 20, or a monovalent aromatic hydrocarbon group having a carbon atom number of 6 to 30. $R^{P2}$ represents a single bond, a divalent chain saturated hydrocarbon group having a carbon atom number of 1 to 10, a divalent aliphatic cyclic saturated hydrocarbon group having a carbon atom number of 3 to 20, or a divalent aromatic hydrocarbon group having a carbon atom number of 6 to 30. All or part of the hydrogen atoms of the chain saturated hydrocarbon group, the aliphatic cyclic saturated hydrocarbon group, and the aromatic hydrocarbon group represented by $R^{P1}$ or $R^{P2}$ may be replaced by a fluorine atom. The aliphatic cyclic saturated hydrocarbon group may include either one or more substituents of only one kind mentioned above or one or more substituents of each of plural kinds mentioned above.

Examples of the monovalent chain saturated hydrocarbon group having a carbon atom number of 1 to 10 include a methyl group, an ethyl group, a propyl group, a butyl group, a pentyl group, a hexyl group, a heptyl group, an octyl group and a decyl group.

Examples of the monovalent aliphatic cyclic saturated hydrocarbon group having a carbon atom number of 3 to 20 include monocyclic aliphatic saturated hydrocarbon groups such as a cyclopropyl group, a cyclobutyl group, a cyclopentyl group, a cyclohexyl group, a cycloheptyl group, a cyclobutyl group, a cyclodecyl group and a cyclododecyl group.

Examples of the monovalent aromatic hydrocarbon group having a carbon atom number of 6 to 30 include groups obtained by removing one hydrogen atom from aromatic hydrocarbon rings such as benzene, biphenyl, fluorene, naphthalene, anthracene and phenanthrene.

In the case where a single ring (i.e., a ring obtained by replacing part of the carbon atoms of a monocyclic alicyclic hydrocarbon with an oxygen atom) is formed as a result of Ra'$^{03}$'s connecting to Ra'$^{01}$ or Ra'$^{02}$, it is preferable that the single ring be a 4 to 7-member ring, more preferably a 4 to 6-member ring. Specific examples of the monocyclic cyclic group include a tetrahydropyranyl group and a tetrahydrofuranyl group.

Tertiary Alkyl Ester Acid-Dissociable Group:

Examples of acid-dissociable group that protects a carboxy group among the above polar groups include an acid-dissociable group represented by the following formula (a3-r-2).

For the sake of convenience, among acid-dissociable groups represented by the following formula (a3-r-2), ones in which each of Ra'$^{04}$ to Ra'$^{06}$ is an alkyl group may be referred to as a "tertiary alkyl ester acid-dissociable group."

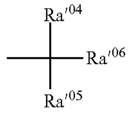

(a3-r-2)

In the formula (a3-r-2), each of Ra'$^{04}$ to Ra'$^{06}$ is a hydrocarbon group. At least one of Ra'$^{04}$ to Ra'$^{06}$ is an alicyclic hydrocarbon group or Ra'$^{05}$ and Ra'$^{06}$ are connected to each other to form an alicyclic hydrocarbon group.

Examples of the hydrocarbon groups of Ra'$^{04}$ to Ra'$^{06}$ include a linear or branched alkyl group, a chain or cyclic alkenyl group and a cyclic hydrocarbon group. However, at least one of Ra'$^{04}$ to Ra'$^{06}$ is an alicyclic hydrocarbon group or Ra'$^{05}$ and Ra'$^{06}$ connect to each other to form an alicyclic hydrocarbon group.

It is preferable that the carbon atom number of the above linear alkyl group be 1 to 5, more preferably 1 to 4, and further preferably 1 or 2. Specific examples include a methyl group, an ethyl group, an n-propyl group, an n-butyl group and an n-pentyl group. Among these examples, a methyl group, an ethyl group and an n-butyl group are preferable and a methyl group and an ethyl group are more preferable.

It is preferable that the carbon atom number of the above-mentioned branched alkyl group be 3 to 10, more preferably 3 to 5. Specific examples include an isopropyl group, an isobutyl group, a tert-butyl group, an isopentyl group, a neopentyl group, a 1, 1-diethylpropyl group and a 2, 2-dimethylbutyl group, among which an isopropyl group is preferable.

In the case where one of Ra'$^{04}$ to Ra'$^{06}$ is a cyclic hydrocarbon group, it may be either an aliphatic hydrocarbon group or an aromatic hydrocarbon group.

Preferable examples of the aliphatic hydrocarbon group include a group obtained by removing one or more hydrogen atoms from a monocycloalkane. Preferable examples of the monocycloalkane include ones having a carbon atom number of 3 to 6, specific examples of which include cyclopentane and cyclohexane.

In the case where one of Ra'$^{04}$ to Ra'$^{06}$ is an aromatic hydrocarbon group, it is a hydrocarbon group having at least one aromatic ring.

There are no particular limitations on this aromatic ring except that it should be of a cyclic conjugate system having (4n+2) π electrons; it may be either monocyclic or polycyclic. It is preferable that the number of carbons of the aromatic ring be 5 to 30, more preferably 5 to 20, further preferably 6 to 15, and particularly preferably 6 to 12.

Specific examples of the aromatic ring include aromatic hydrocarbon rings such as benzene, naphthalene, anthracene and phenanthrene, and aromatic heterocycles obtained by replacing part of the carbon atoms constituting such aromatic hydrocarbon rings with a hetero atom. Examples of the hetero atoms in such aromatic heterocycles include an oxygen atom, a sulfur atom and a nitrogen atom. Specific examples of the aromatic heterocycles include a pyridine ring and a thiophene ring.

Specific examples of the above aromatic hydrocarbon group include a group (aryl group or heteroaryl group) obtained by removing one hydrogen atom from the above aromatic hydrocarbon ring or aromatic heterocycle; a group obtained by removing one hydrogen atom from an aromatic compound (e.g., biphenyl or fluorene) containing two or more aromatic rings; and a group (e.g., arylalkyl group such as benzyl group, phenethyl group, 1-naphtylmethyl group, 2-naphtylmethyl group, 1-naphtylethyl group, and 2-naphtylethyl group) obtained by replacing one of the hydrogen atoms of the above aromatic hydrocarbon ring or aromatic heterocycle with an alkylene group. It is preferable that the carbon atom number of an alkylene group connected to the above aromatic hydrocarbon ring or aromatic heterocycle be 1 to 4, more preferably 1 or 2 and particularly preferably 1.

The above cyclic hydrocarbon group may include a substituent. Examples of this substituent are the same as the examples of the substituents that the alicyclic hydrocarbon group represented by $Ra'^{03}$ in the above-described formula (a3-r-1) may include.

In the case where a ring is formed by connection of $Ra'^{05}$ and $Ra'^{06}$, preferable examples of the above acid-dissociable group include a group represented by the following formula (a3-r2-1) and a group represented by the following formula (a3-r2-2), and a group represented by the following formula (a3-r2-3).

On the other hand, in the case where $Ra'^{04}$ to $Ra'^{06}$ are not connected to each other and are independent hydrocarbon groups, preferable examples of the above acid-dissociable group include a group represented by the following formula (a3-r2-4). In the following formulae, symbol "*" represents a bond.

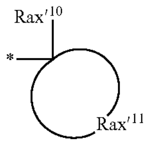

(a3-r2-1)

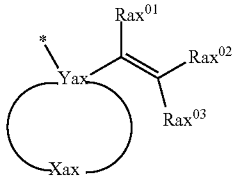

(a3-r2-2)

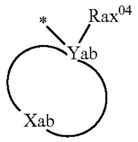

(a3-r2-3)

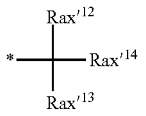

(a3-r2-4)

In the formula (a3-r2-1), $Rax'^{10}$ represents an alkyl group having a carbon atom number of 1 to 10. $Rax'^{11}$ represents a group that forms an alicyclic hydrocarbon group together with a carbon atom to which $Rax'^{10}$ is connected.

In the formula (a3-r2-2), Yax represents a carbon atom. Xax represents a group that forms an alicyclic hydrocarbon group together with Yax. All or part of the hydrogen atoms of this alicyclic hydrocarbon group may be replaced. $Rax^{01}$ to $Rax^{03}$ represent, independently of each other, a hydrogen atom, a monovalent chain saturated hydrocarbon group having a carbon atom number of 1 to 10, or a monovalent aliphatic cyclic saturated hydrocarbon group having a carbon atom number of 3 to 20. All or part of the hydrogen atoms of each of these chain saturated hydrocarbon group and aliphatic cyclic saturated hydrocarbon group may be replaced. Two or more of $Rax^{01}$ to $Rax^{03}$ may be connected to each other to form a cyclic structure.

In the formula (a3-r2-3), Yab represents a carbon atom. Xab represents a group that forms an alicyclic hydrocarbon group together with Yab. $Rax^{04}$ represents an aromatic hydrocarbon group that may include a substituent.

In the formula (a3-r2-4), $Rax'^{12}$ and $Rax'^{13}$ represent, independently of each other, a monovalent chain saturated hydrocarbon group having a carbon atom number of 1 to 10. All or part of the hydrogen atoms of this chain saturated hydrocarbon group may be replaced. $Rax'^{14}$ represents an alicyclic hydrocarbon group. Symbol "*" represents a bond (this also applies to the following).

In the above formula (a3-r2-1), examples of the alkyl group having a carbon atom number of 1 to 10 represented by $Rax'^{10}$ include a linear or branched alkyl group.

It is preferable that the carbon atom number of this linear alkyl group be 1 to 5, more preferably 1 to 4, and further preferably 1 or 2. Specific examples include a methyl group, an ethyl group, an n-propyl group, an n-butyl group and an n-pentyl group, among which a methyl group and an ethyl group are preferable.

It is preferable that the carbon atom number of this branched alkyl group be 3 to 10, more preferably 3 to 5. Specific examples include an isopropyl group, an isobutyl group, a tert-butyl group, an isopentyl group, a neopentyl group, a 1, 1-diethylpropyl group and a 2, 2-dimethylbutyl group, among which an isopropyl group is preferable.

Among the above examples of $Rax'^{10}$ in the above formula (a3-r2-1), a linear alkyl group having a carbon atom number of 1 to 5 is preferable, examples of which include a methyl group and an ethyl group.

In the above formula (a3-r2-1), it is preferable that $Rax'^{11}$ (i.e., an aliphatic cyclic group that forms an alicyclic hydrocarbon group together with a carbon atom to which $Rax'^{10}$ is connected) be a monocyclic alicyclic hydrocarbon group, examples of which include a group obtained by removing two or more hydrogen atoms from a monocycloalkane. Preferable examples of the monocycloalkane include ones having a carbon atom number of 3 to 10, more preferably ones having a carbon atom number of 3 to 8, and further preferably ones having a carbon atom number of 3 to 6. Specific examples include cyclopentane and cyclohexane.

In the formula (a3-r2-2), preferable examples of the alicyclic hydrocarbon group formed by Xax and Yax include a monocyclic alicyclic hydrocarbon group, examples of which are the same as the examples mentioned above with respect to $Rax'^{11}$ in the above formula (a3-r2-1).

In the formula (a3-r2-2), examples of the monovalent chain saturated hydrocarbon group having a carbon atom number of 1 to 10 represented by $Rax^{01}$ to $Rax^{03}$ include a methyl group, an ethyl group, a propyl group, a butyl group, a pentyl group, a hexyl group, an heptyl group, an octyl group and a decyl group.

Examples of the monovalent aliphatic cyclic saturated hydrocarbon group having a carbon atom number of 3 to 20 represented by $Rax^{01}$ to $Rax^{03}$ include monocyclic aliphatic saturated hydrocarbon groups such as a cyclopropyl group, a cyclobutyl group, a cyclopentyl group, a cyclohexyl group, a cycloheptyl group, a cyclooctyl group, a cyclodecyl group and a cyclododecyl group.

Among the above-mentioned examples of $Rax^{01}$ to $Rax^{03}$, from the viewpoint of the ease of synthesis of a monomer compound, a hydrogen atom and a monovalent chain saturated hydrocarbon group having a carbon atom number of 1 to 10 are preferable, among which a hydrogen atom, a methyl group and an ethyl group are more preferable, and a hydrogen atom is particularly preferable.

Examples of a substituent existing in the chain saturated hydrocarbon group or the aliphatic cyclic saturated hydrocarbon group represented by $Rax^{01}$ to $Rax^{03}$ are the same as the above-mentioned examples of $Ra^{05}$.

Examples of a group including a carbon-carbon double bond that is formed when two or more of $Rax^{01}$ to $Rax^{03}$ are connected to each other to form a ring structure include a cyclopentenyl group, a cyclohexenyl group, a methylcyclopentenyl group, a methylcyclohexenyl group, a cyclopentylideneethenyl group and a cyclohexylideneethenyl group. Among these examples, from the viewpoint of the ease of synthesis of a monomer compound, a cyclopentenyl group, a cyclohexenyl group and a cyclopentylideneethenyl group are preferable.

In the formula (a3-r2-3), preferable examples of the alicyclic hydrocarbon group formed by Xab and Yab include a monocyclic alicyclic hydrocarbon group, examples of which are the same as the examples mentioned above with respect to $Rax'^{11}$ in the above formula (a3-r2-1).

In the formula (a3-r2-3), examples of the aromatic hydrocarbon group represented by $Rax^{04}$ include a group obtained by removing one or more hydrogen atoms from an aromatic hydrocarbon ring having a carbon atom number of 5 to 30. Preferable examples of $Rax^{04}$ include a group obtained by removing one or more hydrogen atoms from an aromatic hydrocarbon ring having a carbon atom number of 6 to 15, more preferably a group obtained by removing one or more hydrogen atoms from benzene, naphthalene, anthracene or phenanthrene, further preferably a group obtained by removing one or more hydrogen atoms from benzene, naphthalene or anthracene, particularly preferably a group obtained by removing one or more hydrogen atoms from benzene or naphthalene, and most preferably a group obtained by removing one or more hydrogen atoms from benzene.

Examples of a substituent that $Rax^{04}$ in the formula (a3-r2-3) may contain are a methyl group, an ethyl group, a propyl group, a hydroxy group, a carboxy group, a halogen atom (fluorine atom, chlorine atom, bromine atom, etc.), an alkoxy group (methoxy group, ethoxy group, propoxy group, butoxy group, etc.) and an alkyloxycarbonyl group.

$Rax'^{12}$ and $Rax'^{13}$ in the formula (a3-r2-4) represent, independently of each other, a monovalent chain saturated hydrocarbon group having a carbon atom number of 1 to 10. Examples of the monovalent chain saturated hydrocarbon group having a carbon atom number of 1 to 10 represented by each of $Rax'^{12}$ and $Rax'^{13}$ are the same as the above-mentioned examples of the monovalent chain saturated hydrocarbon group having a carbon atom number of 1 to 10 represented by each of $Ra^{01}$ to $Rax^{03}$. All or part of the hydrogen atoms of this chain saturated hydrocarbon group may be replaced.

Among the above examples of $Rax'^{12}$ and $Rax'^{13}$, preferable examples include an alkyl group having a carbon atom number of 1 to 5, and more preferably a methyl group and an ethyl group.

In the case where the chain saturated hydrocarbon group represented by each of $Rax'^{12}$ and $Rax'^{13}$ is replaced, examples of the substituent are the same as the example groups of $Ra^{05}$.

$Rax'^{14}$ in the formula (a3-r2-4) represents an alicyclic hydrocarbon group and is preferably a monocyclic alicyclic hydrocarbon group that may include a substituent. Examples of the alicyclic hydrocarbon group represented by $Rax'^{14}$ include a group obtained by removing one or more hydrogen atoms from a monocycloalkane. Preferable examples of this monocycloalkane include one having a carbon atom number of 3 to 10, more preferably one having a carbon atom number of 3 to 8, and further preferably one having a carbon atom number of 3 to 6. More specifically, cyclopentane and cyclohexane are preferable.

Examples of the substituent that may exist in $Rax'^{14}$ are the same as the examples of the substituent that may exist in $Rax^{04}$.

Specific examples of the group represented by the above-described formula (a3-r2-1) will be described below. In the following formulae, symbol "*" represents a bond.

(r-pr-m1)

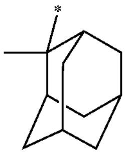

(r-pr-m2)

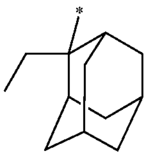

(r-pr-m3)

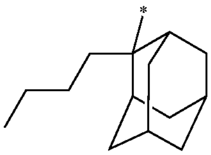

(r-pr-m4)

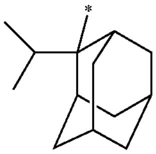

(r-pr-m5)

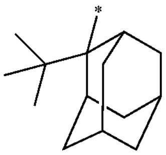

(r-pr-m6)

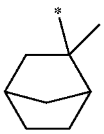

(r-pr-m7)

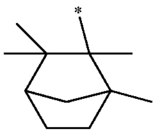

(r-pr-m8)

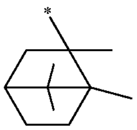

-continued
(r-pr-m9)
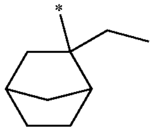
(r-pr-m10)
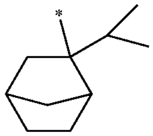
(r-pr-m11)
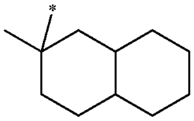
(r-pr-m12)
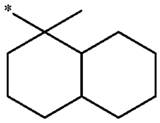
(r-pr-m13)
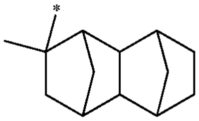
(r-pr-m14)
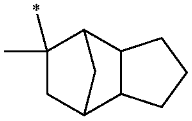
(r-pr-m15)
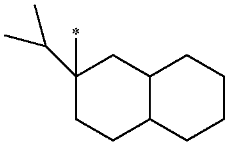
(r-pr-m16)
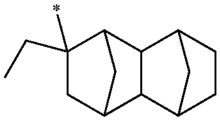
(r-pr-m17)
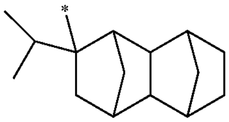
(r-pr-s1)
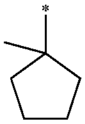
(r-pr-s2)
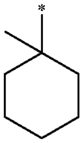
-continued
(r-pr-s3)
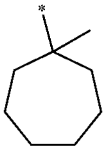
(r-pr-s4)
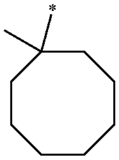
(r-pr-s5)
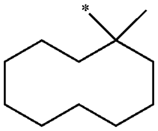
(r-pr-s6)
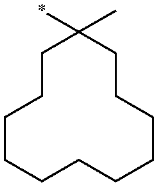
(r-pr-s7)
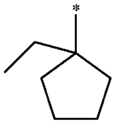
(r-pr-s8)
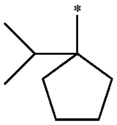
(r-pr-s9)
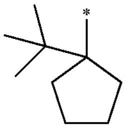
(r-pr-s10)
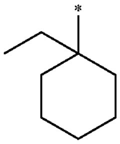
(r-pr-s11)
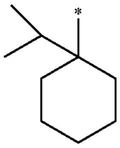
(r-pr-s12)
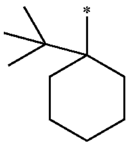

-continued
(r-pr-s13)
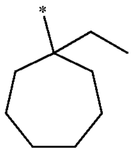
(r-pr-s14)
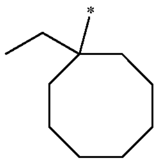
(r-pr-s15)
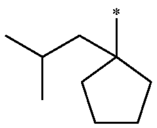
(r-pr-s16)
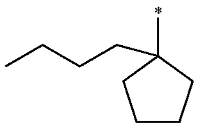
(r-pr-s17)
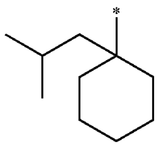
(r-pr-s18)
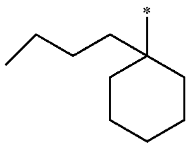
Specific examples of the group represented by the above-described formula (a3-r2-2) will be described below. In the following formulae, symbol "*" represents a bond.
(r-pr-sv1)
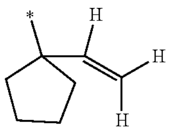
(r-pr-sv2)
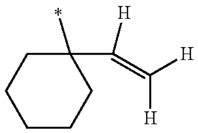
(r-pr-sv3)
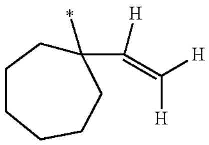
-continued
(r-pr-sv4)
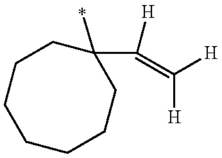
(r-pr-sv5)
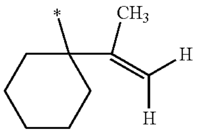
(r-pr-sv6)
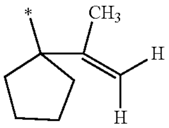
(r-pr-sv7)
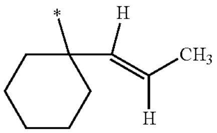
(r-pr-sv8)
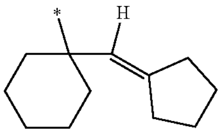
(r-pr-sv9)
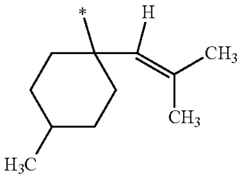
(r-pr-sv10)
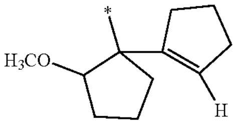
(r-pr-sv11)
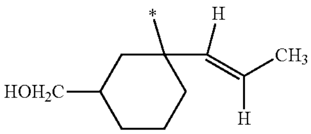
(r-pr-sv12)
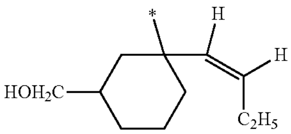
(r-pr-mv1)
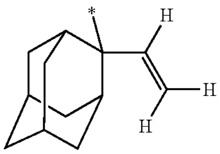

-continued
(r-pr-mv2)
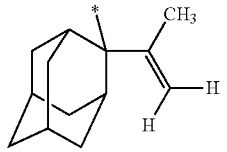
(r-pr-mv3)
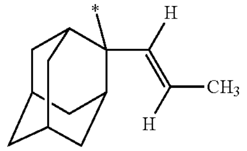
(r-pr-mv4)
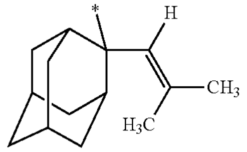
(r-pr-mv5)
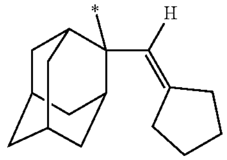
(r-pr-mv6)
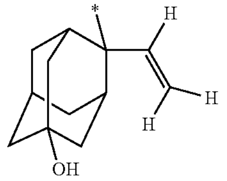
(r-pr-mv7)
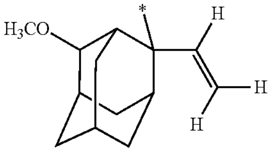
(r-pr-mv8)
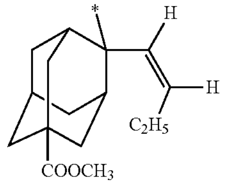
(r-pr-mv9)
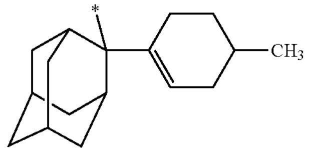
(r-pr-mv10)
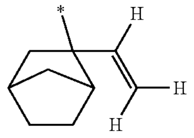
-continued
(r-pr-mv11)
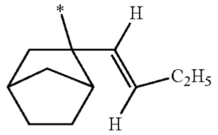
(r-pr-mv12)
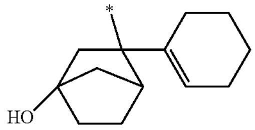
(r-pr-mv13)
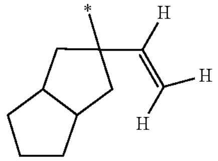
(r-pr-mv14)
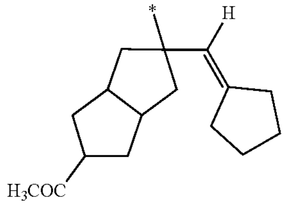
(r-pr-mv15)
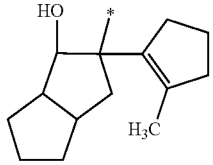
(r-pr-mv16)
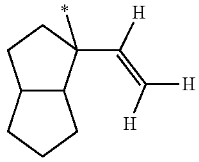
(r-pr-mv17)
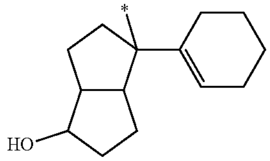
(r-pr-mv18)
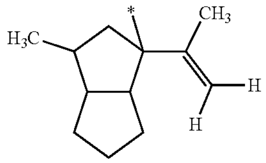
(r-pr-mv19)
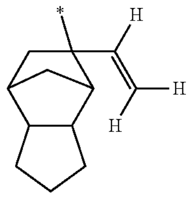

-continued (r-pr-mv20)

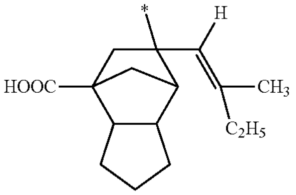

(r-pr-mv21)

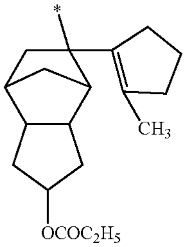

Specific examples of the group represented by the above-described formula (a3-r2-3) will be described below. In the following formulae, symbol "*" represents a bond.

(r-pr-sa1)

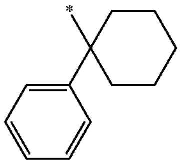

(r-pr-sa2)

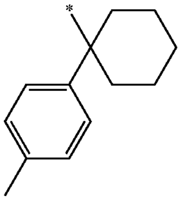

(r-pr-sa3)

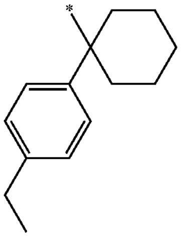

(r-pr-sa4)

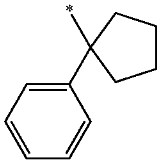

(r-pr-sa5)

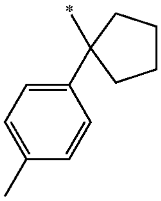

-continued (r-pr-sa6)

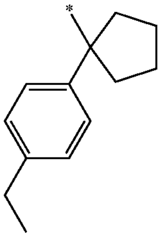

(r-pr-sa7)

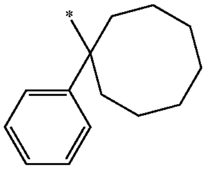

(r-pr-sa8)

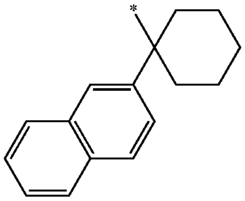

(r-pr-sa9)

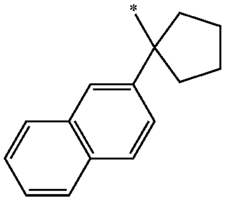

(r-pr-ma1)

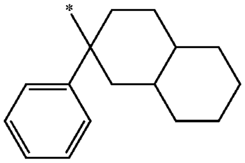

(r-pr-ma2)

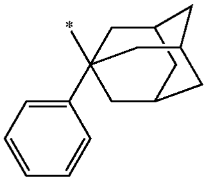

Specific examples of the group represented by the above-described formula (a3-r2-4) will be described below. In the following formulae, symbol "*" represents a bond.

(r-pr-cm1)

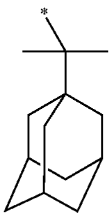

-continued (r-pr-cm2)

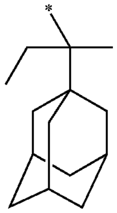

(r-pr-cm3)

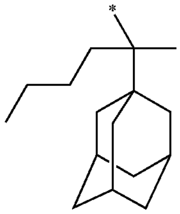

(r-pr-cm4)

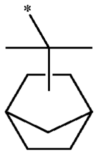

(r-pr-cs1)

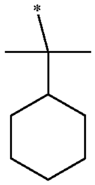

(r-pr-cs2)

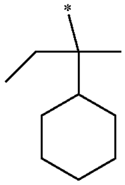

(r-pr-cs3)

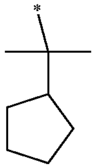

Tertiary Alkyloxycarbonyl Acid-Dissociable Group:

Examples of an acid-dissociable group that protects a hydroxyl group among the above-mentioned polar groups include an acid-dissociable group (for the sake of convenience, it may be referred to below as a "tertiary alkyloxycarbonyl acid-dissociable group") represented by the following formula (a3-r-3):

(a-3-r-3)

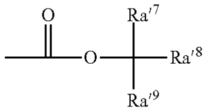

In the formula (a3-r-3), each of $Ra'^7$ to $Ra'^9$ represents an alkyl group.

In the formula (a3-r-3), it is preferable that each of $Ra'^7$ to $Ra'^9$ be an alkyl group having a carbon atom number of 1 to 5, more preferably a carbon atom number of 1 to 3.

It is preferable that the sum of the carbon atom numbers of the respective alkyl groups be 3 to 7, more preferably 3 to 5, most preferably 3 or 4.

It is preferable that the constituent (a3) be the acid-dissociable group in which $Ra^3$ is represented by the above formula (a3-r-1) or (a3-r-3), among the above examples.

Specific examples of the constituent (a3) represented by the above general formula (a-3) will be described below. In the following formulae, Re' represents a hydrogen atom, a methyl group or a trifluoromethyl group.

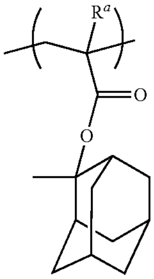
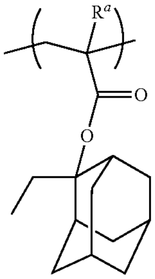
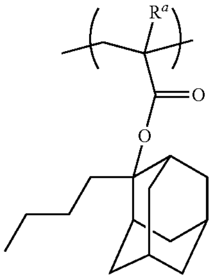

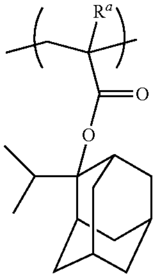
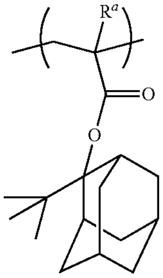
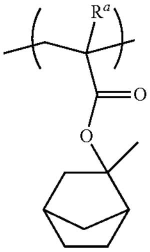

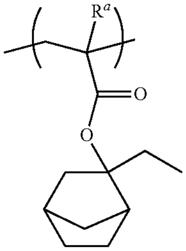
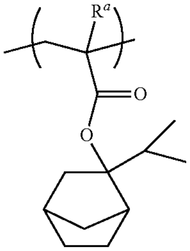

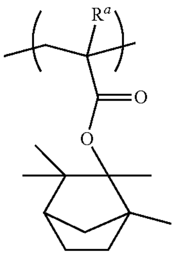
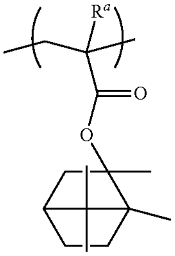

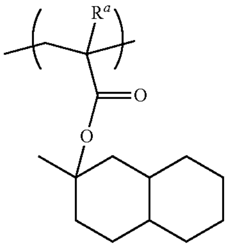
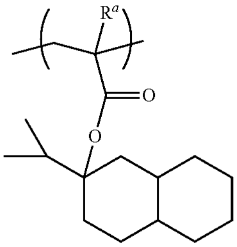

-continued
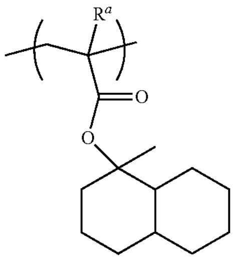
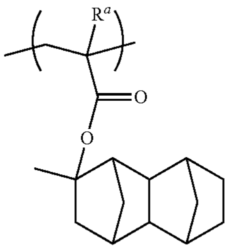
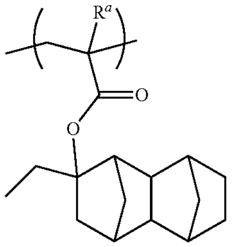
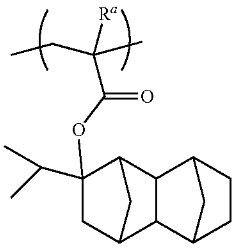
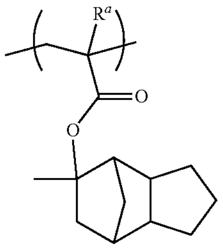
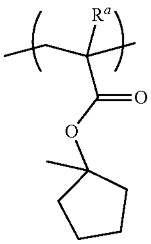
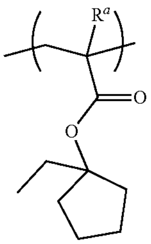
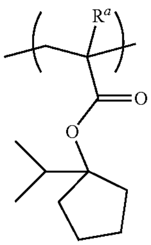
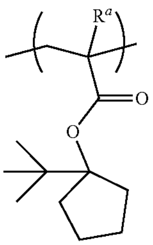
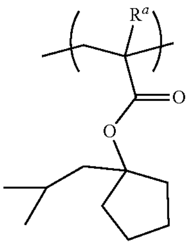
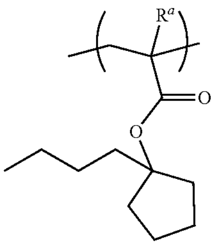
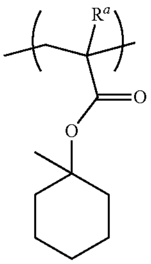
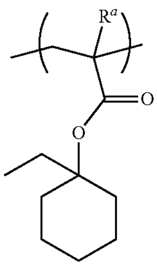
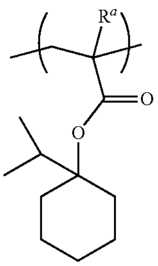
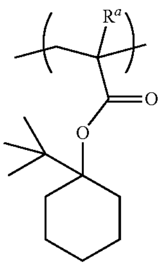
-continued
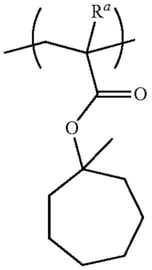
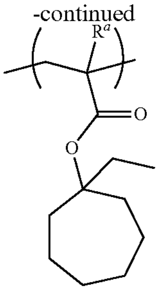
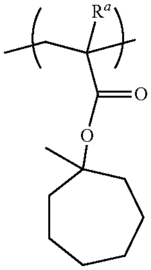
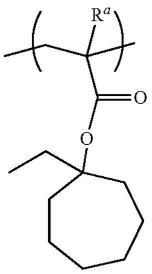
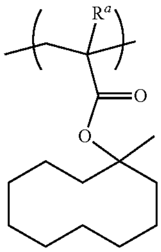
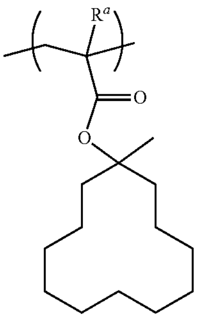
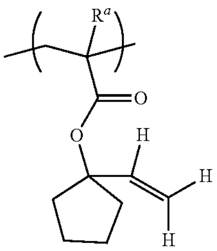
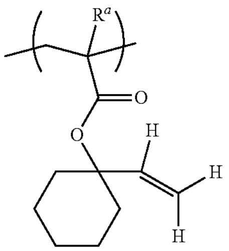
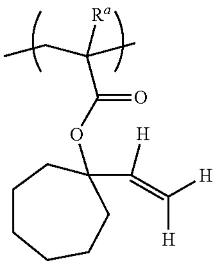
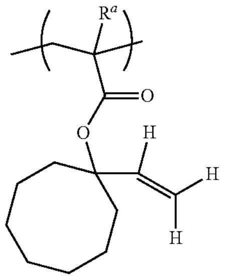
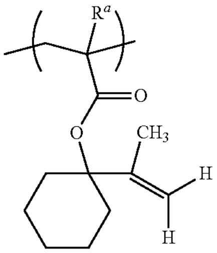
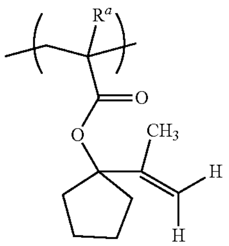
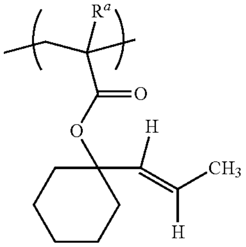
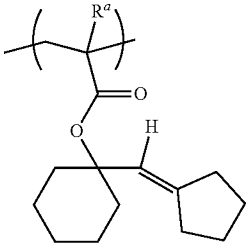

-continued
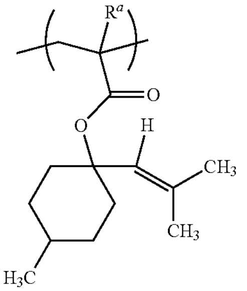
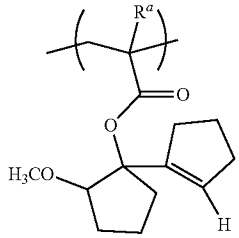
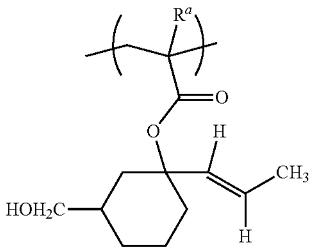
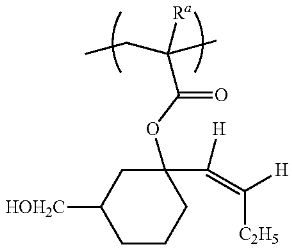
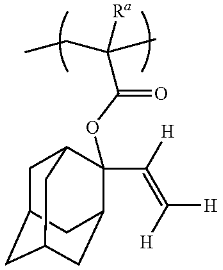
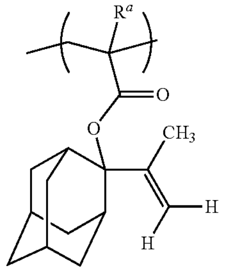
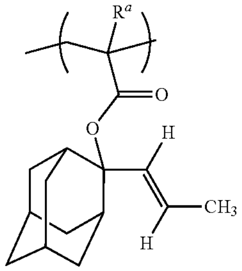
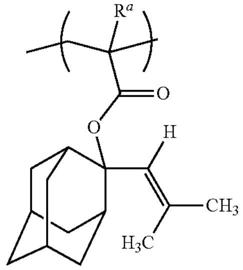
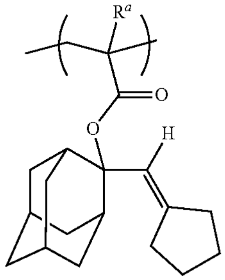
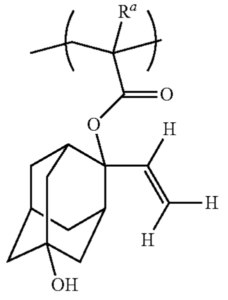
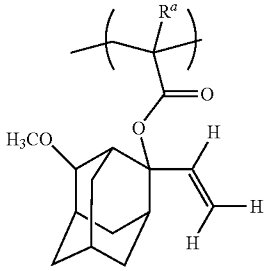
-continued
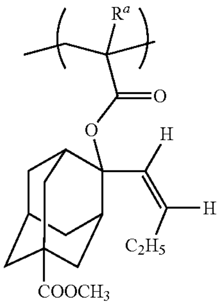
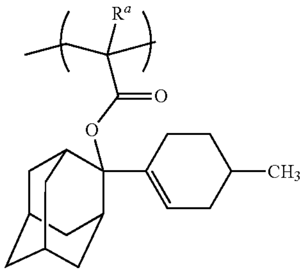
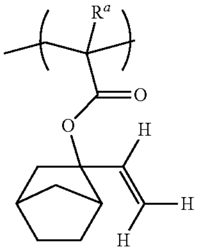
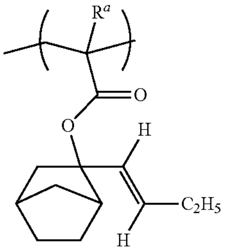
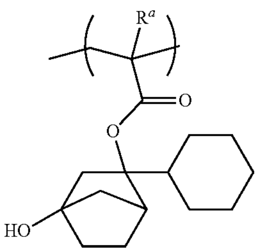
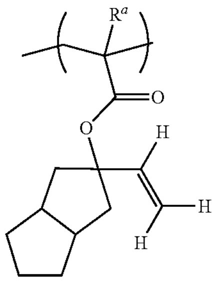
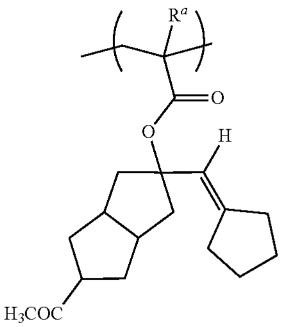
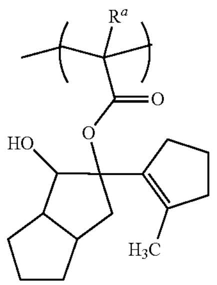
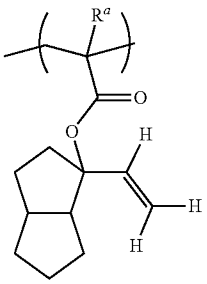
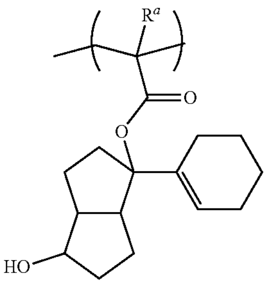

-continued
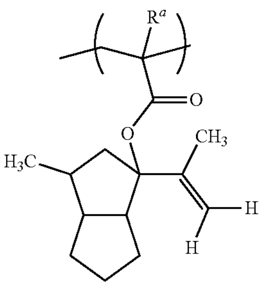
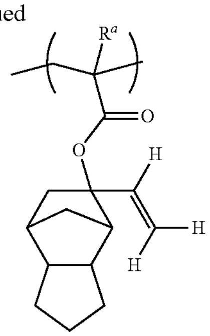
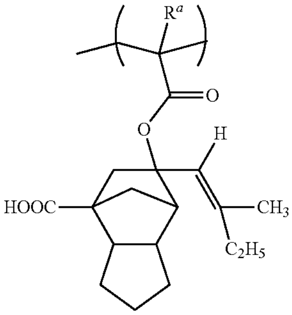
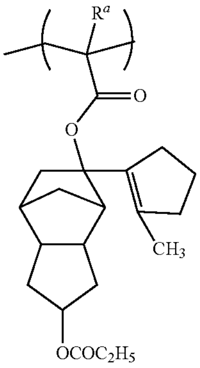
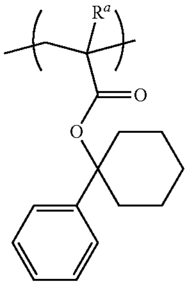
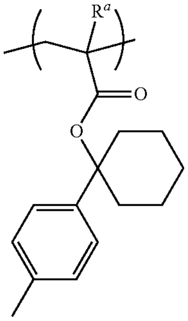
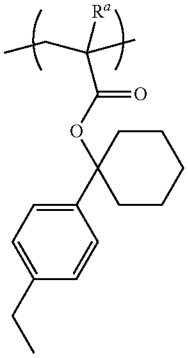
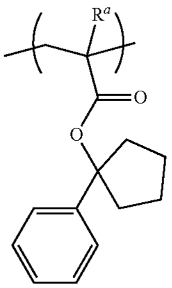
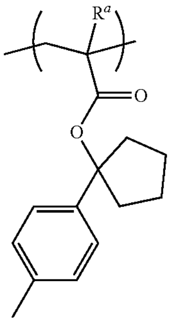
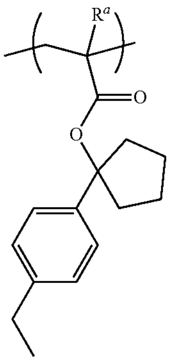
-continued
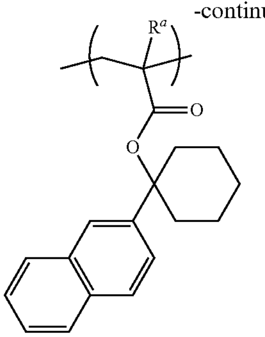
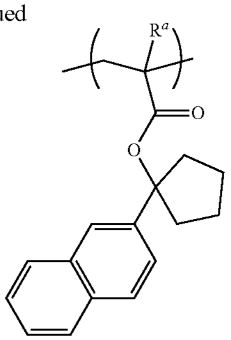
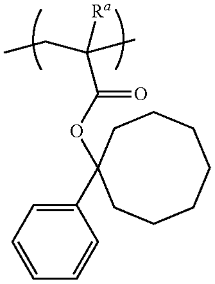
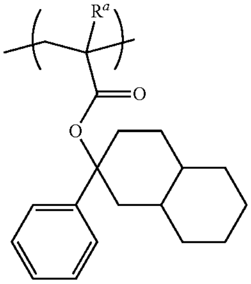
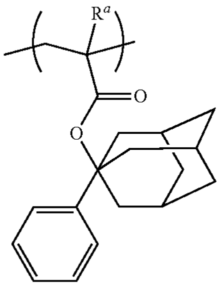
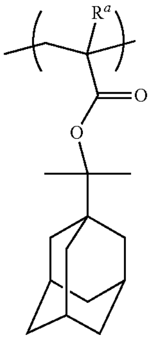
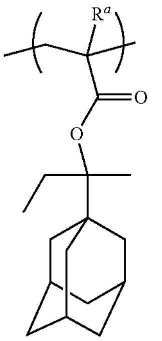
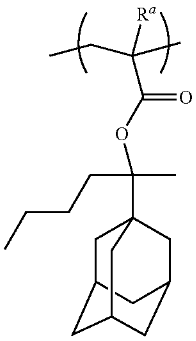
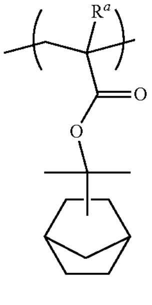
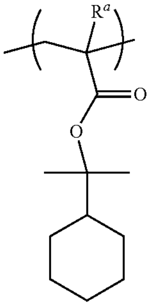
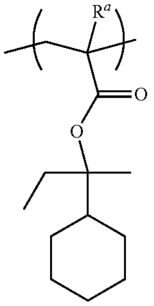

-continued
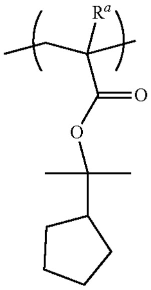
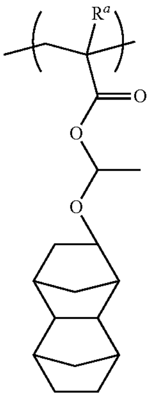
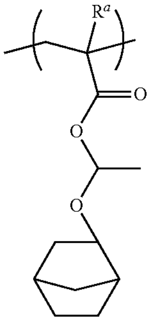
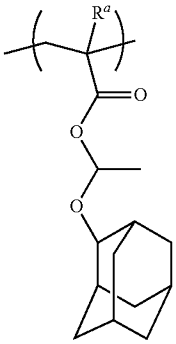
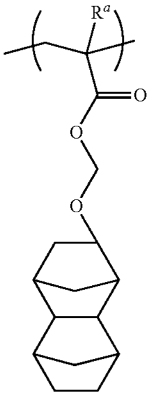
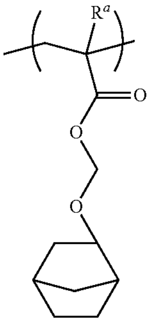
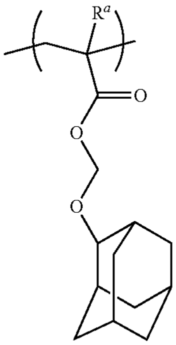
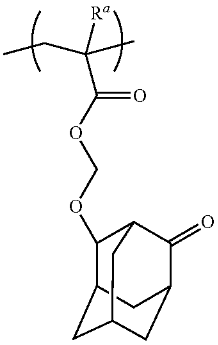
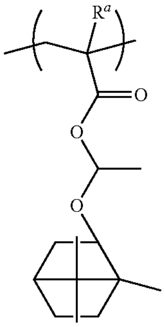
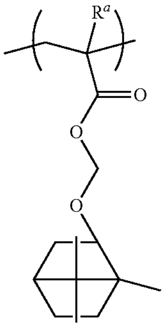
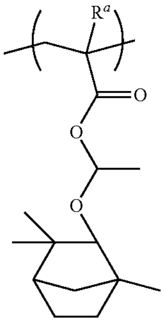
-continued
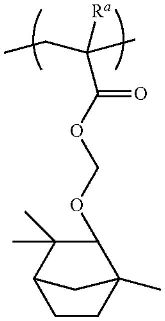
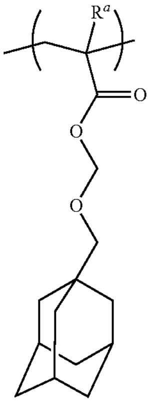
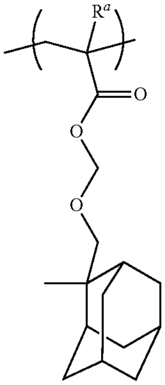
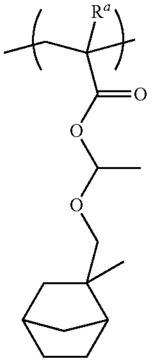
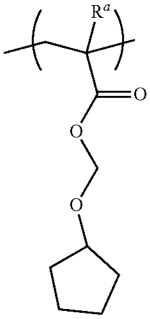
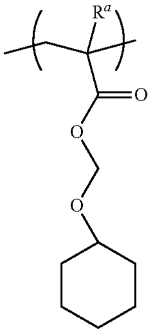
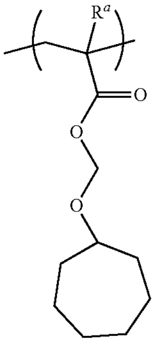
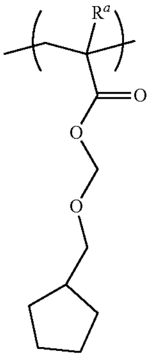
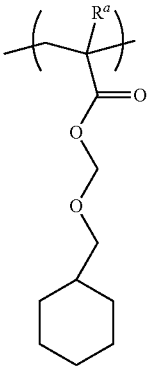
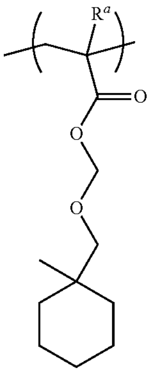
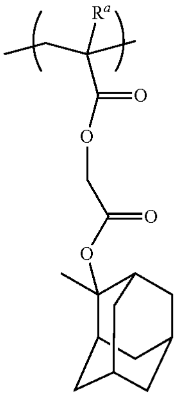
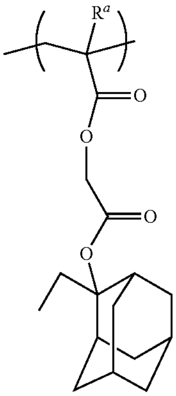

-continued

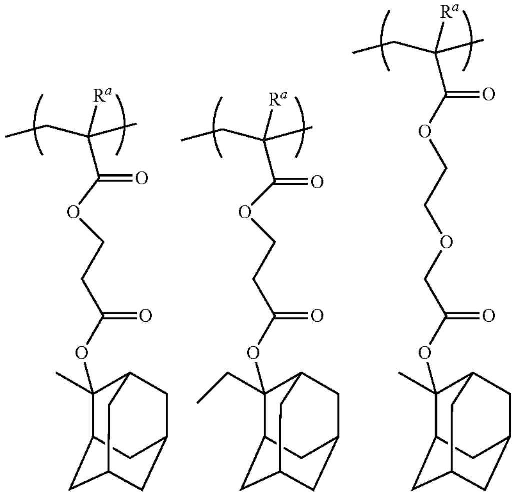

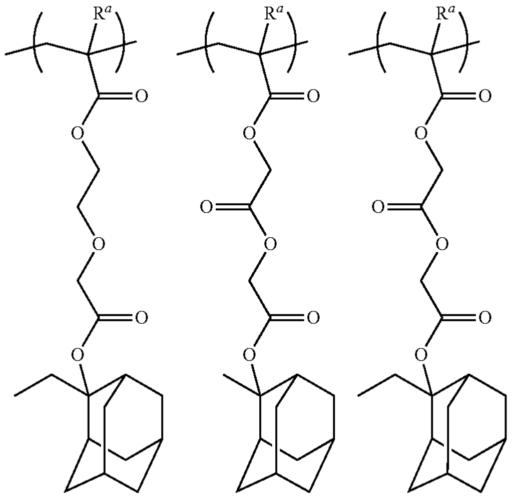

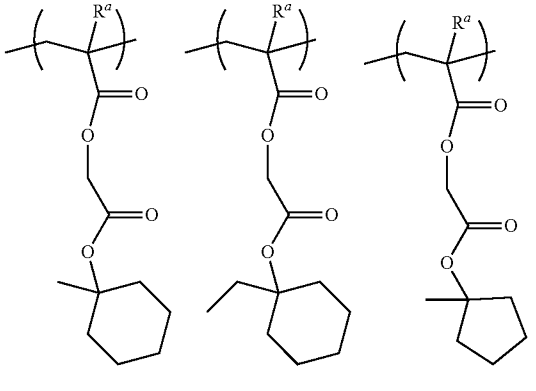

-continued

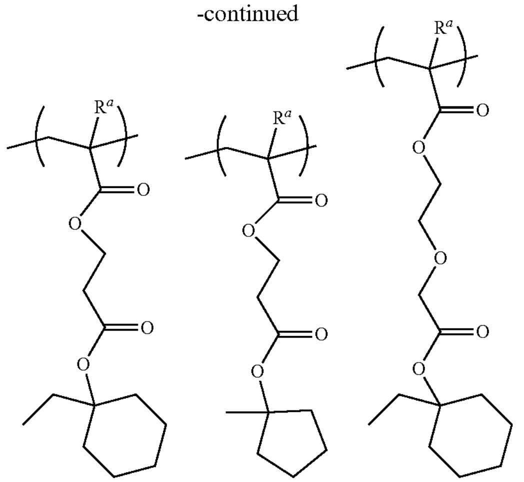

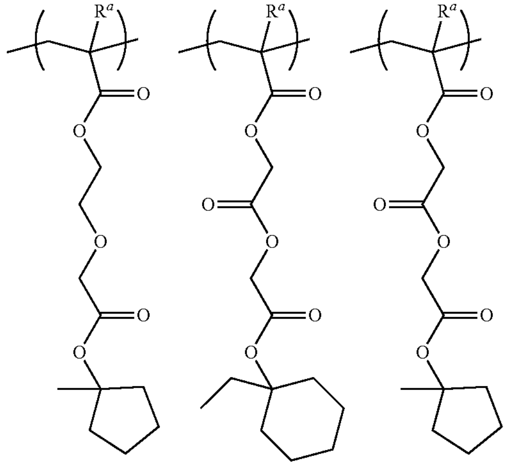

The constituent (a3) that the component (A1) may contain may be of either one kind or two or more kinds.

It is preferable that the proportion of the constituent (a3) to the sum (100 mol %) of all constituents of the component (A1) be 20 to 85 mol %, more preferably 30 to 80 mol %, and particularly preferably 35 to 70 mol %.

Lithography properties such as a resolution and roughness can be improved by setting the proportion of the constituent (a3) larger than or equal to the lower limit value of the above preferable range. Furthermore, it is made possible to balance the constituent (a3) with the other constituents by setting the proportion of the constituent (a3) smaller than or equal to the upper limit value of the above preferable range, whereby various lithography properties can be improved.

<<Other Constituents>>

The component (A1) may contain constituents other than the above-described constituents (a1), (a2) and (a3).

Examples of the other constituents include a constituent (a4) containing an acid-decomposable group whose polarity is increased by action of an acid, a constituent (a5) containing a cyclic group containing $-SO_2-$ or a carbonate-containing cyclic group, a constituent (a6) containing a hydroxy styrene framework, a constituent (a7) containing a polar group-containing aliphatic hydrocarbon group, and a constituent (a8) containing an acid-indissociable aliphatic cyclic group. The constituents (a4) to (a8) can be many of those conventionally known to be used as resin components of resist compositions.

Examples of the cyclic group containing —$SO_2$— of the constituent (a5) include a cyclic group containing —$SO_2$— that may include a substituent represented by the following formula (a5-r-1):

(a5-r-1)

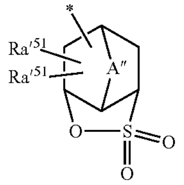

In the formula (a5-r-1), Ra'[51]'s represent, independently of each other, a hydrogen atom, a alkyl group, an alkoxy group, a halogen atom, an alkyl halide group, a hydroxyl group, —COOR", —OC(═O)R", a hydroxyalkyl group or a cyano group, in the case where R" is a hydrogen atom, an alkyl group, a lactone-containing cyclic group, a carbonate-containing cyclic group or an $SO_2$-containing cyclic group. A" represents an alkylene group having a carbon atom number of 1 to 5 that may contain an oxygen atom or a sulfur atom, an oxygen atom or a sulfur atom.

In the formula (a5-r-1), preferable examples of the alkylene group having a carbon atom number of 1 to 5 represented by A" include a linear or branched alkylene group, examples of which includes a methylene group, an ethylene group, an n-propylene group and an isopropylene group. In the case where this alkylene group contains an oxygen atom or a sulfur atom, specific examples of it include a group in which —O— or —S— exists at the end or between carbon atoms located on the side of connection to the —$SO_2$-containing ring of the alkylene group, such as —O—$CH_2$—, —$CH_2$—O—$CH_2$—, —S—$CH_2$— and —$CH_2$—S—$CH_2$—. It is preferable that A" be an alkylene group having a carbon atom number of 1 to 5 or —O—, more preferably an alkylene group having a carbon atom number of 1 to 5, and most preferably a methylene group.

Preferable examples of the alkyl group represented by each Ra'[51] include an alkyl group having a carbon atom number of 1 to 6. It is preferable that the alkyl group be a linear one or a branched one. Specific examples include a methyl group, an ethyl group, a propyl group, an isopropyl group, an n-butyl group, an isobutyl group, a tert-butyl group, a pentyl group, an isopentyl group, a neopentyl group and a hexyl group, among which a methyl group and an ethyl group are preferable and a methyl group is particularly preferable.

Preferable examples of the alkoxy group represented by each Ra'[51] include an alkoxy group having a carbon atom number of 1 to 6. It is preferable that the alkoxy group be a linear one or a branched one. Specific examples include a group obtained by connecting an oxygen atom (—O—) to the alkyl group mentioned above as specific examples of each Ra'[51].

Examples of the halogen atom represented by each Ra'[51] include a fluorine atom, a chlorine atom, a bromine atom and an iodine atom, among which a fluorine atom is preferable.

Examples of the alkyl halide group represented by each Ra'[51] include a group obtained by replacing, with the above-mentioned halogen atom, all or part of the hydrogen atoms of the alkyl group represented by each Ra'[51]. It is preferable that the alkyl halide group be a fluorinated alkyl group, particularly preferably a perfluoroalkyl group.

In the resist composition, one kind of the component (A1) may be used singly or two or more kinds of the component (A1) may be used in combination.

In the resist composition according to the embodiment, a resin component as the component (A1) contains a polymer compound having the constituents (a1) and (a2) and may either employ one kind of polymer singly or employ two or more kinds of polymers in combination.

Preferable examples of the component (A1) include a polymer compound having a structure that the constituents (a1) and (a2) are repeated, a polymer compound having a structure that the constituents (a1), (a2) and (a3) are repeated, and a polymer compound having a structure that the constituents (a1), (a2) and (a3) and another or other constituents are repeated. Among these examples of the component (A1), a polymer compound having a structure that the constituents (a1), (a2) and (a3) are repeated is preferable.

The component (A1) as exemplified above can be manufactured by dissolving monomers to derive individual constituents in a polymerization solvent and adding, for example, a radical polymerization initiator such as azobisisobutylnitrile (AIBN) and azobisisobutyrate dimethyl (e.g., V-601) to a resulting solution to cause polymerization. Alternatively, the component (A1) as exemplified above can be manufactured by dissolving, in a polymerization solvent, a monomer to derive the constituent (a1), a monomer to derive the constituent (a2), a monomer to derive the constituent (a3) (preferably), and a monomer(s) to derive another or other constituents (if necessary), adding a radical polymerization initiator as exemplified above to a resulting solution to cause polymerization, and then causing a deprotection reaction. While causing the polymerization, a —$C(CF_3)_2$—OH group may be introduced at the end by also using a chain transfer agent such as HS—$CH_2$—$CH_2$—$CH_2$—$C(CF_3)_2$—OH.

A copolymer in which a hydroxyalkyl group obtained by replacing part of the hydrogen atoms of an alkyl group with a fluorine atom is effective in reducing the probability of occurrence of a development defect and LER (line edge roughness: nonuniform irregularities in line side walls).

There are no particular limitations on the weight average molecular weight (Mw; in terms of polystyrene obtained through conversion by gel permeation chromatography (GPC)) of the component (A1); Mw of the (A1) is preferably 1,000 to 50,000, more preferably 2,000 to 30,000 and, further preferably 3,000 to 20,000.

In the case where Mw of the component (A1) is smaller than or equal to the preferable upper limit value of this range, the component (A1) is soluble in a resist solvent enough to be used as a resist. In the case where Mw of the component (A1) is larger than or equal to the preferable lower limit value of this range, dry etching resistance is high and a resulting resist pattern is given good sectional shapes.

There are no particular limitations on the degree of dispersion (Mw/Mn) of the component (A1); the degree of dispersion is preferably 1.0 to 4.0, more preferably 1.0 to 3.0 and particularly preferably 1.0 to 2.0. Mn means a number average molecular weight.

About Component (A2):

The resist composition according to the embodiment may contain, as another component of the component (A), a base material component (hereinafter referred to as a "component (A2)") whose solubility with respect to a developing liquid is varied by action of an acid though it does not fall under the category of the component (A1).

There are no particular limitations on the component (A2) and it may be selected in a desired manner from many materials that are used conventionally as base material components of chemically amplified resist compositions.

The component (A2) may be a single kind of polymer compound or low molecular compound, or a combination of two or more kinds of polymer compounds and low molecular compounds.

It is preferable that the proportion of the component (A1) to the total mass of the component (A) be 25 mass % or larger, more preferably 50 mass % or larger, and further preferably 75 mass % or larger. The proportion of the component (A1) may be 100 mass %. In the case where the proportion of the component (A1) is 25 mass % or larger, it becomes easier to form a resist pattern that are improved in various lithography properties such as sensitivity, resolution and roughness.

The content of the component (A) in the resist composition according to the embodiment may be adjusted according to the thickness of a resist film to be formed and other factors.

It is necessary that the resist composition according to the embodiment contain, in addition to the component (A), the acid generator component (B) (hereinafter may be referred to as a "component (B)") which generates an acid when the component (B) is exposed.

<<Component (B)>>

In the embodiment, the acid generator component (B) contains an acid generator component (B1) (hereinafter may be referred to as a "component (B1)") that is a compound represented by the following general formula (b1):

(b 1)

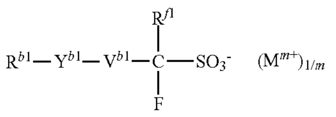

In the general formula (b1), $R^{b1}$ represents a monovalent hydrocarbon group having a carbon atom number of 17 to 50 that has a steroid framework and may include a heteroatom. $Y^{b1}$ represents a single bond or a divalent linking group including a hetero atom. $V^{b1}$ represents an alkylene having a carbon atom number of 2 or larger, a fluorinated alkylene group or an ester group. $R^{f1}$ represents a hydrogen atom, a fluorine atom, or an alkyl group that may include a fluorine atom. Symbol "m" is an integer of 1 or larger and $M^{m+}$ represents an m-valent organic cation.

Anion Portion ($R^{b1}$—$Y^{b1}$—$V^{b1}$—$CFR^{f1}$—$SO_3^-$):

In the above formula (b1), $R^{b1}$ represents a monovalent hydrocarbon group having a carbon atom number of 17 to 50 that has a steroid framework.

The term "steroid framework" as used above means a framework having a ring structure represented by the following formula (St) that is obtained by condensation of three six-membered rings and one five-membered ring.

(S t)

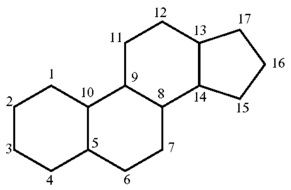

In the above formula (St), the numbers that are written adjacent to each carbon atom are carbon position numbers. In this disclosure, the carbon position numbers shown in the above formula (St) are used in referring to the position of carbon atoms in the steroid framework.

The steroid framework of $R^{b1}$ may include a substituent. For example, an alkyl group (preferably an alkyl group having a carbon atom number of 1 to 5, particularly preferably a methyl group), a carboxy group, an oxo group (=O), an alkoxyl group, an alkylcarbonyloxy group (preferably an acetoxy group), a formyloxy group (HC(=O)—O—), a hydroxyl group, or a lactone-containing cyclic group may be connected, as a substituent, to the ring structure represented by the above formula (St). The above lactone-containing cyclic group may have one or more double bonds in the ring structure. Although there are no particular limitations on the number of double bonds, the number is preferably one.

The carbon atom number of $R^{b1}$ should be 17 to 50, preferably 17 to 40, more preferably 17 to 30, and particularly preferably 17 to 22.

It is noted that the carbon atom number of $R^{b1}$ includes the number of carbon atoms constituting the steroid framework as well as the number of carbon atoms in the substituent connected to the steroid framework.

In the above formula (b1), $R^{b1}$ represents a single bond or a divalent linking group having a hetero atom. It is preferable that the divalent linking group have an oxygen atom as a hetero atom, and the divalent linking group may have a hetero atom other than an oxygen atom. Examples of the hetero atom other than an oxygen atom include a nitrogen atom and a sulfur atom.

Examples of the divalent linking group having a hetero atom represented by $Y^{b1}$ include non-hydrocarbon hetero atom-containing linking groups such as an oxygen atom (ether band: —O—), an ester bond (—C(=O)—O—), an oxycarbonyl group (—O—C(=O)—), an amide bond (—C(=O)—NH—, —NH—C(=O—), a carbonyl group (—C(=O)—) and a carbonate bond (—O—C(=O)—O—); and a combination of such a non-hydrocarbon hetero atom-containing linking group and an alkylene group. A sulfonyl group (—$SO_2$) may further be connected to this combination. It is preferable that the divalent linking group having a hetero atom represented by $Y^{b1}$ be a divalent linking group including at least one kind of functional group selected from the group consisting of a carboxylate ester group, an ether group, a carbonate ester group, a carbonyl group and an amide group.

Examples of this combination include a linking group that is represented by one of the following formulae (y-a1-1) to (y-a1-8):

(y-al-1)

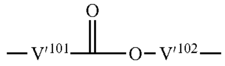

(y-al-2)

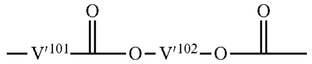

(y-al-3)

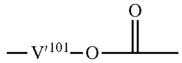

(y-al-4)

$—V'^{101}—O—$

-continued (y-al-5)

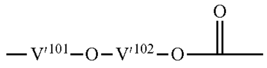

(y-al-6)

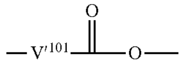

(y-al-7)

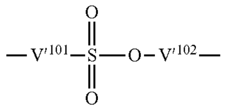

(y-al-8)

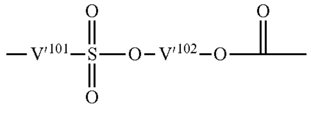

In these formulae, each $V'^{101}$ represents a single bond or an alkylene group having a carbon atom number of 1 to 5 and each $V'^{102}$ represents a divalent saturated hydrocarbon group having a carbon atom number of 1 to 30.

It is preferable that divalent saturated hydrocarbon group represented by $V'^{102}$ be an alkylene group having a carbon atom number of 1 to 30. It is preferable that the alkylene group of $V'^{102}$ be an alkylene group having a carbon atom number of 1 to 30, more preferably an alkylene group having a carbon atom number of 1 to 10, and further preferably an alkylene group having a carbon atom number of 1 to 5.

The alkylene group of each of $V'^{101}$ and $V'^{102}$ may be either a linear alkylene group or branched alkylene group.

Specific examples of the alkylene group of each of $V'^{1in}$ and $V'^{102}$ include a methylene group $—CH_2—$; alkylmethylene groups such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, $—C(CH_2CH_3)_2—$; an ethylene group $—CH_2CH_2—$; alkylethylene groups such as $—CH(CH_3)CH_2—$, $—CH(CH_3)CH(CH_3)—$, $—C(CH_3)_2CH_2—$ and $—CH(CH_2CH_3)CH_2—$; a trimethylene group (n-propylene group) $—CH_2CH_2CH_2—$; alkyltrimethylene groups such as $—CH(CH_3)CH_2CH_2—$ and $—CH_2CH(CH_3)CH_2$; a tetramethylene group $—CH_2CH_2CH_2CH_2—$; alkyltetramethylene groups such as $—CH(CH_3)CH_2CH_2CH_2—$ and $—CH_2CH(CH_3)CH_2CH_2—$; and a pentamethylene group $—CH_2CH_2CH_2CH_2CH_2—$.

Part of the methylene groups in the above examples of the alkylene groups may be replaced by a divalent aliphatic cyclic group having a carbon atom number of 5 to 10. Preferable examples of this aliphatic cyclic group include a cyclohexylene group, a 1, 5-adamanthylene group and a 2, 6-adamanthylene group.

It is preferable that $Y^{b1}$ be a divalent linking group having an ester bond or an ether bond, more preferably the linking group represented by one of the above formulae (y-a1-1) to (y-a1-6), and further preferably the linking group represented one of by the above formulae (y-a1-1) to (y-a1-3) and (y-a1-6).

In the above formular (b1), $V^{b1}$ represents an alkylene group having a carbon atom number of 2 or larger, a fluorinated alkylene group or an ester group.

Although the alkylene group or the fluorinated alkylene group represented by $V^{b1}$ may be either linear or branched, it is preferably linear.

It is preferable that the alkylene group having a carbon atom number of 2 or larger represented by $V^{b1}$ be 2 to 4 in carbon atom number, more preferably 2 or 3 in carbon atom number.

Examples of the fluorinated alkylene group represented by $V^{b1}$ include a group obtained by replacing all or part of the hydrogen atoms of the alkylene group with a fluorine atom. It is preferable that the fluorinated alkylene group represented by $V^{b1}$ be such that its carbon atom adjacent to the carbon atom to which $R^{f1}$ is connected has at least one fluorine atom or a fluorinated alkylene group having a carbon atom number of 1 to 3.

Particularly preferable examples of $V^{b1}$ include an ester group and a fluorinated alkylene group having a carbon atom number of 1 to 3. It is preferable that the ester group and the fluorinated alkylene group having a carbon atom number of 1 to 3 be such that $Y^{b1}—V^{b1}$ is represented by $Y^{b1}—O—(C{=}O)—$, $Y^{b1}—(CH_2)_n—CHF—$, or $Y^{b1}—(CH_2)_n—CF_2—$ (n: integer of 0 to 2).

Specific examples of the anion portion of the component (B 1) will be described below. In the following formulae, k is an integer of 2 to 5. However, the anion portion of the (B1) should not be limited to the following specific examples.

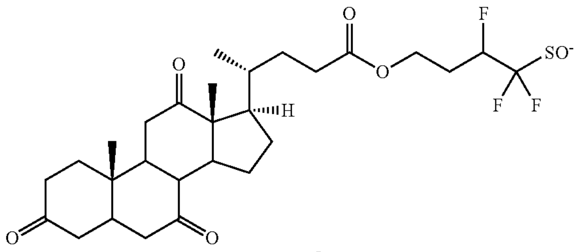

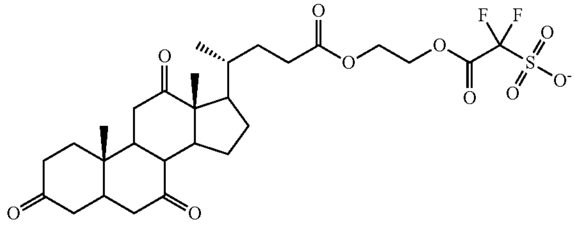

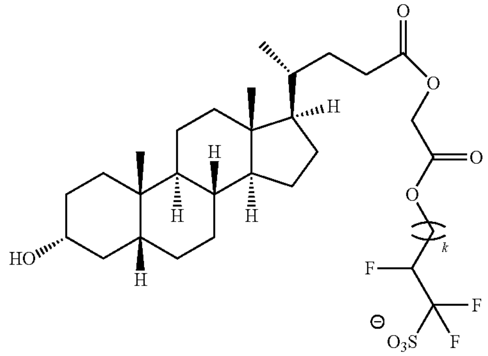

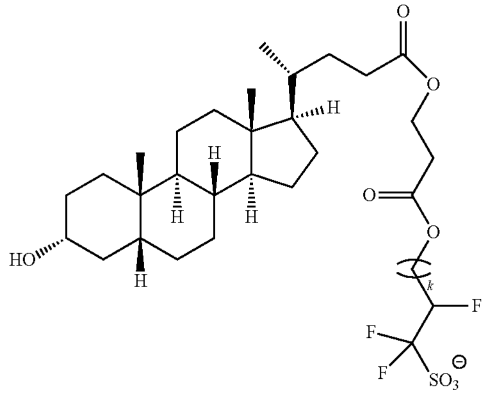

-continued
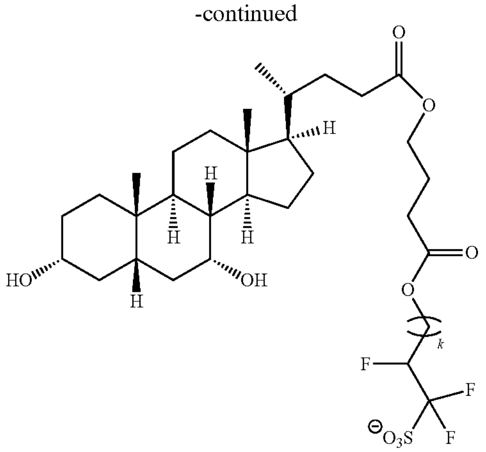
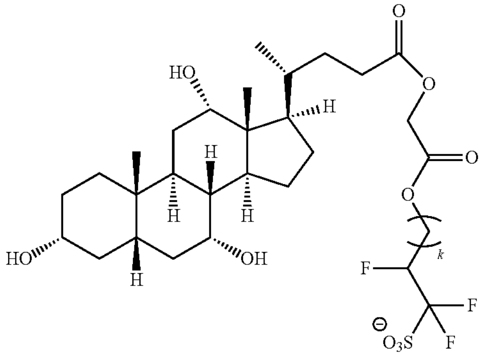
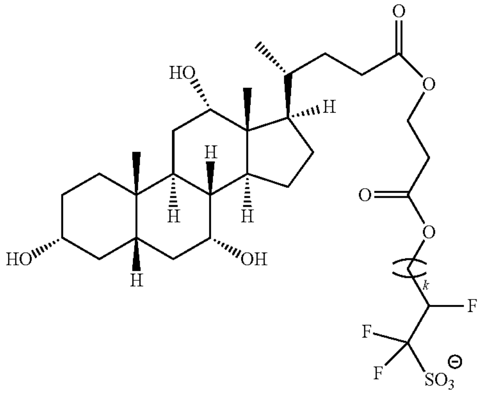
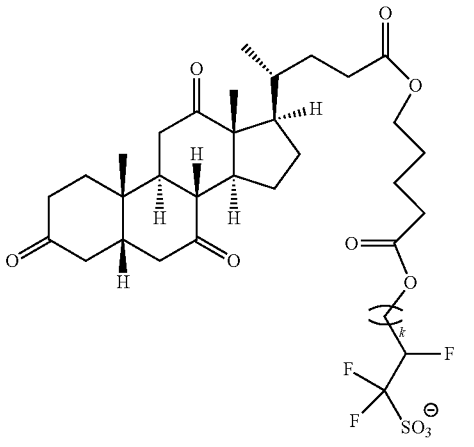
-continued
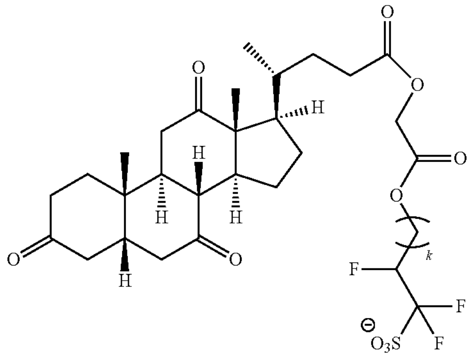
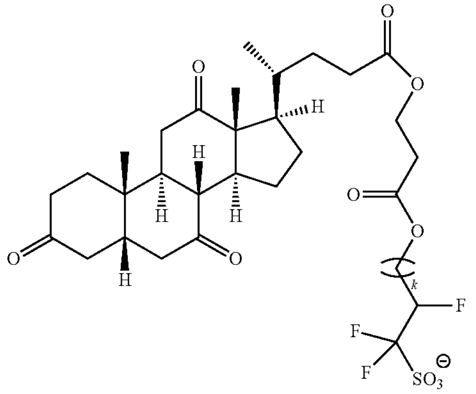
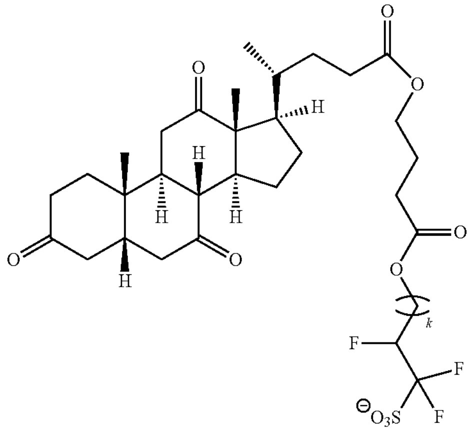
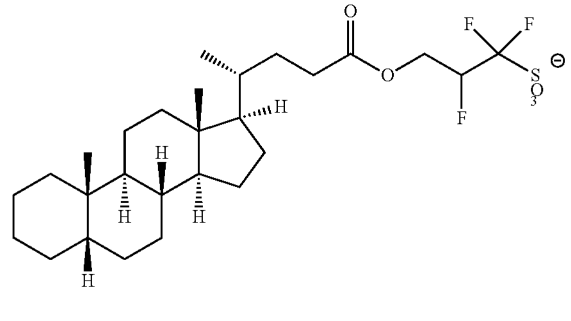

-continued

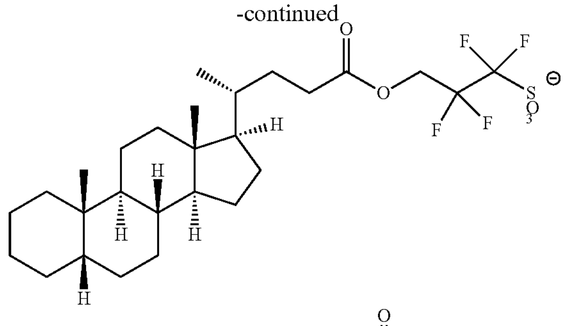

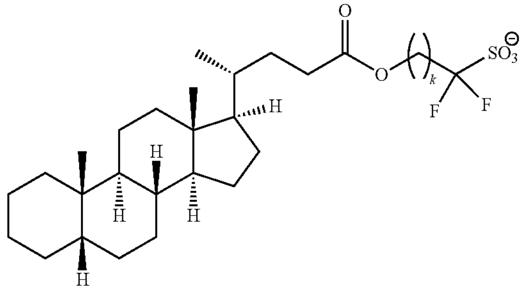

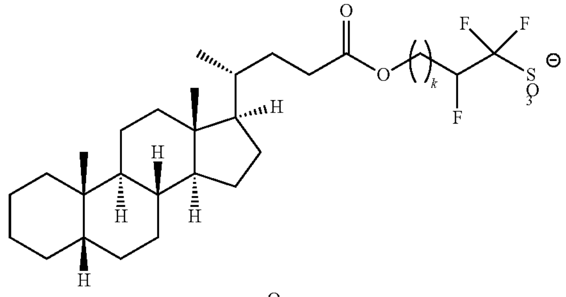

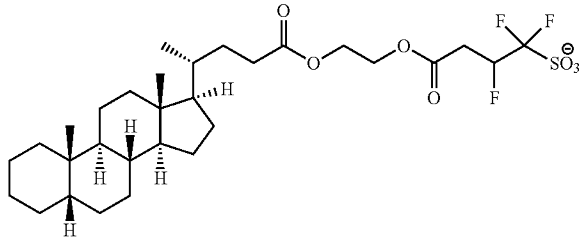

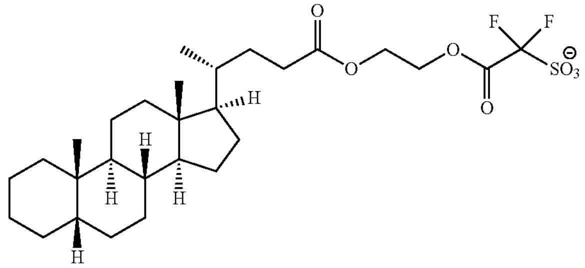

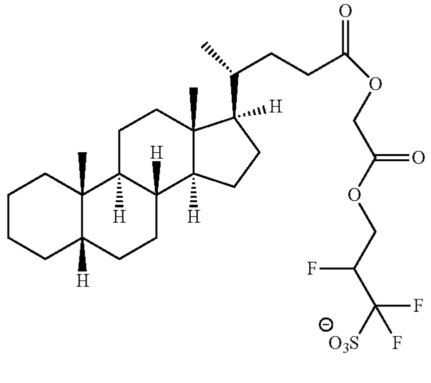

-continued

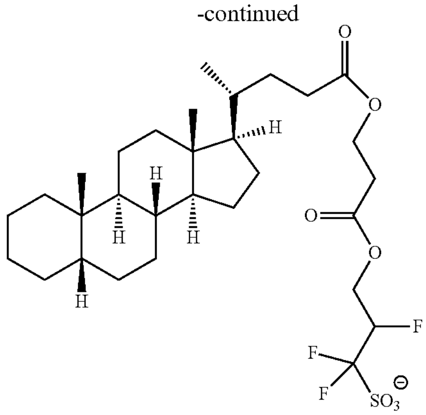

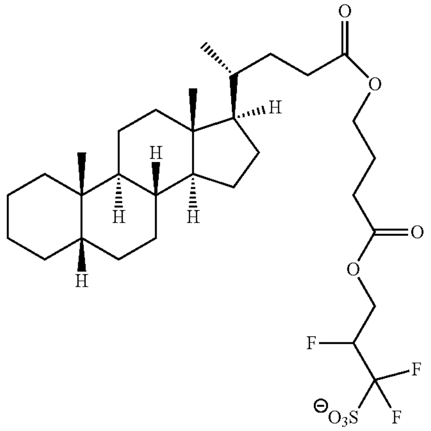

Cation Portion $(M^{m+})_{1/m}$:

In the above formula (b1), $M^{m+}$ represents an m-valent organic cation. It is preferable that the organic cation represented by $M^{m+}$ be an onium cation, more preferably a sulfonium cation and an iodonium cation. Character m represents an integer of 1 or larger.

Preferable examples of the cation portion $(M^{m+})_{1/m}$ include an organic cation represented by one of the following general formulae (ca-1) to (ca-3):

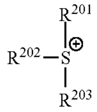

(ca-1)

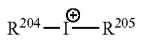

(ca-2)

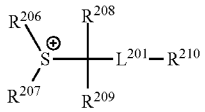

(ca-3)

In the general formulae (ca-1) to (ca-3), $R^{201}$ to $R^{207}$ represent, independently of each other, an aryl group that may include a substituent, an alkyl group that may include a substituent, or an alkenyl group that may include a substituent. $R^{201}$ to $R^{203}$ or $R^{206}$ and $R^{207}$ may connect to each other to form a ring together with the sulfur atom existing in the formula. $R^{208}$ and $R^{209}$ represent, independently of each other, a hydrogen atom or an alkyl group having a carbon atom number of 1 to 5. $R^{210}$ represents an aryl group that may include a substituent, an alkyl group that may include a substituent, an alkenyl group that may include a substituent or an $SO_2$-containing cyclic group that may include a substituent. $L^{201}$ represents —C(=O)— or —C(=O)—O—.

Examples of the aryl group of $R^{201}$ to $R^{207}$ include an unsubstituted aryl group having a carbon atom number of 6 to 20, preferably a phenyl group and a naphthyl group.

Examples of the alkyl group of $R^{201}$ to $R^{207}$ include a chain or cyclic alkyl group, preferably one having a carbon atom number of 1 to 30.

Preferable examples of the alkenyl group of $R^{201}$ to $R^{207}$ include one having a carbon atom number of 2 to 10.

Examples of the substituents that $R^{201}$ to $R^{207}$ may contain include an alkyl group, a halogen atom, an alkyl halide group, a carbonyl group, a cyano group, an amino group, an aryl group, an arylthiol group, and a group represented by one of the following formulae (ca-r-1) to (ca-r-7).

Examples of the aryl group in the arylthiol group as a substituent include an aryl group having a carbon atom number of 6 to 20, preferably a phenyl group, a naphthyl group and a biphenyl group. Examples of the arylthiol group include a phenylthiol group, a naphthylthio group and a biphenylthio group.

[ca-r-1]

$—O—R'^{201}$

[ca-r-2]

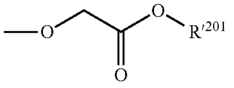

[ca-r-3]

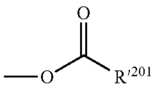

[ca-r-4]

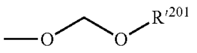

[ca-r-5]

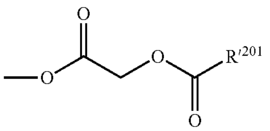

[ca-r-6]

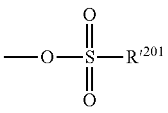

[ca-r-7]

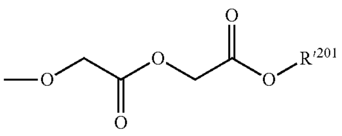

In the formulae (ca-r-1) to (ca-r-7), $R'^{201}$'s represent, independently of each other, a hydrogen atom, a cyclic group that may include a substituent, a chain alkyl group that may include a substituent, or a chain alkenyl group that may include a substituent.

It is preferable that the cyclic group that is represented by $R'^{201}$ and may include a substituent be a cyclic hydrocarbon group that may be either an aromatic hydrocarbon group or an aliphatic hydrocarbon group.

Examples of the aromatic hydrocarbon group include an aryl group obtained by removing one hydrogen atom from an aromatic hydrocarbon ring or an aromatic compound containing two or more aromatic rings, preferably a phenyl group and a naphthyl group.

Examples of the aliphatic hydrocarbon group include a group obtained by removing one hydrogen atom from a monocycloalkane or a polycycloalkane, preferably an adamantyl group and a norbornyl group.

The chain alkyl group that is represented by $R'^{201}$ and may include a substituent may be either linear or branched.

It is preferable that the carbon atom number of the linear alkyl group be 1 to 20, more preferably 1 to 15, and most preferably 1 to 10. Specific examples include a methyl group, an ethyl group, a propyl group, a butyl group, a pentyl group, a hexyl group, an heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The chain alkenyl group that is represented by $R'^{201}$ and may include a substituent may be either linear or branched, and its carbon atom number is preferably 2 to 10, more preferably 2 to 5, further preferably 2 to 4, and particularly preferably 3.

Examples of the linear alkenyl group include a vinyl group, a propenyl group (allyl group) and a butynyl group. Examples of the branched alkenyl group include a 1-methylpropenyl group and a 2-methylpropenyl group.

Among the above examples of the chain alkenyl groups, a propenyl group is particularly preferable.

Examples of the cyclic group or the chain alkyl group (each of them is represented by $R'^{201}$ and may include a substituent) are the same as the examples of the acid-dissociable group represented by the above-described formula (a3-r-2).

Examples of the substituent of the cyclic group, the chain alkyl group, or the chain alkenyl group (each of them is represented by $R'^{201}$) include an alkyl group, an alkoxy group, a halogen atom, an alkyl halide group, a hydroxyl group, a carbonyl group and a nitro group.

It is preferable that the alkyl group as a substituent be an alkyl group having a carbon atom number of 1 to 5, most preferably a methyl group, an ethyl group, a propyl group, an n-butyl group and a tert-butyl group.

It is preferable that the alkoxy group as a substituent be an alkoxy group having a carbon atom number of 1 to 5, more preferably a methoxy group, an ethoxy group, an n-propoxy group, an iso-propoxy group, an n-butoxy group and a tert-butoxy group, and most preferably a methoxy group and an ethoxy group.

Examples of the halogen atom as a substitute include a fluorine atom, a chlorine atom, a bromine atom and an iodine atom, among which a fluorine atom is preferable.

Examples of the alkyl halide group as a substitute include groups obtained by replacing, with the above-mentioned halogen atom, all or part of the hydrogen atoms of an alkyl group having a carbon atom number of 1 to 5 such as a methyl group, an ethyl group, a propyl group, an n-butyl group and a tert-butyl group.

In the case where $R^{201}$ to $R^{203}$ or $R^{206}$ and $R^{207}$ connect to each other to form a ring together with the sulfur existing in the formula, they may connect to each other via a hetero atom such as a sulfur atom, an oxygen atom and a nitrogen atom, or a functional group such as a carbonyl group, —SO—, $—SO_2—$, $—SO_3—$, —COO—, —CONH—, and $N(R_N)—$ ($R_N$ is an alkyl group having a carbon atom number of 1 to 5). It is preferable that the ring thus formed be such that one ring that includes the sulfur atom in the formula in its ring framework is a ring of 3 to 10 members including the sulfur atom, particularly preferably a ring of 5 to 7 members including the sulfur atom. Specific examples of the ring thus formed include a thiophene ring, a thiazole ring, a benzothiophene ring, a thianthrene ring, a dibenzothiophene ring, a 9H-thioxanthene ring, a thioxanthone ring, a phenoxathiine ring, a tetrahydrothiophenium ring, a tetrahydrothiopyranium ring and a thioxanium ring.

$R^{208}$ and $R^{209}$ represent, independently of each other, a hydrogen atom or an alkyl group having a carbon atom number of 1 to 5, preferably a hydrogen atom or an alkyl group having a carbon atom number of 1 to 3. In the case where $R^{208}$ and $R^{209}$ are, independently of each other, an alkyl group, they may be connected to each other so as to form a ring.

$R^{210}$ represents an aryl group that may include a substituent, an alkyl group that may include a substituent, an alkenyl group that may include a substituent, or a cyclic group containing $—SO_2—$ that may include a substituent.

Examples of the aryl group of $R^{210}$ include an unsubstituted aryl group having a carbon atom number of 6 to 20, preferably a phenyl group and a naphthyl group.

The alkyl group of $R^{210}$ is preferably a chain or cyclic alkyl group having a carbon atom number of 1 to 30.

The alkenyl group of $R^{210}$ is preferably one having a carbon atom number of 2 to 10.

In the cyclic group containing $—SO_2—$ of $R^{210}$ that may include a substituent, the term "cyclic group containing $—SO_2—$" means a cyclic group that contains a ring containing $—SO_2—$ in its ring framework and specifically a cyclic group in which sulfur atom (S) of $—SO_2—$ serves as part of the ring framework of the cyclic group. With the ring containing $—SO_2—$ in its ring framework defined as the first ring, a ring having only this ring is called a monocyclic group and a ring having another or other ring structures is called a polycyclic group irrespective of its structure. The cyclic group containing $—SO_2—$ may be either a monocyclic group or a polycyclic group.

In particular, it is preferable that the cyclic group containing $—SO_2—$ be a cyclic group containing $—O—SO_2—$ in its ring framework, that is, a cyclic group containing a sultone ring in which —O—S— of $—O—SO_2—$ is part of its ring framework.

Preferable examples of the cyclic group containing $—SO_2—$ of $R^{210}$ that may include a substituent include the group represented by the above-described formula (a5-r-1).

It is preferable that the cation represented by formula (ca-1) be a cation represented by the following formula (b-2):

(b-2)

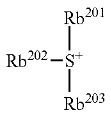

In the formula (b-2), each of $Rb^{201}$ and $Rb^{202}$ represents an aryl group that may include a substituent, $Rb^{203}$ represents an aryl group that may include a substituent, an alkyl group that may include a substituent, or an alkenyl group that may include a substituent. $Rb^{201}$ to $Rb^{203}$ may be connected to each other to form a ring together with the sulfur atom in the formula (b-2).

The expression "aryl group that may include a substituent" represented by each of $Rb^{201}$ and $Rb^{202}$ is the same in meaning as an "aryl group that may include a substituent" as one of the above-mentioned $R^{201}$ to $R^{207}$, and its preferable examples are the same as those of the latter.

The expression "aryl group that may include a substituent, alkyl group that may include a substituent, or alkenyl group that may include a substituent" represented by $Rb^{203}$ is the same in meaning as an "aryl group that may include a substituent, alkyl group that may include a substituent, or alkenyl group that may include a substituent" as one of the above-mentioned $R^{20'}$ to $R^{207}$, and its preferable examples are the same as those of the latter.

Specific examples of the preferable cation represented by formula (ca-1) include a cation represented by one of the following formulae (ca-1-1) and (ca-1-67):

(ca-1-1)

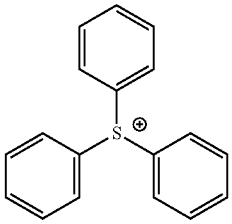

(ca-1-2)

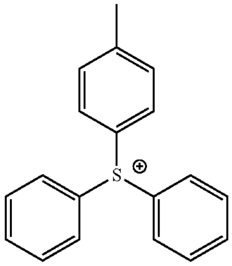

(ca-1-3)

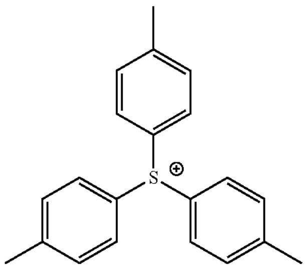

(ca-1-4)

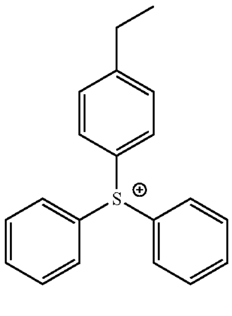

-continued
(ca-1-5)
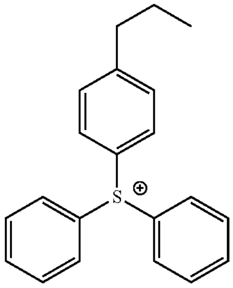
(ca-1-6)
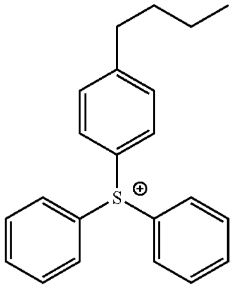
(ca-1-7)
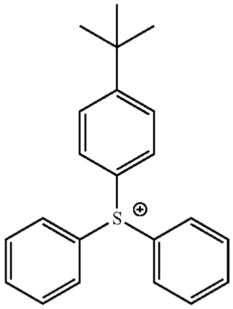
(ca-1-8)
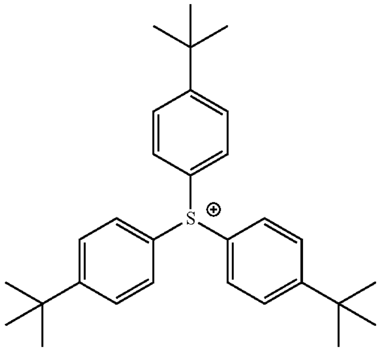
(ca-1-9)
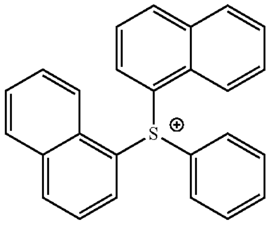
-continued
(ca-1-10)
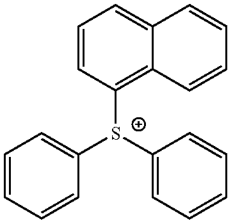
(ca-1-11)
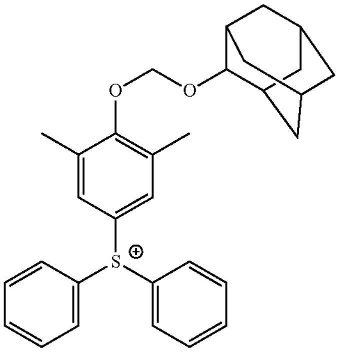
(ca-1-12)
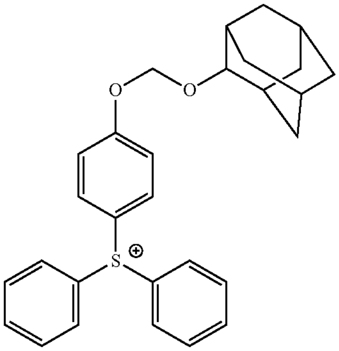
(ca1-13)
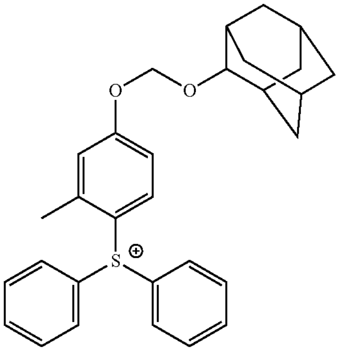
(ca-1-14)
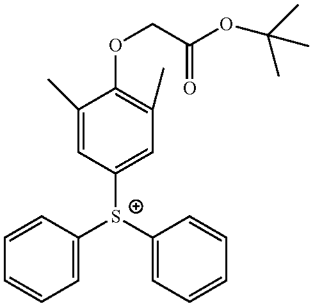

-continued
(ca-1-15)
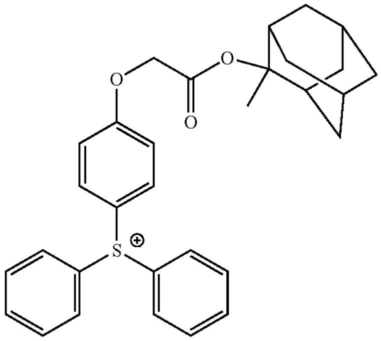
(ca-1-16)
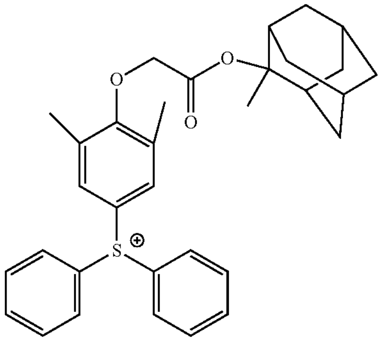
(ca-1-17)
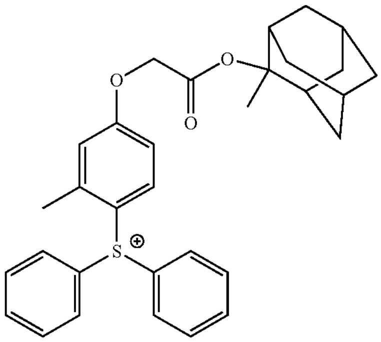
(ca-1-18)
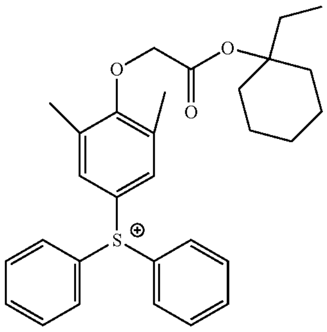
-continued
(ca-1-19)
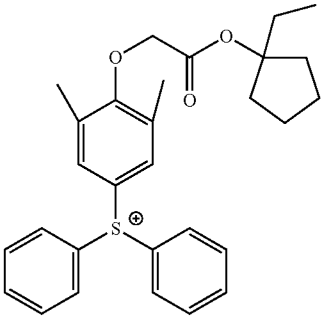
(ca-1-20)
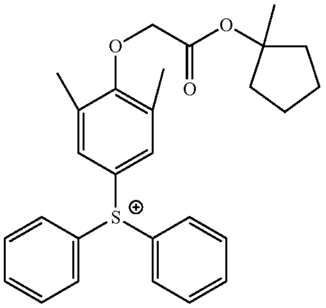
(ca-1-21)
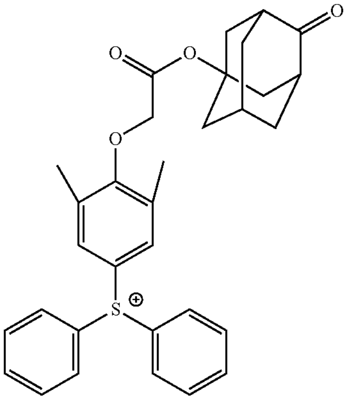
(ca-1-22)
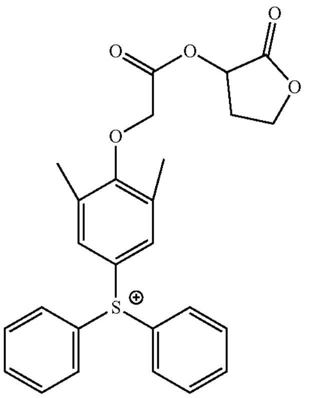

-continued
(ca-1-23)
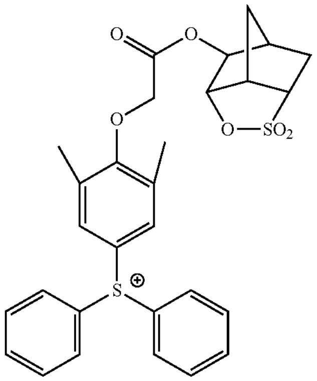
(ca-1-24)
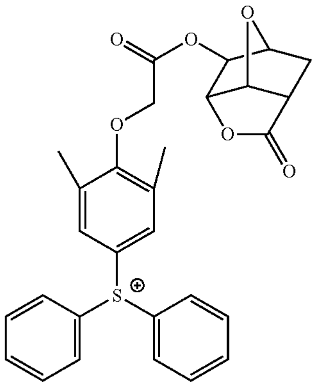
(ca-1-25)
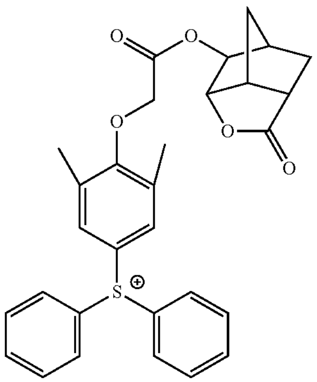
(ca-1-26)
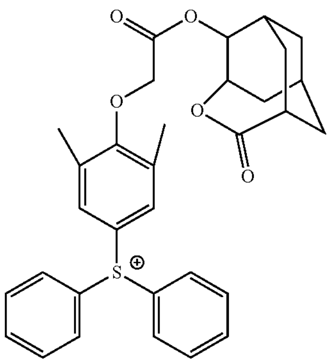
-continued
(ca-1-27)
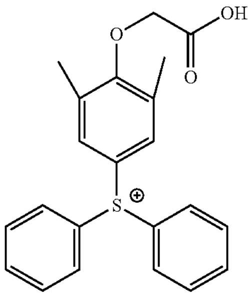
(ca-1-28)
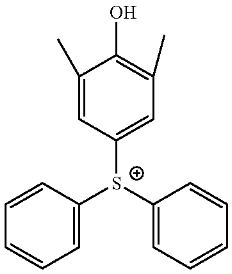
(ca-1-29)
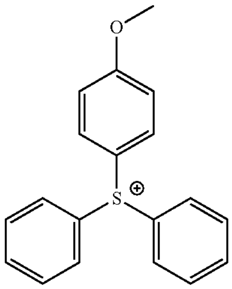
(ca-1-30)
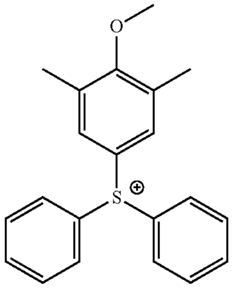
(ca-1-31)
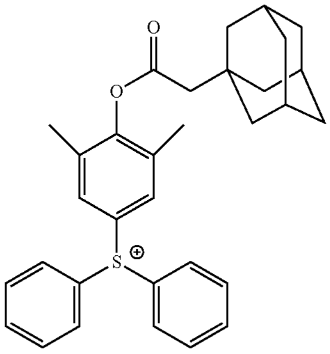

-continued
(ca-1-32)
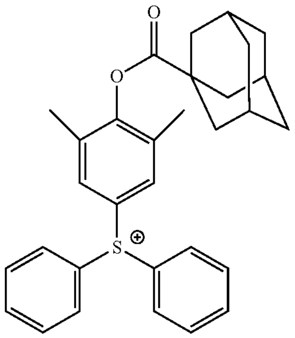
(ca-1-33)
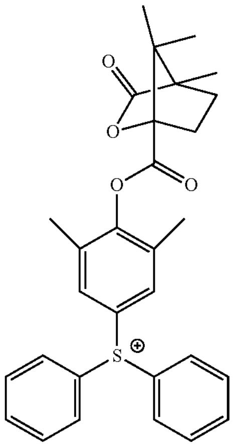
(ca-1-34)
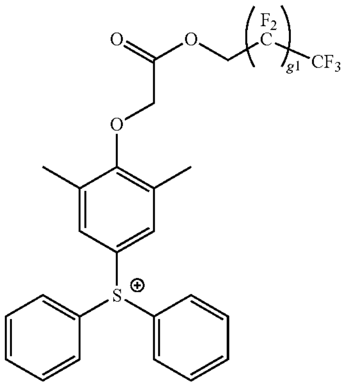
(ca-1-35)
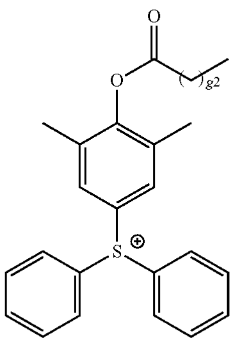
-continued
(ca-1-36)
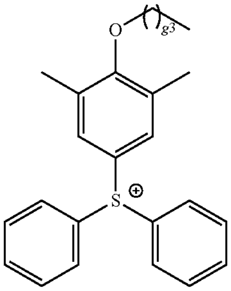
(ca-1-37)
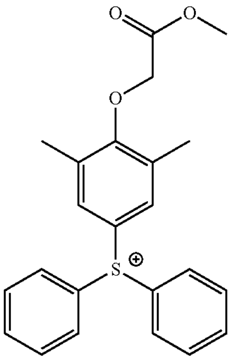
(ca-1-38)
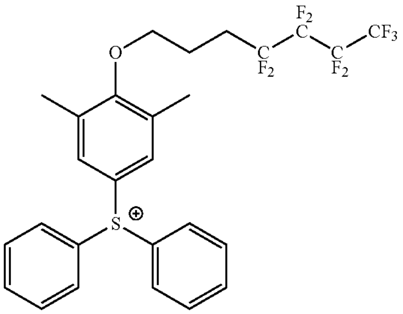
(ca-1-39)
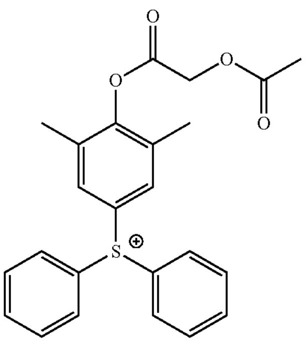

-continued
(ca-1-40)
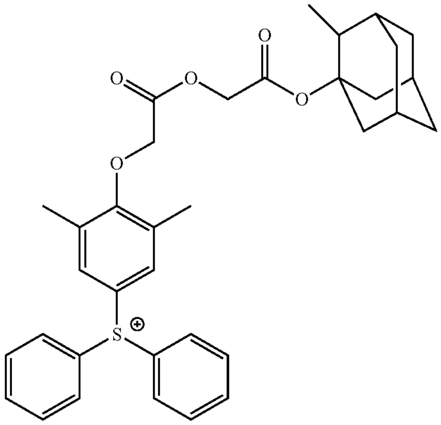
(ca-1-41)
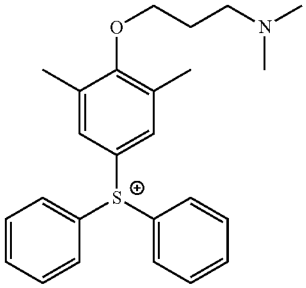
(ca-1-42)
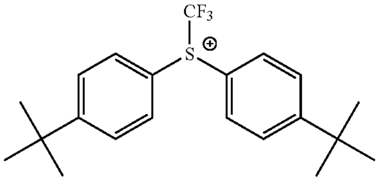
(ca-1-43)
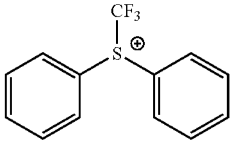
(ca-1-44)
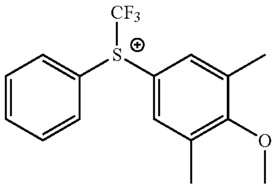
(ca-1-45)
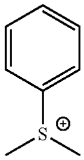
(ca-1-46)
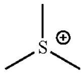
-continued
(ca-1-47)
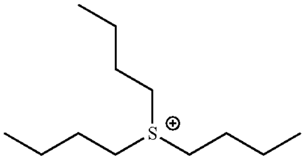
(ca-1-48)
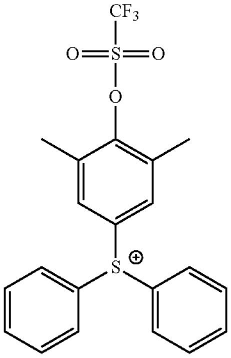
In the above formulae, g1, g2 and g3 are numbers of repetitions and are an integer of 1 to 5, an integer of 0 to 20, and an integer of 0 to 20, respectively.
(ca-1-49)
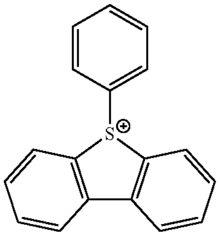
(ca-1-50)
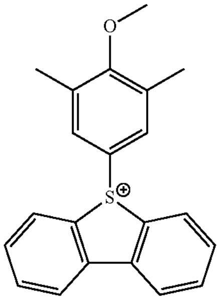
(ca-1-51)
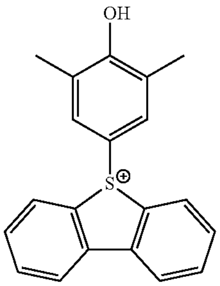

-continued
(ca-1-52)
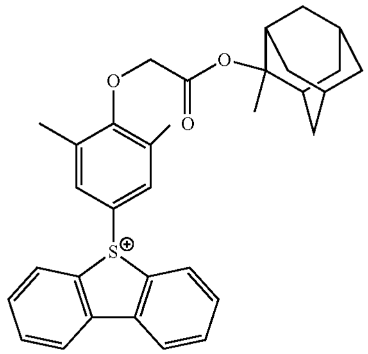
(ca-1-53)
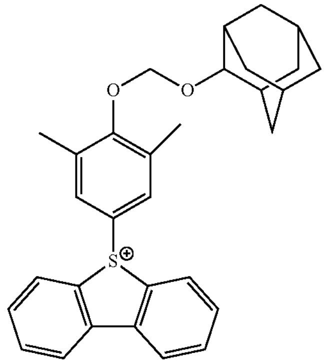
(ca-1-54)
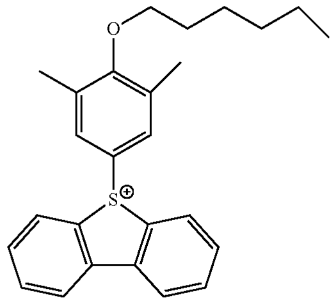
(ca-1-55)
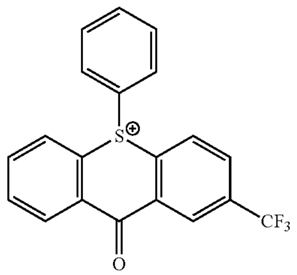
(ca-1-56)
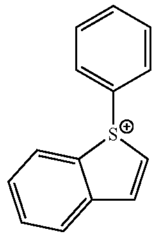
-continued
(ca-1-57)
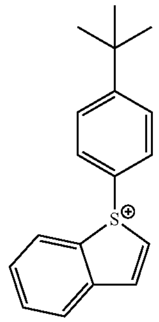
(ca-1-58)
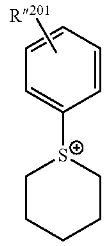
(ca-1-59)
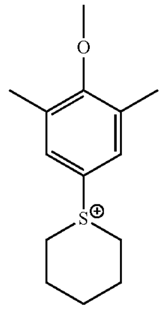
(ca-1-60)
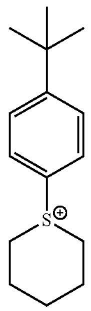
(ca-1-61)
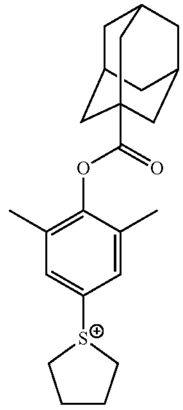

-continued (ca-1-62)

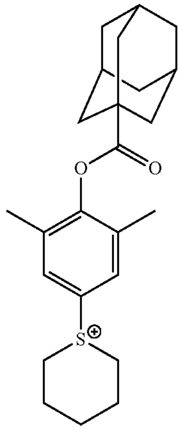

(ca-1-63)

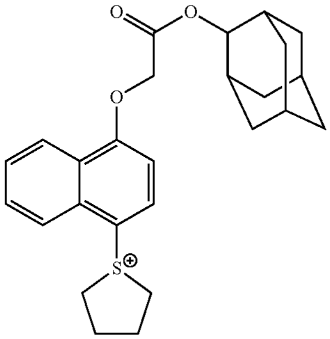

(ca-1-64)

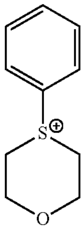

(ca-1-65)

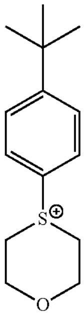

(ca-1-66)

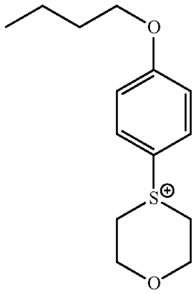

-continued (ca-1-67)

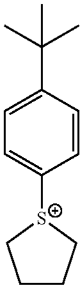

In the above formulae, R"[201] represents a hydrogen atom or a substituent.

Examples of the substituent are the same as the above-mentioned examples of the substituents of $R^{201}$ to $R^{207}$ and $R^{210}$.

Specific examples of the preferable cation represented by formula (ca-3) include a cation represented by one of the following formulae (ca-3-1) to (ca-3-6):

(ca-3-1)

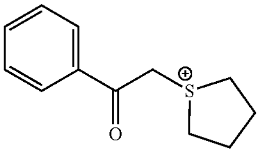

(ca-3-2)

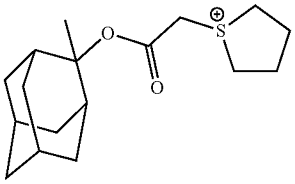

(ca-3-3)

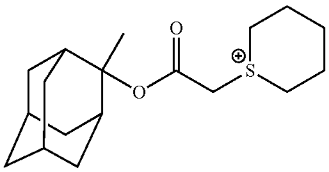

(ca-3-4)

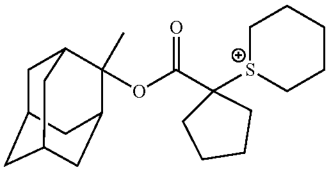

-continued
(ca-3-5)
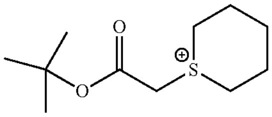
(ca-3-6)
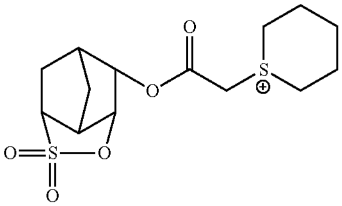
In the embodiment, it is preferable that the component (B 1) be each of compounds represented by the following general formula (b1-1) or the following general formula (b1-2):
(b1-1)
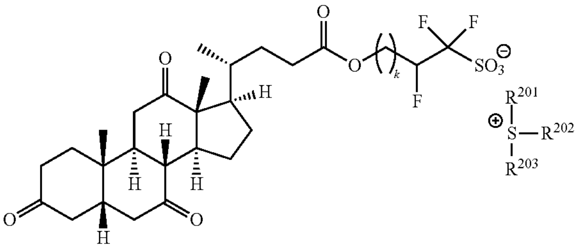
(b1-2)
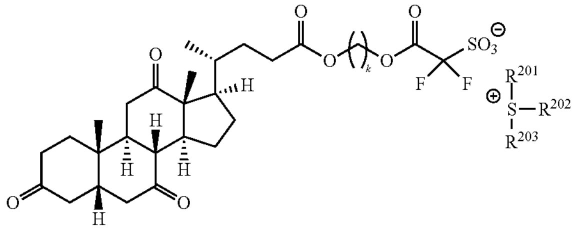
In the general formulae (b1-1) and (b1-2), k and $R^{201}$ to $R^{203}$ are the same in meaning as those mentioned above.
Preferable examples of the component (B1) will be shown below:
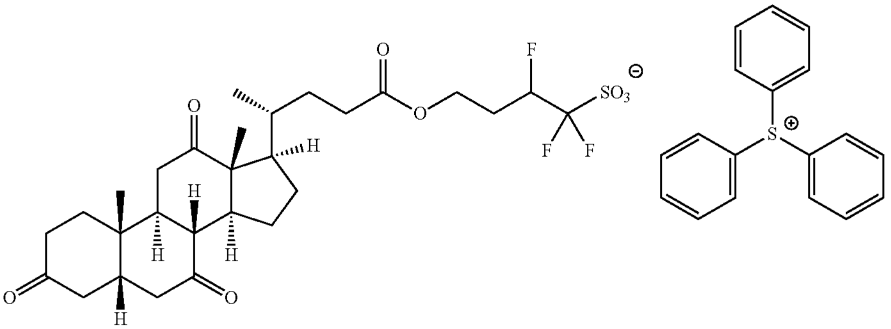
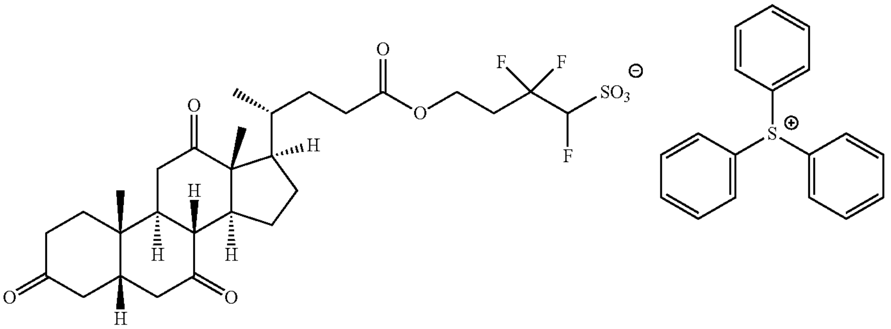
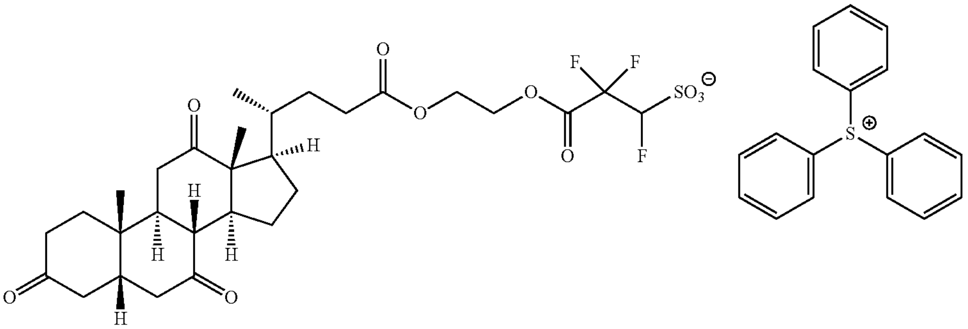

-continued

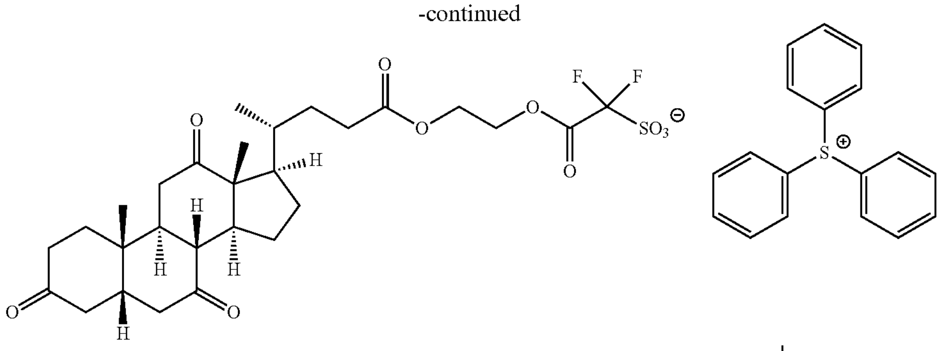

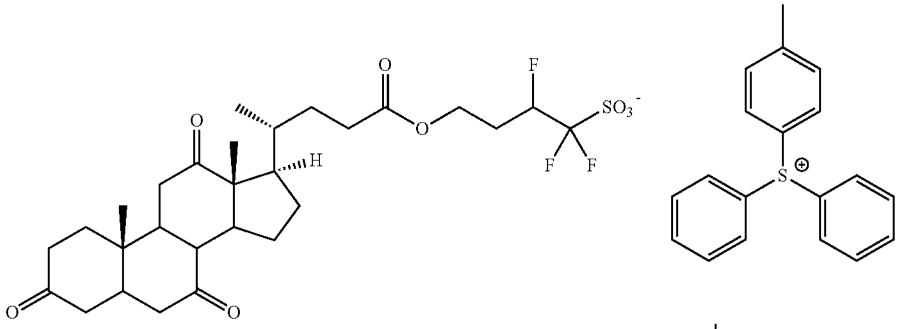

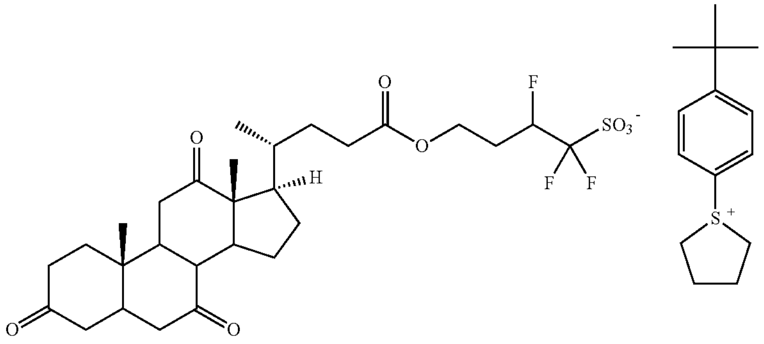

In the resist composition according to the embodiment, one kind of the component (B1) may be used singly or two or more kinds of the component (B1) may be used at the same time.

In the resist composition according to the embodiment, it is preferable that the content of the component (B1) be 5 to 40 parts by mass with respect to 100 parts by mass of the component (A), more preferably 5 to 30 parts by mass, and further preferably 5 to 25 parts by mass.

In the case where the content of the component (B1) is larger than or equal to the lower limit value of the above preferable range, lithography properties such as sensitivity and CDU in resist pattern formation are improved further. On the other hand, in the case where the content of the component (B1) is lower than or equal to the upper limit of the above preferable range, a uniform solution can be obtained easily when the individual components of the resist composition are dissolved in an organic solvent and the storage stability of the resist composition is increased further.

The component (B1) can be manufactured by a known method. For example, the component (B1) can be obtained by causing a fluoro-hydroxyalkylsulfonate salt to react with cholic acid, ursodeoxycholic acid, lithocholic acid, or a derivative of one of them, and then causing Xha·$(M^{m+})_{1/m}$ (Xha: halogen atom) to react with a resulting reaction product.

About Component (B2):

The resist composition according to the embodiment may contain an acid generator component (hereinafter referred to as a "component (B2)") other than the component (B1), within the range of not impairing the effect of the present invention.

There are no particular limitations on the component (B2), and substances that have been proposed so far as acid generators for chemically amplified resist compositions can be used.

Such acid generators include many kinds of examples, such as an onium salt acid generator such as an iodonium salt one and a sulfonium salt one; an oximesulfonate acid generator; a diazomethane acid generator such as bisalkyl or bisarylsulfonyl diazomethanes and poly(bissulfonyl) diazomethanes; a nitrobenzil sulfonate acid generator; an iminosulfonate acid generator; and a disulfonate acid generator.

In the resist composition according to the embodiment, one kind of the component (B2) may be used singly or two or more kinds of the component (B2) may be used in combination.

In the case where the resist composition contains the component (B2), it is preferable that in the resist composition the content of the component (B2) be 50 parts by mass or lower with respect to 100 parts by mass of the component (A), more preferably 1 to 40 parts by mass, and further preferably 5 to 30 parts by mass.

In the case where the content of the component (B2) is in the above range, pattern formation can be performed satisfactorily. Furthermore, a uniform solution can be obtained easily when the individual components of the resist composition are dissolved in an organic solvent and the storage stability of the resist composition is increased further, which is preferable.

<Optional Components>

The resist composition according to the embodiment may further contain a component(s) (optional component(s)) other than the above-described component (A) and component (B). Examples of such an optional component include a component (D), a component (E), a component (F) and a component (S) to be described below.

<<Component (D)>>

The resist composition according to the embodiment may further contain a base component (hereinafter referred to as a "component (D)") in addition to the component (A) and the component (B). The component (D) functions as a quencher (acid diffusion control agent) for trapping an acid generated by exposure in the resist composition.

The component (D) may be either a photodegradable base (D1) (hereinafter referred to as a "component (D1)") that loses acid diffusion controllability by being decomposed by exposure, or a nitrogen-containing organic component (D2) (hereinafter referred to as a "component (D2)") that does not fall under the category of the component (D1).

In the case where the resist composition contains the component (D), when a resist pattern is formed, the contrast between exposed portions and unexposed portions of a resist film can be increased.

About Component (D1):

In the case where the resist composition contains the component (D1), when a resist pattern is formed, the contrast between exposed portions and unexposed portions of a resist film can be increased.

There are no particular limitations on the component (D1) except that it should lose the acid diffusion controllability by being decomposed by exposure, and is preferably at least one compound selected from the group consisting of a compound (hereinafter referred to as a "component (d1-1)") represented by the following general formula (d1-1), a compound (hereinafter referred to as a "component (d1-2)") represented by the following general formula (d1-2), and a compound (hereinafter referred to as a "component (d1-3)") represented by the following general formula (d1-3).

The component (d1-1) to the component (d1-3) do not function as a quencher in exposed portions of a resist film because they lose the acid diffusion controllability by being decomposed there, and functions as a quencher in unexposed portions of the resist film.

(d1-1)

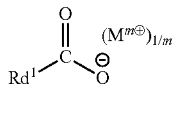

(d1-2)

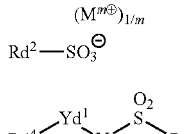

(d1-3)

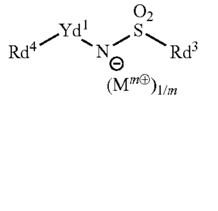

In the above formulae, each of $Rd^1$ to $Rd^4$ represents a cyclic group that may include a substituent, a chain alkyl group that may include a substituent, or a chain alkenyl group that may include a substituent. However, in the formula (d1-2), in $Rd^2$ no fluorine atom is connected to the carbon atom, adjacent to the S atom, of $Rd^2$. Yd' is a single bond or a divalent linking group. Character m is an integer of 1 or larger, and $M^{m+}$'s represent an m-valent organic cation independently of each other.

{Component (d1-1)}

Anion Portion:

In the formula (d1-1), $Rd^1$ represents a cyclic group that may include a substituent, a chain alkyl group that may include a substituent, or a chain alkenyl group that may include a substituent. Examples of each of them are the same as the above-mentioned examples of $R'^{201}$.

Among these examples, $Rd^1$ is preferably an aromatic hydrocarbon group that may include a substituent, an aliphatic cyclic group that may include a substituent, or a chain alkyl group that may include a substituent. Examples of the substituents that may be included in these groups include a hydroxyl group, an oxo group, an alkyl group, an aryl group, a fluorine atom, a fluorinated alkyl group, a lactone-containing cyclic group, an ether bond, an ester bond, and combinations thereof. In the case where an ether bond or an ester bond is included as the substituent, an alkylene group may be interposed in which case the substituent is preferably a linking group represented by one of the above-described formulae (y-a1-1) to (y-a1-5).

Preferable examples of the aromatic hydrocarbon group include a phenyl group, a naphthyl group, and a polycyclic structure including a bicyclooctane framework (i.e., a polycyclic structure consisting of a bicyclooctane framework and another or other ring structures).

Preferable examples of the aliphatic cyclic group include groups obtained by removing one or more hydrogen atoms from a polycycloalkane such as adamantane, norbornane, isobornane, tricyclodecane and tetracyclododecane.

It is preferable that the carbon atom number of the chain alkyl group be 1 to 10. Specific examples include linear alkyl groups such as a methyl group, an ethyl group, a propyl group, a butyl group, a pentyl group, a hexyl group, an heptyl group, an octyl group, a nonyl group and a decyl group; and branched alkyl groups such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

In the case where the chain alkyl group is a fluorinated alkyl group having a fluorine atom or a fluorinated alkyl group as a substituent, it is preferable that the carbon atom number of the fluorinated alkyl group be 1 to 11, more preferably 1 to 8, and further preferably 1 to 4. The fluorinated alkyl group may include an atom other than a fluorine atom. Examples of the atom other than a fluorine atom include an oxygen atom, a sulfur atom and a nitrogen atom.

It is preferable that $Rd_1$ be a fluorinated alkyl group obtained by replacing all or part of the hydrogen atoms constituting a linear alkyl group with a fluorine atom, particularly preferably a fluorinated alkyl group (linear perfluoroalkyl group) obtained by replacing all of the hydrogen atoms constituting a linear alkyl group.

Preferable examples of the anion portion of the component (d1-1) will be shown below:

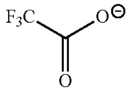
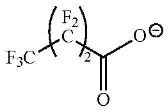
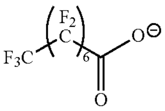
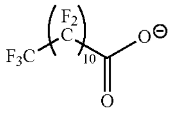
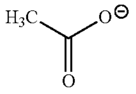
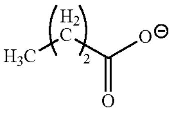
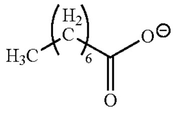
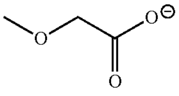
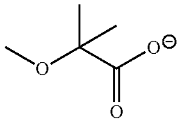
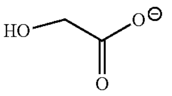
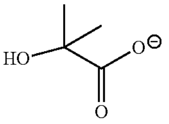
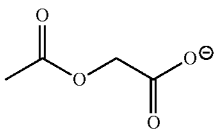
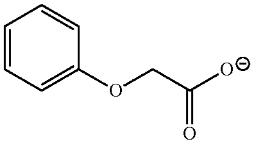
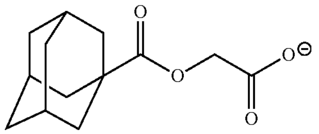
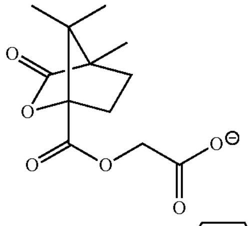
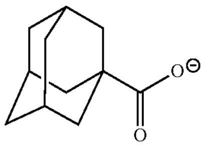
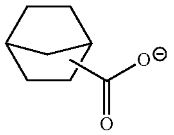
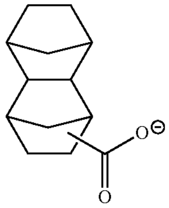
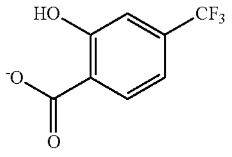
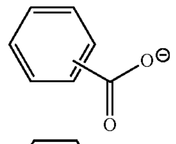
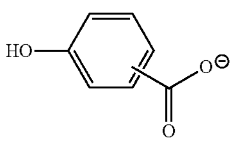
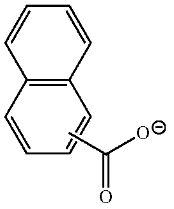
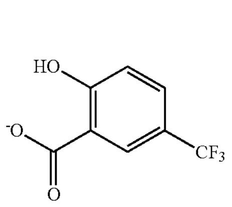
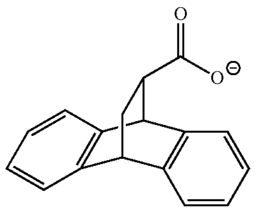

-continued

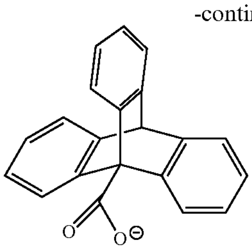

Cation Portion:

In the formula (d1-1), $M^{m+}$ represents an m-valent organic cation. Preferable examples of the organic cation represented by $M^{m+}$ are the same as the above-mentioned examples of the cation represented by one of the above-described general formulae (ca-1) to (ca-3), more preferably the cations represented by the general formula (ca-1) and further preferably the cation represented by one of the above-described formulae (ca-1-1) to (ca 67).

One kind of the component (d1-1) may be used singly or two or more kinds of the component (d1-1) may be used in combination.

{Component (d1-2)}

Anion Portion:

In the formula (d1-2), $Rd^2$ represents a cyclic group that may include a substituent, a chain alkyl group that may include a substituent, or a chain alkenyl group that may include a substituent. Examples of each of them are the same as the above-mentioned examples of $R'^{201}$.

However, no fluorine atom is connected to the carbon atom, adjacent to the S atom, of $Rd^2$ (i.e., fluorine substitution is not made). As a result, the anion of the component (d1-2) becomes a properly weak acidity anion, whereby the quenching ability of the component (D) is enhanced.

It is preferable that $Rd^2$ be a chain alkyl group that may include a substituent or an aliphatic cyclic group that may include a substituent. It is preferable that the carbon atom number of the chain alkyl group be 1 to 10, more preferably 3 to 10. Preferable examples of the aliphatic cyclic group include groups (they may include a substituent) obtained by removing one or more hydrogen atoms from adamantane, norbornane, isobomane, tricyclodecane, tetracyclododecane, or the like; and groups obtained by removing one or more hydrogen atoms from camphor or the like.

A hydrocarbon group of $Rd^2$ may include a substituent, examples of which are the same as the above-mentioned examples of the substituents that the hydrocarbon group (aromatic hydrocarbon group, aliphatic cyclic group, or chain alkyl group) of $Rd^1$ in the above-described formula (d1-1) may include.

Preferable examples of the anion portion of the component (d1-2) will be shown below.

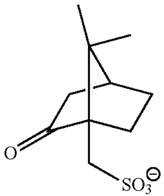
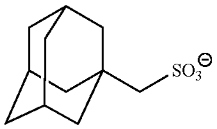
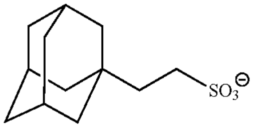

-continued

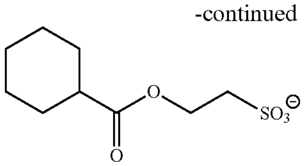

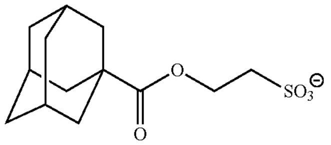

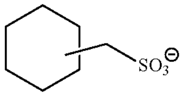

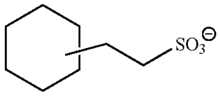

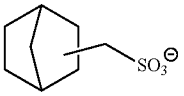

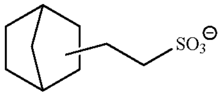

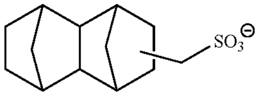

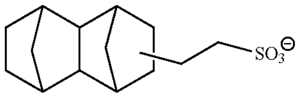

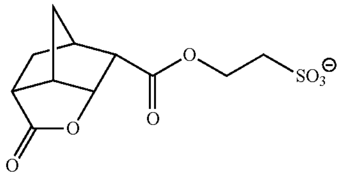

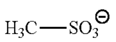

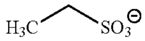

$C_aH_{2a+1}SO_3^-$
(a = 3~10)

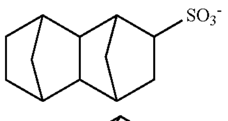

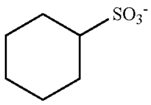

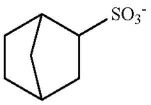

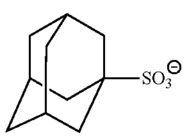

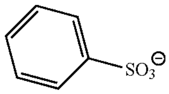

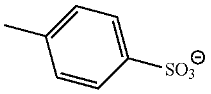

Cation Portion:

In the formula (d1-2), $M'^{m+}$ represents an m-valent organic cation, examples of which are the same as the examples of $M'^{m+}$ in the above-described formula (d1-1).

One kind of the component (d1-2) may be used singly or two or more kinds of the component (d1-2) may be used in combination.

{Component (d1-3)}

Anion Portion:

In the formula (d1-3), $Rd^3$ represents a cyclic group that may include a substituent, a chain alkyl group that may include a substituent, or a chain alkenyl group that may include a substituent. Examples of each of them are the same as the above-mentioned examples of $R'^{201}$, preferably a cyclic group including a fluorine atom, chain alkyl group including a fluorine atom, or chain alkenyl group including a fluorine atom. Among these examples, a fluorinated alkyl group is preferable and the above-mentioned examples of the fluorinated alkyl group of $Rd^1$ are more preferable.

In the formula (d1-3), $Rd^4$ represents a cyclic group that may include a substituent, a chain alkyl group that may include a substituent, or a chain alkenyl group that may include a substituent. Examples of each of them are the same as the above-mentioned examples of $R'^{201}$. Among these examples, an alkyl group that may include a substituent, an alkoxy group that may include a substituent, an alkenyl group that may include a substituent and a cyclic group that may include a substituent are preferable.

It is preferable that the alkyl group represented by $Rd^4$ be a linear or branched alkyl group having a carbon atom number of 1 to 5, specific examples of which include a methyl group, an ethyl group, a propyl group, an isopropyl group, an n-butyl group, an isobutyl group, a tert-butyl group, a pentyl group, an isopentyl group and a neopentyl group. Part of the hydrogen atoms of the alkyl group of $Rd^4$ may be substituted by a hydroxyl group, a cyano group, or the like.

It is preferable that the alkoxy group represented by $Rd^4$ be an alkoxy group having a carbon atom number of 1 to 5, specific examples of which include a methoxy group, an ethoxy group, an n-propoxy group, an isopropoxy group, an n-butoxy group and a tert-butoxy group, among which a methoxy group and an ethoxy group are preferable.

Examples of the alkenyl group represented by $Rd^4$ are the same as the above-mentioned examples of the alkenyl group of $R'^{201}$, among which a vinyl group, a propenyl group (aryl group), a 1-methylpropenyl group and a 2-methylpropenyl group are preferable. These groups may further include, as a substituent, an alkyl group having a carbon atom number of 1 to 5 or an alkyl halide group having a carbon atom number of 1 to 5.

Examples of the cyclic group represented by $Rd^4$ are the same as the above-mentioned examples of the cyclic group of $R'^{201}$, among which an alicyclic group obtained by removing one or more hydrogen atoms from a cycloalkane such as cyclopentane, cyclohexane, adamantane, norbornane, isobornane, tricyclodecane and tetracyclododecane, and an aromatic group such as a phenyl group and a naphthyl group are preferable. In the case where $Rd^4$ represents an alicyclic group, good lithography properties are obtained because the resist composition dissolves well in an organic solvent. In the case where $Rd^4$ represents an aromatic group, the resist composition is so high in light absorption efficiency that a high sensitivity and good lithography properties are obtained in lithography using EUV or the like as light for exposure.

In the formula (d1-3), $Yd^1$ represents a single bond or a divalent linking group. Although there are no particular limitations on the divalent linking group of $Yd^1$, examples of which include a divalent hydrocarbon group (e.g., aliphatic hydrocarbon group and an aromatic hydrocarbon group) that may include a substituent and a divalent linking group including a hetero atom.

Examples of these are the same as the above-mentioned examples of the divalent hydrocarbon groups that may include a substituent and the divalent linking groups including a hetero atom that were mentioned in the description of the divalent linking group of L in the above-mentioned general formula (a-2-1).

It is preferable that $Yd^1$ represent a carbonyl group, an ester bond, an amide bond, an alkylene group, or a combination thereof. Preferable examples of the alkylene group include a linear alkylene group and a branched alkylene group, more preferably a methylene group and a methylene group.

Preferable specific examples of the anion portion of the component (d1-3) will be shown below.

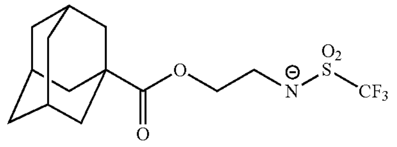
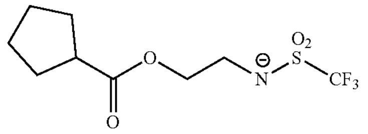
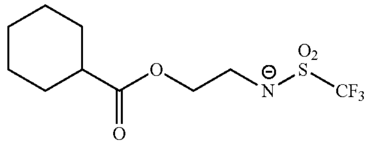
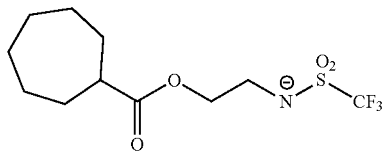
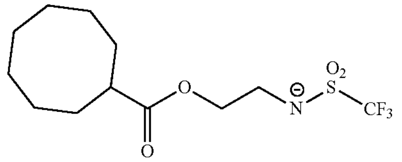
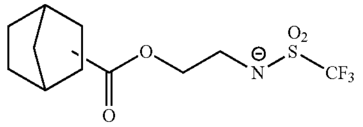
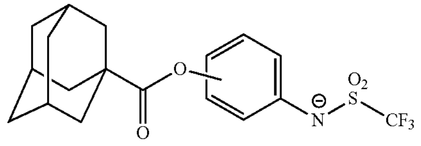
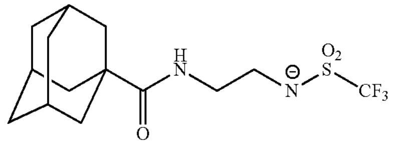
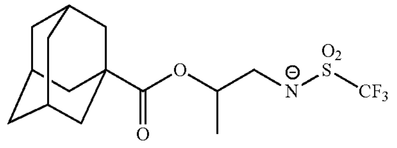
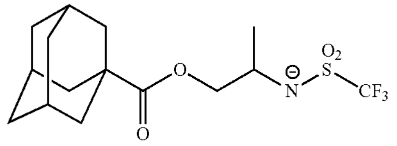
-continued
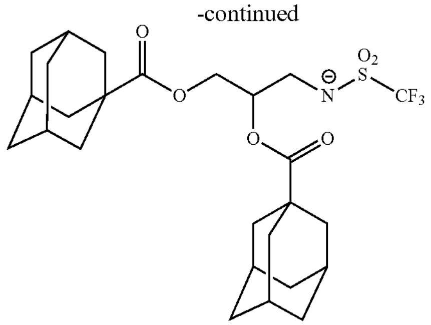
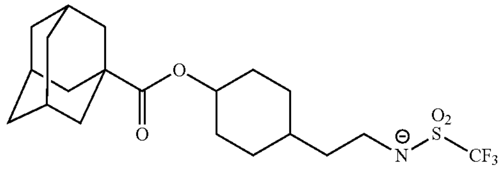
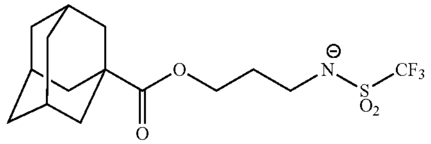
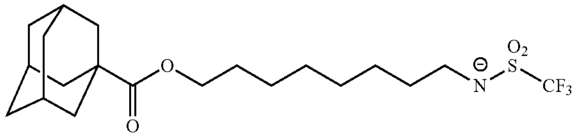
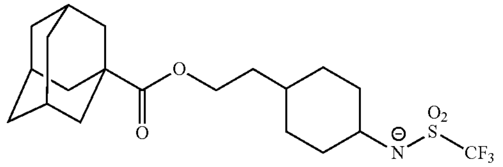
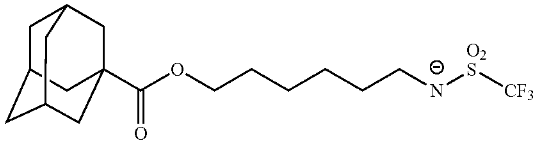
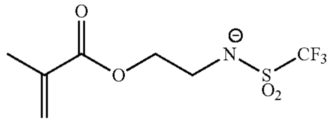
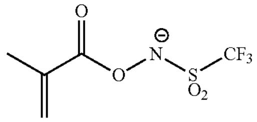
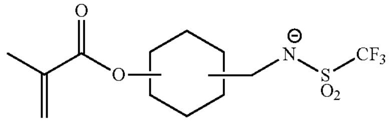
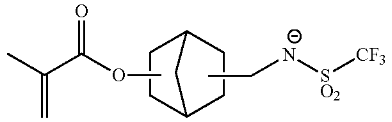
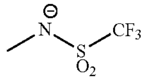
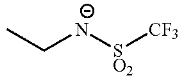

-continued

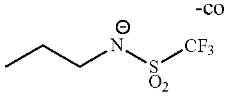

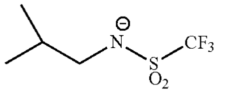

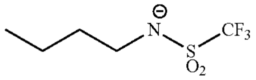

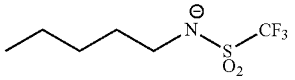

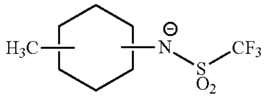

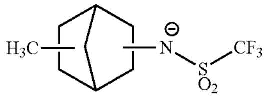

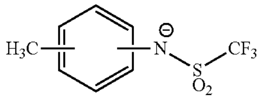

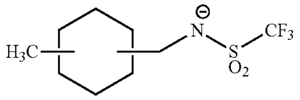

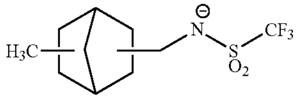

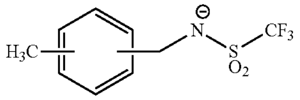

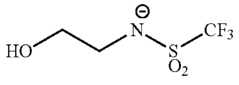

Cation Portion:

In the formula (d1-3), $M^{m+}$ represents an m-valent organic cation, examples of which are the same as the above-mentioned examples of $M^{m+}$ in the above-described formula (d1-1).

One kind of the component (d1-3) may be used singly or two or more kinds of the component (d1-3) may be used in combination.

The component (D1) may be either one kind of the above-described component (d1-1) to the above-described component (d1-3) or two or more kinds of them used in combination.

In the case where the resist composition contains the component (D1), it is preferable that the content of the component (D1) in the resist composition be 0.5 to 20 parts by mass with respect to 100 parts by mass of the component (A), more preferably 1 to 15 parts by mass, and further preferably 2.5 to 10 parts by mass.

In the case where the content of the component (D1) is larger than or equal to the preferable lower limit value, particularly good lithography properties and resist pattern shapes can be obtained easily. On the other hand, in the case where the content of the component (D1) is less than or equal to the preferable upper limit, the sensitivity can be kept high and a large throughput can be obtained.

Method of Manufacturing Component (D1):

There are no particular limitations on the methods of manufacturing the above-described component (d1-1) and component (d1-2) and they can be manufactured by known methods.

There are no particular limitations on the method of manufacturing the above-described component (d1-3); for example, it can be manufactured in the same manner as described in US 2012-0149916.

About Component (D2):

The component (D) may contain, as an acid diffusion control agent component, a nitrogen-containing organic compound component (hereinafter referred to as a "component (D2)") that does not fall under the category of the component (D1).

There are no particular limitations on the component (D2) except that it should function as an acid diffusion control agent and does not fall under the category of the component (D1); a desired one may be selected from known ones. Among such candidates, an aliphatic amine is preferable, more preferably a secondary aliphatic amine and a tertiary aliphatic amine.

The aliphatic amine means an amine having one or more aliphatic groups. It is preferable that the carbon atom number of each aliphatic group be 1 to 12.

Examples of the aliphatic amine include a cyclic amine and an amine (alkylamine or alkyl alcohol amine) obtained by replacing at least one of the hydrogen atoms of ammonia $NH_3$ by an alkyl group that has a carbon atom number of 12 or smaller or a hydroxyalkyl group that has a carbon atom number of 12 or smaller.

Specific examples of the alkylamine and the alkyl alcohol amine include a monoalkylamine such as n-hexyl amine, n-heptylamine, n-octyl amine, n-nonylamine and n-decylamine; a dialkylamine such as diethylamine, di-n-propylamine, di-n-heptylamine, di-n-octylamine and dicyclohexylamine; a trialkylamine such as trymethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine; and an alkyl alcohol amine such as diethanolamine, triethanolamine, diisopropanolamine, triisopropanolamine, di-n-octanolamine and tri-n-octanolamine Among these examples, a trialkylamine having a carbon atom number 6 to 30 is preferable and tri-n-pentylamine and tri-n-hexylamine are particularly preferable.

Examples of the cyclic amine include a heterocyclic compound including a nitrogen atom as a hetero atom. The heterocyclic compound may be either a monocyclic one (aliphatic monocyclic amine) or a polycyclic one (aliphatic polycyclic amine)

Specific examples of the aliphatic monocyclic amine include piperidine and piperazine.

It is preferable that the aliphatic polycyclic amine be one having a carbon atom number of 6 to 10, specific examples of which include 1, 5-diazabicyclo[4.3.0]-5-nonene, 1, 8-diazabicyclo[5.4.0]-7-undecene, hexamethylenetetramine and 1, 4-diazabicyclo[2. 2. 2]-octane.

Other examples of the aliphatic amine include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris{2-[2-(2-hydroxyethoxy)ethoxy]ethyl}amine and triethanolamine triacetate, among which triethanolamine triacetate is preferable.

An aromatic amine may also be used as the component (D2). Examples of the aromatic amine include 4-dimethylaminopyridine, pyrrole, indole, pyrazole, imidazole, their derivatives, tribenzylamine, 2, 6-diisopropylaniline and N-(tert-butoxycarbonyl)pyrrolidine.

One kind of the component (D2) may be used singly or two or more kinds of the component (D2) may be used in combination.

In the case where the resist composition contains the component (D2), the content of the component (D2) in the resist composition is usually set in a range of 0.01 to 5 parts by mass with respect to 100 parts by mass of the component (A). In the case where the content of the component (D2) is set in this range, the resist pattern shapes, the post-exposure storage stability, etc. are improved or increased.

<<Component (E): At Least One Kind of Compound Selected from the Group Consisting of an Organic Carboxylic Acid, and an Oxo-Acid of Phosphorus and its Derivative>>

For the purposes of preventing sensitivity reduction and improving or increasing the resist pattern shapes, the post-exposure storage stability, etc., the resist composition according to the embodiment may contain, as an optional component, at least one kind of compound (E) (hereinafter referred to as a "component (E)") selected from the group consisting of an organic carboxylic acid, and an oxo-acid of phosphorus and its derivative.

Preferable examples of the organic carboxylic acid include acetic acid, malonic acid, citric acid, malic acid, succinic acid, benzoic acid, hydroxy benzoic acid, salicylic acid, phthalic acid, terephthalic acid and isophthalic acid.

Examples of the oxo-acid of phosphorus include phosphoric acid, phosphonic acid and phosphinic acid, among which phosphonic acid is particularly preferable.

Examples of the derivative of the oxo-acid of phosphorus include an ester obtained by replacing a hydrogen atom of the oxo-acid with a hydrocarbon group, and examples of the hydrocarbon group include an alkyl group having a carbon atom number of 1 to 5 and an aryl group having a carbon atom number of 6 to 15.

Examples of the derivative of phosphoric acid include a phosphate ester such as di-n-butyl phosphate ester and di-phenyl phosphate ester.

Examples of the derivative of phosphonic acid include a phosphonic acid ester such as phosphonic acid dimethyl ester, phosphonic acid-di-n-butyl ester, phenylphosphonic acid, phosphonic acid diphenyl ester, and phosphonic acid dibenzyl ester.

Examples of the derivative of phosphinic acid include phosphinic acid ester and phenylphosphonic acid.

Among the above examples of the component (E), an organic carboxylic acid is preferable, more preferably an aromatic carboxylic acid. More specifically, benzoic acid, hydroxy benzoic acid, salicylic acid, phthalic acid, terephthalic acid, and isophthalic acid are preferable, more preferably salicylic acid.

In the resist composition according to the embodiment, one kind of the component (E) may be used singly or two or more kinds of the component (E) may be used in combination.

In the case where the resist composition contains the component (E), it is preferable that the content of the component (E) be 0.01 to 5 parts by mass with respect to 100 parts by mass of the component (A), more preferably 0.1 to 5 parts by mass, and further preferably 0.1 to 3 parts by mass.

<<Component (F): Fluorine Additive Component>>

The resist composition according to the embodiment may contain a fluorine additive component (hereinafter referred to as a "component (F)") as a hydrophobic resin.

The component (F) is used for giving water repellency to a resist film and improves the lithography properties by being used as a resin that is different from the component (A).

Fluorine-containing polymer compounds described in, for example, JP-A-2010-002870, JP-A-2010-032994, JP-A-2010-277043, JP-A-2011-13569 and JP-A-2011-128226 can be used as the component (F).

More specific examples of the component (F) include a polymer containing a constituent (f11) represented by the following general formula (f1-1) and a polymer containing a constituent (f12) represented by the following general formula (f1-2).

Preferable examples of the polymer containing the constituent (f11) represented by the following general formula (f1-1) include a polymer (homopolymer) that is made up of only the constituent (f11) represented by the following general formula (f1-1), a copolymer of the constituent (f11) and the above-described constituent (a3), and a copolymer of the constituent (f11), a constituent derived from acrylic acid or methacrylic acid, and the above-described constituent (a3). It is preferable that the constituent (a3) to be copolymerized with the constituent (f11) be a constituent containing the acid-dissociable group represented by the above-described formula (a3-r-2).

Examples of the polymer containing the constituent (f12) represented by the following general formula (f1-2) include a polymer (homopolymer) that is made up of only the constituent (f12) represented by the following general formula (f1-2), and a copolymer of the constituent (f12) and the above-described constituent (a3), between which the copolymer of the constituent (f12) and the above-described constituent (a3) is preferable.

(f1-1)

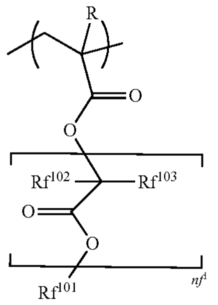

(f1-2)

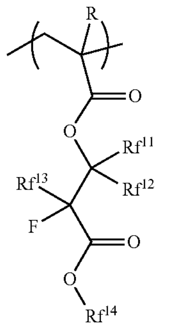

In these formulae, R are the same as mentioned above. $Rf^{102}$ and $Rf^{103}$ represent, independently of each other, a hydrogen atom, a halogen atom, an alkyl group having a carbon atom number of 1 to 5, or an alkyl halide group having a carbon atom number of 1 to 5, and may be the same or different from each other. Symbol "$nf^1$" represents an integer of 0 to 5 and $Rf^{101}$ represents an organic group including a fluorine atom. $Rf^{11}$ and $Rf^{12}$ represent, independently of each other, a hydrogen atom, an alkyl group having a carbon atom number of 1 to 4, or a fluorinated alkyl group having a carbon atom number of 1 to 4. $Rf^{13}$ represents a fluorine atom or a fluorinated alkyl group having a carbon atom number of 1 to 4. $Rf^{14}$ represents a linear or branched alkyl group having a carbon atom number of 1 to 4 or a linear fluorinated alkyl group having a carbon atom number of 1 to 4.

In the general formula (f1-1), R that is connected to the α-position carbon atom are the same as mentioned above. It is preferable that R be a hydrogen atom or a methyl group.

In the general formula (f1-1), examples of the halogen atom of $Rf^{102}$ and $Rf^{103}$ include a fluorine atom, a chlorine atom, a bromine atom and an iodine atom, among which a fluorine atom is particularly preferable. Examples of the alkyl group having a carbon atom number of 1 to 5 of $Rf^{102}$ and $Rf^{103}$ are the same as the above-mentioned examples of the alkyl group having a carbon atom number of 1 to 5 of R, among which a methyl group and an ethyl group are preferable. Specific examples of the alkyl halide group having a carbon atom number of 1 to 5 of $Rf^{102}$ and $Rf^{103}$ include a group obtained by replacing all or part of the hydrogen atoms of an alkyl group having a carbon atom number of 1 to 5 with a halogen atom. Examples of this halogen atom include a fluorine atom, a chlorine atom, a bromine atom and an iodine atom, among which a fluorine atom is particularly preferable. Among the above examples of $Rf^{102}$ and $Rf^{103}$, a hydrogen atom, a fluorine atom, and an alkyl group having a carbon atom number of 1 to 5 are preferable, among which a hydrogen atom, a fluorine atom, and a methyl group and an ethyl group are particularly preferable.

In the general formula (f1-1), $Rf^{101}$ represents an integer of 1 to 5, preferably an integer of 1 to 3, and more preferably 1 or 2.

In the general formula (f1-1), $Rf^{101}$ represents an organic group including a fluorine atom, preferably a hydrocarbon group including a fluorine atom.

The hydrocarbon group including a fluorine atom may be any of a linear one, a branched one and a cyclic one. It is preferable that its carbon atom number be 1 to 20, more preferably 1 to 15, and particularly preferably 1 to 10.

It is preferable that the hydrocarbon group including a fluorine atom be such that 25% or more of the hydrogen atoms of the hydrocarbon group be fluorinated, more preferably 50% or more. It is particularly preferable that 60% or more of the hydrogen atoms be fluorinated because this increases the hydrophobicity of a resist film at the time of immersion exposure.

Among the above examples of $Rf^{101}$, a fluorinated hydrocarbon group having a carbon atom number of 1 to 6 is more preferable, further preferably a trifluoromethyl group, $—CH_2—CF_3$, $—CH_2—CF_2—CF_3$, $—CH(CF_3)_2$, $—CH_2—CH_2—CF_3$, $—CH_2—CH_2—CF_2—CF_2—CF_2—CF_3$, and particularly preferably $—CH_2—CF_3$.

In the general formula (f1-2), R that is connected to the α-position carbon atom are the same as mentioned above. It is preferable that R be a hydrogen atom or a methyl group.

In the general formula (f1-2), $Rf^{11}$ and $Rf^{12}$ represent, independently of each other, a hydrogen atom, an alkyl group having a carbon atom number of 1 to 4, or a fluorinated alkyl group having a carbon atom number of 1 to 4.

The alkyl group having a carbon atom number of 1 to 4 of $Rf^{11}$ and $Rf^{12}$ may be any of a linear one, a branched one and a cyclic one and is preferably a linear alkyl group or a branched alkyl group. More preferable examples include a methyl group and an ethyl group, particularly preferably an ethyl group.

The fluorinated alkyl group having a carbon atom number of 1 to 4 of $Rf^{11}$ and $Rf^{12}$ is a group obtained by replacing all or part of the hydrogen atoms of an alkyl group having a carbon atom number of 1 to 4 with a fluorine atom. In this fluorinated alkyl group, the alkyl group before the replacement with a fluorine atom may be any of a linear one, a branched one and a cyclic one, and examples of such an alkyl group are the same as the above-mentioned examples of the "alkyl group having a carbon atom number of 1 to 4 of $Rf^{11}$ and $Rf^{12}$."

Among the above examples, it is preferable that $Rf^{11}$ and $Rf^{12}$ be a hydrogen atom or an alkyl group having a carbon atom number of 1 to 4 and it is particularly preferable that one of $Rf^{11}$ and $Rf^{12}$ be a hydrogen atom and the other is an alkyl group having a carbon atom number of 1 to 4.

In the general formula (f1-2), $Rf^{13}$ represents a fluorine atom or a fluorinated alkyl group having a carbon atom number of 1 to 4.

Examples of the fluorinated alkyl group having a carbon atom number of 1 to 4 of $Rf^{13}$ are the same as the above-mentioned examples of the "fluorinated alkyl group having a carbon atom number of 1 to 4 of $Rf^{11}$ and $Rf^{12}$" It is preferable that its carbon atom number be 1 to 3, more preferably 1 or 2.

In the fluorinated alkyl group of $Rf^{13}$, it is preferable that the proportion (fluorination ratio (%)) of the number of fluorine atoms in the fluorinated alkyl group to the sum of the number of fluorine atoms and the number of hydrogen atoms be 30% to 100%, more preferably 50% to 100%. The hydrophobicity of a resist film increases as the fluorination ratio becomes larger.

It is preferable that $Rf^{13}$ be a fluorine atom among the above examples.

In the general formula (f1-2), $Rf^{14}$ represents a linear or branched alkyl group having a carbon atom number of 1 to 4 or a linear fluorinated alkyl group having a carbon atom number of 1 to 4, preferably a linear alkyl group having a carbon atom number of 1 to 4 or a linear fluorinated alkyl group having a carbon atom number of 1 to 4.

Specific examples of the alkyl group of $Rf^{14}$ include a methyl group, an ethyl group, a propyl group, an isopropyl group, an n-butyl group, an isobutyl group and a tert-butyl group, among which a methyl group and an ethyl group are preferable, and a methyl group is most preferable.

Preferable examples of the fluorinated alkyl group of $Rf^{14}$ include $CH_2—CF_3$, $—CH_2—CH_2—CF_3$, $—CH_2—CF_2—CF_3$ and $—CH_2—CF_2—CF_2—CF_3$, among which $—CH_2—CH_2—CF_3$ is particularly preferable.

It is preferable that the weight-average molecular weight (Mw, in terms of polystyrene as determined by gel permeation chromatography) of the component (F) be 1,000 to 50,000, more preferably 5,000 to 40,000, and most preferably 10,000 to 30,000. In the case where the weight-average molecular weight is smaller than or equal to the upper limit value of this range, the resist composition according to the embodiment has sufficient solubility in a resist solvent when it is used as a resist. In the case where the weight-average molecular weight Mw is larger than or equal to the lower limit of this range, the resist composition according to the embodiment is high in dry etching resistance and provides good sectional shapes for a resist pattern.

It is preferable that the degree of dispersion (Mw/Mn) of the component (F) be 1.0 to 1.5, more preferably 1.0 to 3.0, and most preferably 1.0 to 2.5.

In the resist composition according to the embodiment, one kind of the component (F) may be used singly or two or more kinds of the component (F) may be used in combination.

In the case where the resist composition contains the component (F), the content of the component (F) is usually set in a range of 0.5 to 10 parts by mass with respect to 100 parts by mass of the component (A).

<<Component (S): Organic Solvent Component>>

The resist composition according to the embodiment can be manufactured by dissolving resist materials in an organic solvent component (hereinafter referred to as a "component (S)").

The component (S) may be a substance capable of dissolving individual components used into a uniform solution, and an optional one of known solvents for a chemically amplified resist composition can be selected and used as appropriate.

Examples of the component (S) include lactones such as γ-butyrolactone; ketones such as acetone, methylethyl ketone, cyclohexane, methyl-n-pentyl ketone, methyl isopentyl ketone, 2-heptanone, ethylene carbonate and propylene carbonate; polyhydric alcohols such as ethylene glycol, diethylene glycol, propylene glycol and dipropylene glycol; compounds having an ester bond such as ethylene glycol monoacetate, diethylene glycol monoacetate, propylene glycol monoacetate and dipropylene glycol monoacetate; derivatives of polyhydric alcohols of, for example, compounds having an ether bond such as monophenyl ethers and monoalkyl ethers, such as monomethyl ether, monoethyl ether, monopropyl ether and monobutyl ether, of the above-mentioned polyhydric alcohols and the above-mentioned compounds having an ester bond (among these examples, propylene glycol monomethyl ether acetate (PGMEA) and propylene glycol monomethyl ether (PGME) are preferable); cyclic esters such as dioxane and esters such as methyl lactate, ethyl lactate (EL), methyl acetate, ethyl acetate, butyl acetate, methyl pyruvate, ethyl pyruvate, methyl ethoxypropionate and ethyl ethoxypropionate; aromatic organic solvents such as anisole, ethyl benzyl ether, cresyl methyl ether, diphenyl ether, dibenzyl ether, phenetole, butyl phenyl ether, ethyl benzene, diethyl benzene, pentylbenzene, isopropyl benzene, toluene, xylene, cymene, and mesitylene; and dimethyl sulfoxide (DMSO).

In the resist composition according to the embodiment, one kind of the component (S) may be used singly or two or more kinds of the component (S) may be used in combination as a mixed solvent.

Among the above examples, PGMEA, PGME, γ-butyrolactone, propylene carbonate, EL and cyclohexane are preferable, and PGMEA, PGME and cyclohexane are more preferable.

A mixed solvent obtained by mixing PGMEA and a polar solvent is also preferable. A mixing ratio (mass ratio) between PGMEA and the polar solvent may be determined as appropriate taking into consideration the compatibility between them. It is preferable that the mixing ratio be 1:9 to 9:1, more preferably 2:8 to 8:2.

More specifically, in the case where EL or cyclohexane is used as a polar solvent, it is preferable that the mass ratio PGMEA:EL or PGMEA:cyclohexane be 1:9 to 9:1, more preferably 2:8 to 8:2. In the case where PGME is used as a polar solvent, it is preferable that the mass ratio PGMEA:PGME be 1:9 to 9:1, more preferably 2:8 to 8:2.

Furthermore, another preferable example of the component (S) includes a mixed solvent of at least one kind selected from the group consisting of PGMEA and EL and at least one kind selected from the group consisting of γ-butyrolactone and propylene carbonate. In this case, as for the mixing ratio, it is preferable that the mass ratio between the former and the latter be 60:40 to 99:1, more preferably 70:30 to 95:5.

There are no particular limitations on the amount of use of the component (S); it is set as appropriate according to an application film thickness with a concentration that enables application to a substrate or the like. In general, the component (S) is used so that the solid material concentration in a resist composition falls within a range of 0.1 to 20 mass %, preferably 0.2 to 15 mass %.

If desired, it is possible to further add, as appropriate, to the resist composition according to the embodiment, a miscible additive(s) such as an additional resin for improving the properties of a resist film, a dissolution inhibitor, a plasticizer, a stabilizer, a colorant, an antihalation agent and a dye.

If necessary, the resist composition according to the embodiment contains, in addition to the above-described component (A) and component (B), one or some of the above-described optional components.

A preferable example includes a resist composition that contains the component (A), the component (B) and the component (D). Another preferable example includes a resist composition that contains the component (A), the component (B), the component (D) and the component (F).

As described above, the resist composition according to the embodiment contains the above-described polymer compound (A1). The polymer compound (A1) has the constituents (a1) and (a2). The fact that the constituent (a1) contains a lactone-containing cyclic group having a particular structure is effective in increasing the adhesion of a resist film to a substrate in the case where the component (A1) is used for formation of the resist film. Furthermore, in an alkali development process, the solubility of a resist film with respect to an alkali developing liquid is increased in development. In addition, since the constituent (a2) includes at least two hydroxyl groups, the diffusion of an acid that is produced by exposure can be controlled more satisfactorily.

The resist composition according to the embodiment further contains, as the acid generator component (B), the compound represented by the above-mentioned general formula (b1). Including a steroid structure, the acid generator represented by the general formula (b1) makes it possible to control, more satisfactorily, the diffusion of an acid that is produced by exposure. It is inferred that, as a result, the resist composition according to the embodiment enables increase in sensitivity and is so high in lithographic properties as to enable formation of a resist pattern having good shapes.

(Resist Pattern Forming Method)

A resist pattern forming method according to a second aspect of the invention is a method including forming a resist film on a support body using the above-described resist composition according to the embodiment; exposing the resist film; and forming a resist pattern by developing the resist film after the exposure.

Examples of the above resist pattern forming method according to the embodiment include a resist pattern forming method that is performed in the following manner First, a resist film is formed by applying a resist composition according to the embodiment to a support body using a spinner or the like and then performing baking (post-apply bake (PAB)) treatment under a temperature condition of, for example, 80° C. to 150° C. for 40 to 120 sec, preferably 50 to 90 sec.

The resist film is then subjected to selective exposure, using an exposing apparatus such as an EUV exposing apparatus and an electron beam drawing apparatus, by exposure via a mask (mask pattern) formed with a prescribed pattern or by exposure without intervention of a mask pattern such as image drawing by direct irradiation with an electron beam. The resist film is thereafter subjected to baking (post-exposure bake (PEB)) treatment under a temperature condition of, for example, 80° C. to 150° C. for 40 to 120 sec, preferably 50 to 90 sec.

The resist film is then subjected to development treatment. The development treatment is performed using an alkali developing liquid in the case of an alkali development process or using a developing liquid (organic developing liquid) containing an organic solvent in the case of a solvent development process.

After the development treatment, rinse treatment is performed preferably. In the case of the alkali development process, a water rinse with pure water is preferable. In the case of the solvent development process, it is preferable to use a rinse liquid containing an organic solvent.

In the case of the solvent development process, treatment of removing developing liquid or rinse liquid sticking to the pattern by a supercritical fluid may be performed after the above-described development treatment or rinse treatment.

Drying is performed after the development treatment or rinse treatment. In a certain situation, baking treatment (post bake) may be performed after the above-described development treatment.

In such a way, a resist pattern can be formed.

There are no particular limitations on the type of the support body and it may be a known one. Examples of the support body include substrates for electronic components and substrates obtained by forming a prescribed wiring pattern on such substrates. More specific examples include a silicon wafer, a substrate made of a metal such as copper, chromium, iron, and aluminum, and a glass substrate. Usable examples of materials of a wiring pattern include copper, aluminum, nickel and gold.

There are no particular limitations on the exposure wavelength; ArF exciter laser light, KrF exciter laser light, F2 excimer laser light, EUV (extreme ultraviolet) light, VUV (vacuum ultraviolet) light, an EB (electron beam), and radiation such as an X-ray and a soft X-ray may be used. The above-described resist composition is highly useful for ArF exciter laser light, KrF exciter laser light, an EB and EUV light.

The method for exposing a resist film may be either ordinary exposure in air or an inert gas such as nitrogen, or exposure of liquid immersion lithography, between which the latter is preferable.

The liquid immersion lithography is an exposing method in which the space between a resist film and a lens, located at the lowest position, of an exposing apparatus is filled in advance with a solvent (liquid immersion medium) that is higher in refractive index than air, and exposure (liquid immersion lithography exposure) is performed in this state.

It is preferable that the liquid immersion medium be a solvent whose refractive index is higher than that of air and lower than that of a resist film to be exposed. There are no particular limitations on the refractive index of such a solvent as long as it is in this range.

Examples of the solvent whose refractive index is higher than that of air and lower than that of a resist film to be exposed include water, a fluorine inert liquid, a silicon solvent and a hydrocarbon solvent.

Water is used preferably as a liquid immersion medium.

Examples of the alkali developing liquid used in development treatment of the alkali development process include an aqueous solution (0.1 to 10 mass %) of tetramethyl ammonium hydroxide (TMAH).

The organic solvent contained in an organic developing liquid used in development treatment of the solvent development process can be any one that can dissolve the component (A) (before exposure), and can be selected as appropriate from known organic solvents. Specific examples include polar solvents such as ketone solvents, ester solvents, alcohol solvents, nitrile solvents, amide solvents and ether solvents, and hydrocarbon solvents.

Ketone solvents are organic solvents having C—C(═O)—C in the structure. Ester solvents are organic solvents having C—C(═O)—O—C in the structure. Alcohol solvents are organic solvents having an alcoholic hydroxyl group in the structure. The term "alcoholic hydroxyl group" means a hydroxyl group that is connected to a carbon atom of an aliphatic hydrocarbon group. Nitrile solvents are organic solvents having a nitrile group in the structure. Amide solvents are organic solvents including an amide group in the structure. Ether solvents are organic solvents including C—O—C in the structure.

Among organic solvents are ones each having, in the structure, plural kinds of functional groups that characterize the solvent. In this case, each such organic solvent is considered to be categorized as any of solvent types including the respective functional groups of the organic solvent. For example, diethyleneglycol monomethyl ether is considered to be categorized as both of the alcohol solvent and the ether solvent among the above-mentioned categories.

Hydrocarbon solvents are ones made up of a hydrocarbon that may be halogenated and not having a substituent other than a halogen atom. Examples of the halogen atom include a fluorine atom, a chlorine atom, a bromine atom and an iodine atom, among which a fluorine atom is preferable.

Among the above examples of the organic solvents contained in an organic developing liquid, polar solvents are preferable, among which ketone solvents, ester solvents, and nitrile solvents are more preferable.

Examples of the ketone solvents include 1-octanone, 2-octanone, 1-nonanone, 2-nonanone, acetone, 4-heptanone, 1-hexanone, 2-hexanone, diisobutyl ketone, cyclohexane, methylcyclohexane, phenyl acetone, methylethyl ketone, methylisobutyl ketone, acetyl acetone, acetonyl acetone, ionone, diacetonyl alcohol, acetyl carbinol, acetophenone, methylnaphthyl ketone, isophorone, propylene carbonate, γ-butyrolactone, methylamyl ketone (2-heptane), among which methylamyl ketone (2-heptane) is preferable.

Examples of the ester solvents include methyl acetate, butyl acetate, ethyl acetate, isopropyl acetate, amyl acetate, isoamyl acetate, methoxy ethyl acetate, ethoxy ethyl acetate, ethyleneglycol monoethyl ether acetate, ethyleneglycol monopropyl ether acetate, ethyleneglycol monobutyl ether acetate, ethyleneglycol monophenyl ether acetate, diethyleneglycol monomethyl ether acetate, diethyleneglycol monopropyl ether acetate, diethyleneglycol monophenyl ether acetate, diethyleneglycol monobutyl ether acetate, diethyleneglycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propooxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, 2-hydroxy methyl propionate, 2-hydroxy ethyl propionate, methyl-3-methoxy propionate, ethyl-3-methoxy propionate, ethyl-3-ethoxy propionate and propyl-3-methoxy propionate, among which butyl acetate is preferable.

Examples of the nitrile solvents include acetonitrile, propionitrile, valeronitrile and butyronitrile.

If necessary, a known additive can be added to an organic developing liquid. Examples of such an additive include a surfactant. There are no particular limitations on the type of the surfactant; for example, ionic or nonionic fluorine and/or silicon surfactants can be used. As the surfactant, nonionic surfactants are preferable, more preferably nonionic fluorine surfactants and nonionic silicon surfactants.

In the case where the surfactant is added, the content of the surfactant with respect to the entire amount of an organic developing liquid is usually 0.001 to 5 mass %, preferably 0.005 to 2 mass %, and more preferably 0.01 to 0.5 mass %.

The development treatment can be performed by a known developing method, examples of which include a method of immersing a support body in a developing liquid for a prescribed time (dip method), a method of heaping up a developing liquid so as to cover the surface of a support body by surface tension and keeping the developing liquid in that state for a prescribed time (puddle method), a method of spraying a developing liquid onto the surface of a support body (spray method), and a method of continuing to discharge a developing liquid onto a support body rotating at a constant speed while scanning a developing liquid discharge nozzle at a constant speed (dynamic dispense method).

For example, an organic solvent that does not tend to dissolve a resist pattern may be selected as appropriate from the above-mentioned examples of the organic solvents for an organic developing liquid, as the organic solvent that is contained in a rinse liquid to be used in rinse treatment that is performed after development treatment in a solvent developing process. Usually, at least one solvent selected from hydrocarbon solvents, ketone solvents, ester solvents, alcohol solvents, amide solvents, and ether solvents is used. Among these examples, it is preferable to use at least one kind of solvent selected from hydrocarbon solvents, ketone solvents, ester solvents, alcohol solvents, and amide solvents, more preferably from ester solvents and alcohol solvents, and particularly preferably from alcohol solvents.

It is preferable that an alcohol solvent used in a rinse liquid be monovalent alcohol having a carbon atom number of 6 to 8 that may be any of a linear one, a branched one and a cyclic one. Specific examples include 1-hexanol, 1-heptanol, 1-octanol, 2-hexanol, 2-heptanol, 2-octanol, 3-hexanol, 3-heptanol, 3-octanol, 4-octanol and benzyl alcohol, among which 1-hexanol, 2-hexanol and 2-heptanol are preferable, and 1-hexanol and 2-hexanol are more preferable.

Among these examples of the organic solvents, one kind may be used singly or two or more kinds may be used in combination. These organic solvents may be used being mixed with another organic solvent or water. However, with development properties taken into consideration, it is preferable that the content of water mixed with a rinse liquid with respect to the entire amount of the rinse liquid be 30 mass % or smaller, more preferably 10 mass % or smaller, further preferably 5 mass % or smaller, and particularly preferably 3 mass % or smaller.

If necessary, a known additive may be mixed with a rinse liquid. Examples of the additive include a surfactant. Examples of the surfactant are the same as mentioned above; a nonionic surfactant is preferable, and a nonionic fluorine surfactant or a nonionic silicon surfactant are more preferable.

In the case where the surfactant is used, the content of the surfactant with respect to the entire amount of a rinse liquid is usually 0.001 to 5 mass %, preferably 0.005 to 2 mass %, and more preferably 0.01 to 0.5 mass %.

Rinse treatment (cleaning treatment) with a rinse liquid can be performed by a known rinse method. Examples of such a rinse treatment method include a method of continuing to discharge a rinse liquid onto a support body rotating at a constant speed (rotary applying method), a method of immersing a support body in a rinse liquid for a prescribed time (dip method), and spraying a rinse liquid onto the surface of a support body (spray method).

It is preferable that the above-described resist composition according to the embodiment and the various materials (e.g., resist solvent, developing liquid, rinse liquid, composition for formation of an antireflection film, and composition for formation of a top coat) used in the pattern forming method according to the embodiment not contain impurities such as a metal, a metal salt containing a halogen, acid, alkali, and a component containing a sulfur atom or a phosphorus atom. Examples of metal-atom-containing impurities include Na, K, Ca, Fe, Cu, Mn, Mg, Al, Cr, Ni, Zn, Ag, Sn, Pb and Li, and their salts. It is preferable that the content of impurities contained in the above materials be 200 ppb or lower, more preferably 1 ppb or lower, further preferably 100 ppt (parts per trillion) or lower, and particularly preferably 10 ppt or lower. It is most preferable that substantially no impurities are contained (i.e., the content is lower than or equal to the detection limit of a measuring instrument).

Returning to the description of the acid generator component (B), it is preferable that in the general formula (b1) $Y^{b1}$ represent a divalent linking group including a hetero atom; it is preferable that in the general formula (b1) $V^{b1}$ represent an ester group, or $Y^{b1}—V^{b1}$ be $Y^{b1}—(CH_2)_n—CHF—$ where n is an integer of 0 to 2.

Furthermore, it is preferable that the acid generator component (B) contains a compound whose anion portion is represented by one of the following general formulae (b-a-1) to (b-a-19) and whose cation portion is represented by the following general formula (ca-1), a compound represented by the following general formula (b1-1), or a compound represented by the following general formula (b1-2):

Anion Portion:
(b-a-1)
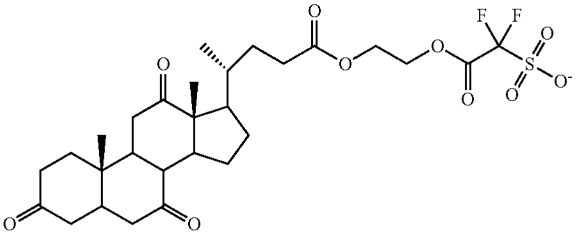
(b-a-2)
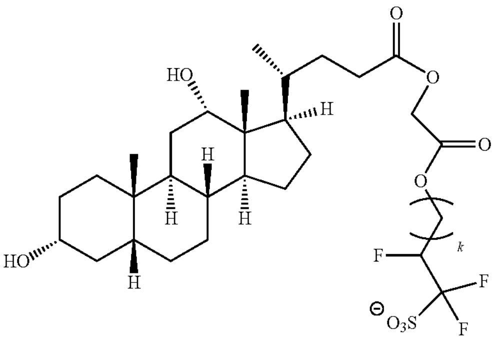
(b-a-3)
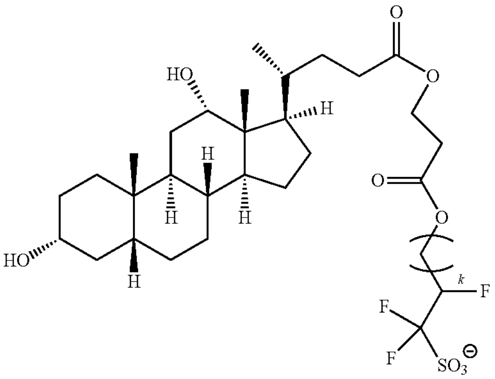
(b-a-4)
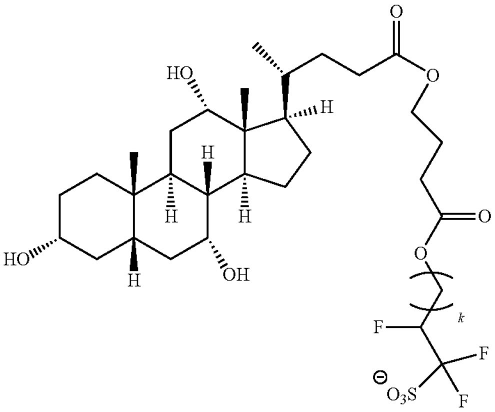
-continued
(b-a-7)
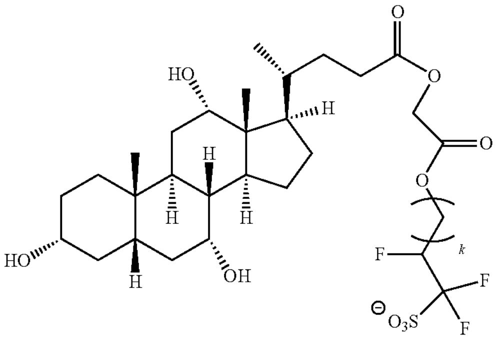
(b-a-6)
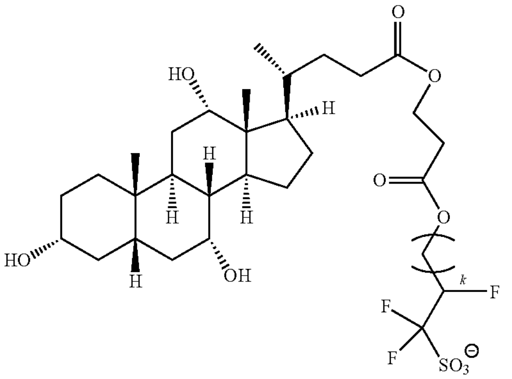
(b-a-5)
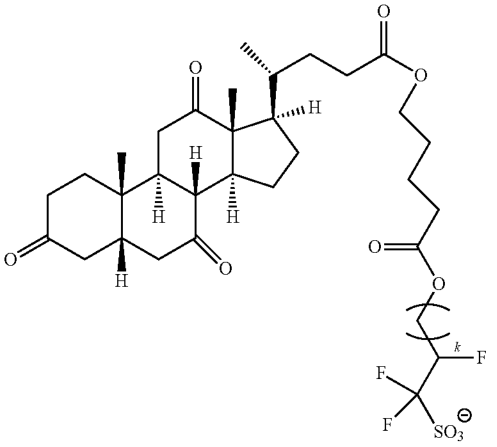
(b-a-8)
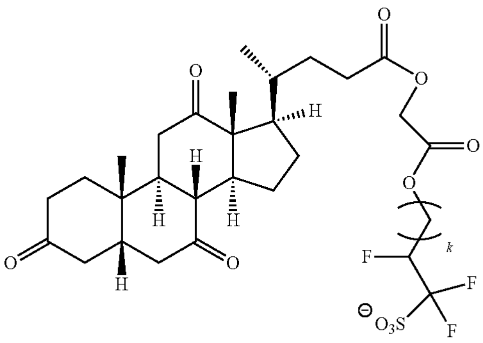

-continued
(b-a-9)
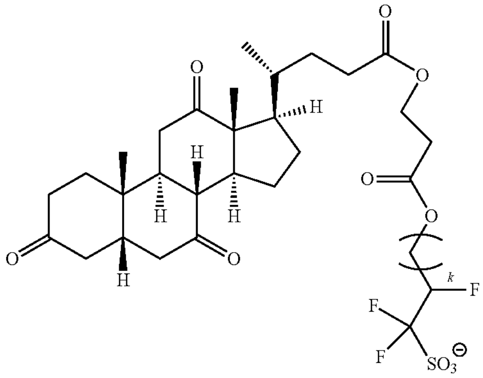
(b-a-10)
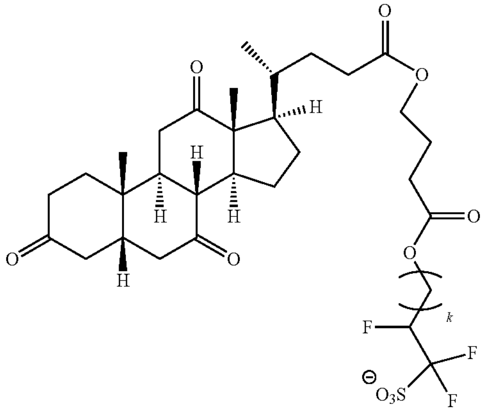
(b-a-11)
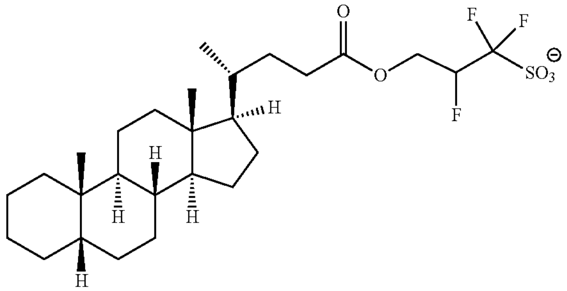
(b-a-12)
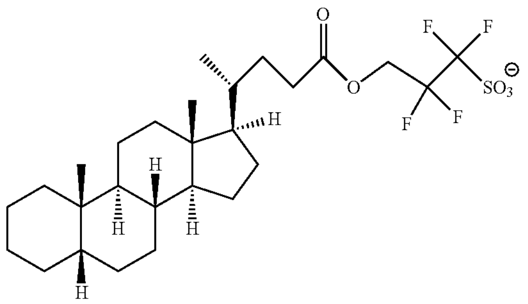
-continued
(b-a-13)
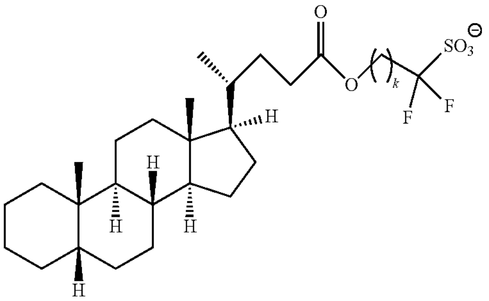
(b-a-14)
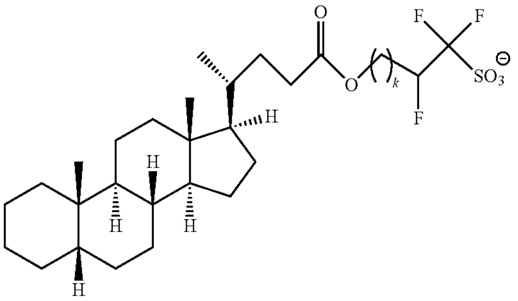
(b-a-15)
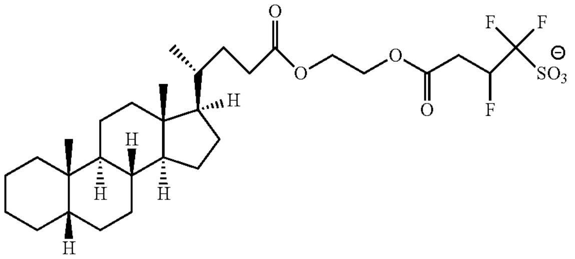
(b-a-16)
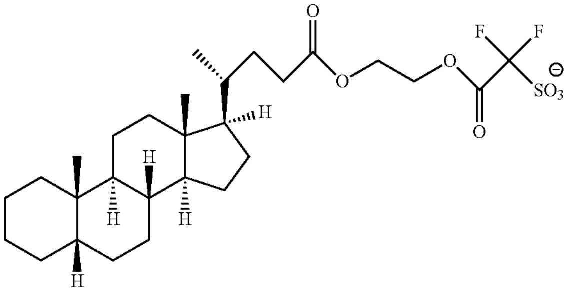
(b-a-17)
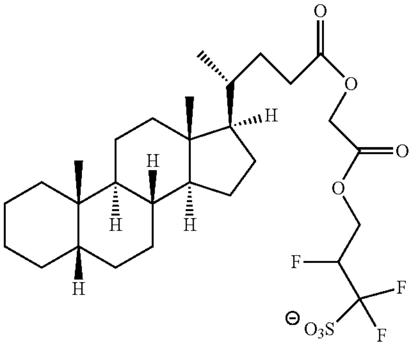

-continued (b-a-18)

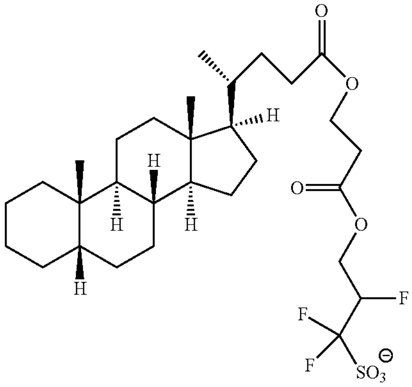

(b-a-19)

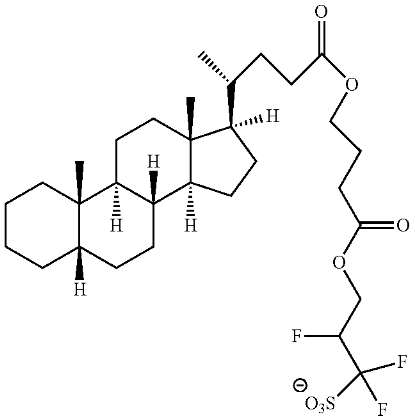

Cation Portion:

(ca-1)

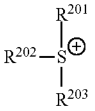

(b1-1)

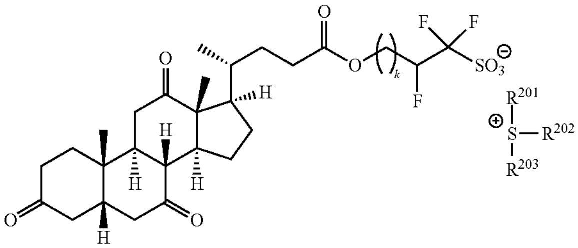

(b1-2)

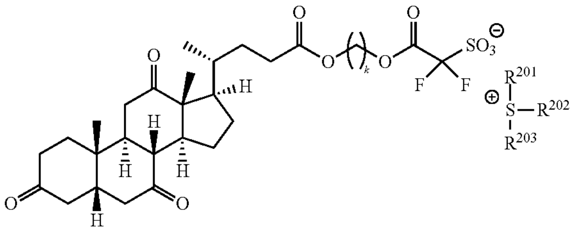

In the above general formulae, k is an integer of 2 to 5, $R^{201}$ to $R^{203}$ represent, independently of each other, an aryl group that may include a substituent, an alkyl group that may include a substituent, or an alkenyl group that may include a substituent, and $R^{201}$ to $R^{203}$ may be connected to each other to form a ring together with the sulfur atom in the general formula (b1-1) or the general formula (b1-2).

The above-described resist pattern forming method according to the embodiment enables increase in sensitivity in forming a resist pattern and is so high in lithographic properties as to enable formation of a resist pattern having good shapes, because the method employs the above-described resist composition according to the embodiment of the invention.

EXAMPLES

The invention will be hereinafter described in more detail using Examples. However, the invention should not be limited by these Examples.

Polymer compounds (A-1) to (A-11) and (A-X1) to (A-X4) having composition ratios shown in Table 1 were synthesized using compounds shown below.

For the thus-obtained polymer compounds, copolymerization composition ratios (i.e., ratios (mole ratios) of constituents of each polymer compound) determined by $^{13}C$-NMR, and standard polystyrene-converted weight-average molecular weights (Mw) and degrees of molecular weight dispersion (Mw/Mn) determined by GPC measurements are also shown in Table 1.

(A-1)

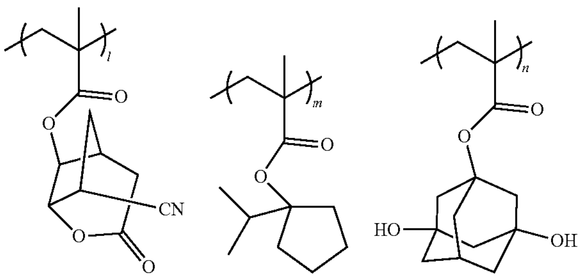

(A-2)

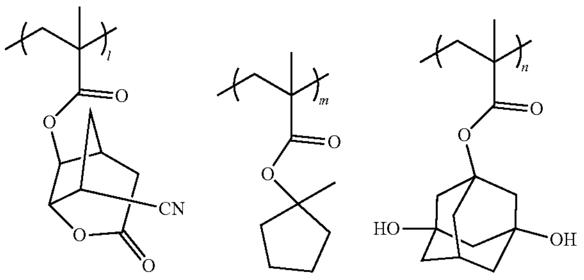

(A-3)

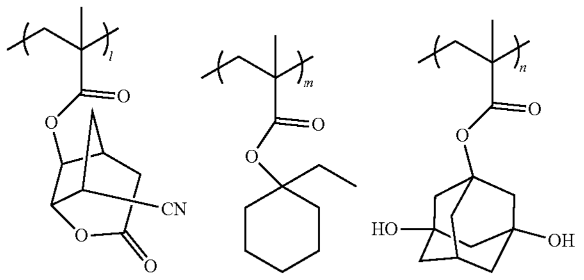

-continued
(A-4)
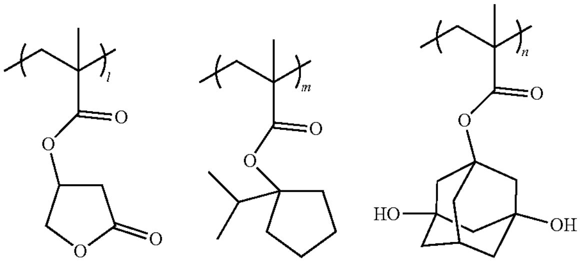
(A-5)
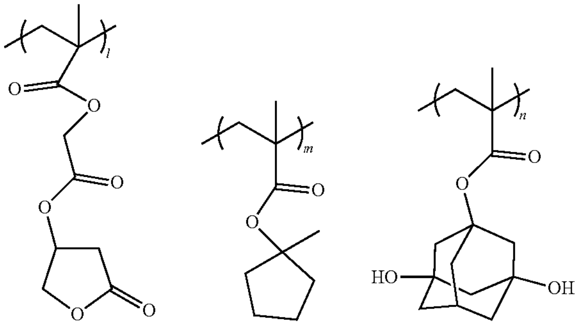
(A-6)
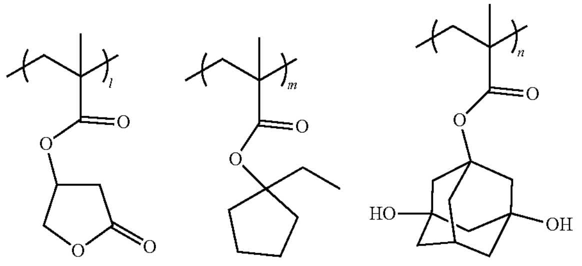
(A-7)
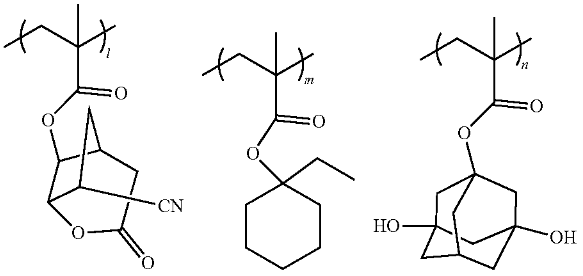
(A-8)
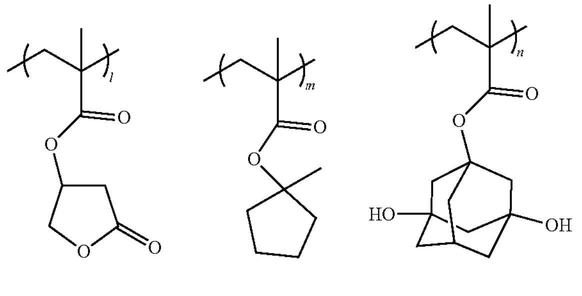
-continued
(A-9)
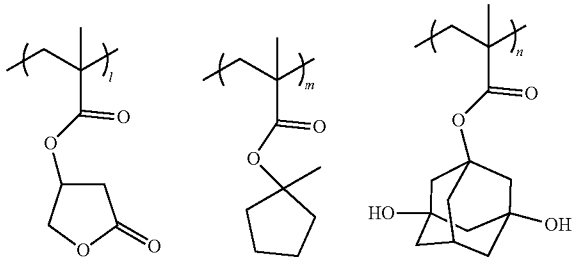
(A-10)
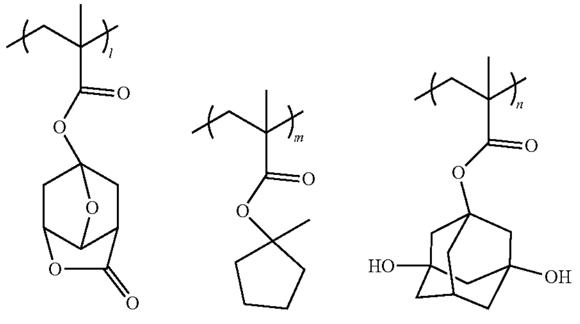
(A-11)
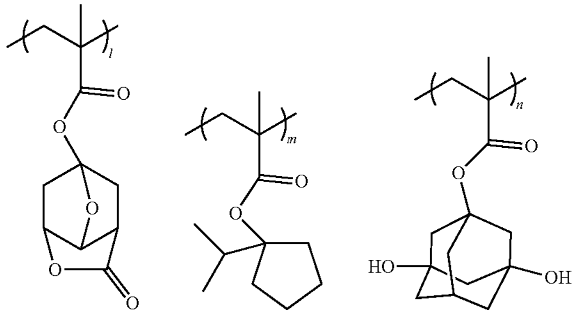
(A-X1)
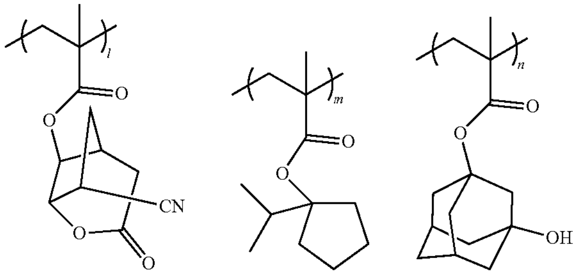
(A-X2)
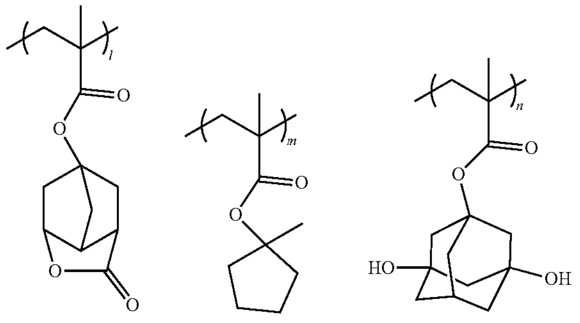

-continued (A-X3)

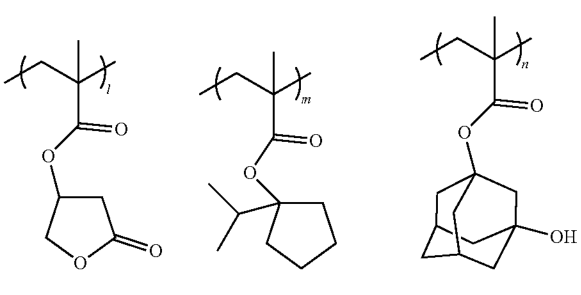

(A-X4)

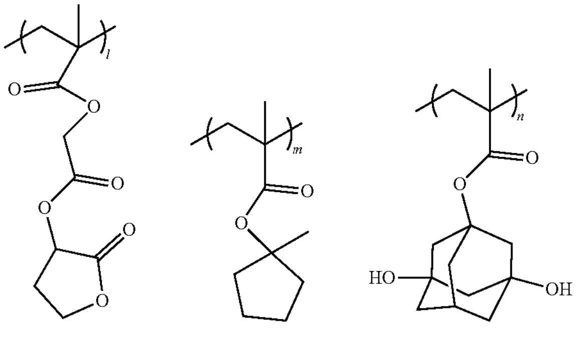

TABLE 1

| Polymer com- pound | Composition ratio l/m/n (mole ratio) | Weight-average molecular weight (Mw) | Degree of molecular weight dispersion (Mw/Mn) |
|---|---|---|---|
| A-1 | 40/50/10 | 11,000 | 1.6 |
| A-2 | 40/50/10 | 11,000 | 1.6 |
| A-3 | 50/40/10 | 11,000 | 1.6 |
| A-4 | 40/50/10 | 11,000 | 1.6 |
| A-5 | 30/60/10 | 11,000 | 1.6 |
| A-6 | 40/50/10 | 11,000 | 1.6 |
| A-7 | 40/50/10 | 11,000 | 1.6 |
| A-8 | 40/50/10 | 11,000 | 1.6 |
| A-9 | 30/60/10 | 11,000 | 1.6 |
| A-10 | 40/50/10 | 11,000 | 1.6 |
| A-11 | 40/50/10 | 11,000 | 1.6 |
| A-X1 | 40/50/10 | 11,000 | 1.6 |
| A-X2 | 40/50/10 | 11,000 | 1.6 |
| A-X3 | 40/50/10 | 11,000 | 1.6 |
| A-X4 | 30/60/10 | 11,000 | 1.6 |

<Preparation of Resist Composition>

Inventive Examples 1-17 and Comparative Examples 1-6

A resist composition (concentration of solid components: 3.5 mass %) of each Example was prepared by dissolving components shown in Table 2 in a solvent S-1.

S-1: A solvent obtained by mixing propylene glycol monomethyl ether acetate (1,750 parts by mass), propylene glycol monomethyl ether (640 parts by mass), and cyclohexane (800 parts by mass)

TABLE 2

| | Component (A) | | Component (B) | | Component (D) | | Component (F) | | | |
|---|---|---|---|---|---|---|---|---|---|---|
| | Resin | Parts by mass | Acid generator | Parts by mass | Acid diffusion control agent | Parts by mass | Hydrophobic resin | Parts by mass | Sensitivity (mJ/cm$^2$) | LWR (nm) |
| Inv. Ex. 1 | A-1 | 100 | B-1 | 10.5 | D-1 | 3.30 | F-1 | 4.4 | 29.2 | 2.20 |
| Inv. Ex. 2 | A-2 | 100 | B-1 | 10.5 | D-2 | 4.08 | F-1 | 4.4 | 25.8 | 2.23 |
| Inv. Ex. 3 | A-3 | 100 | B-1 | 10.5 | D-2 | 4.08 | F-1 | 4.4 | 26.5 | 2.42 |
| Inv. Ex. 4 | A-4 | 100 | B-1 | 10.5 | D-1 | 3.30 | F-1 | 4.4 | 28.3 | 2.55 |
| Inv. Ex. 5 | A-5 | 100 | B-1 | 10.5 | D-1 | 3.30 | F-1 | 4.4 | 28.9 | 2.32 |
| Inv. Ex. 6 | A-3 | 100 | B-2 | 10.6 | D-2 | 4.08 | F-1 | 4.4 | 27.1 | 2.53 |
| Inv. Ex. 7 | A-1 | 100 | B-1 | 10.5 | D-2 | 4.08 | F-1 | 4.4 | 23.8 | 2.50 |
| Inv. Ex. 8 | A-1 | 100 | B-1 | 10.5 | D-3 | 3.93 | F-1 | 4.4 | 29.9 | 2.23 |
| Inv. Ex. 9 | A-2 | 100 | B-1 | 10.5 | D-1 | 3.30 | F-1 | 4.4 | 30.1 | 2.13 |
| Inv. Ex. 10 | A-6 | 100 | B-2 | 10.6 | D-1 | 3.30 | F-1 | 4.4 | 29.4 | 2.48 |
| Inv. Ex. 11 | A-7 | 100 | B-1 | 10.5 | D-2 | 4.08 | F-1 | 4.4 | 27.2 | 2.40 |
| Inv. Ex. 12 | A-8 | 100 | B-1 | 10.5 | D-1 | 3.30 | F-1 | 4.4 | 28.0 | 2.19 |
| Inv. Ex. 13 | A-9 | 100 | B-1 | 10.5 | D-1 | 3.30 | F-1 | 4.4 | 29.7 | 2.24 |
| Inv. Ex. 14 | A-3 | 100 | B-3 | 10.7 | D-2 | 4.08 | F-1 | 4.4 | 29.6 | 2.35 |
| Inv. Ex. 15 | A-3 | 100 | B-4 | 9.98 | D-2 | 4.08 | F-1 | 4.4 | 48.1 | 2.28 |
| Inv. Ex. 16 | A-10 | 100 | B-1 | 10.5 | D-2 | 4.08 | F-1 | 4.4 | 28.7 | 2.31 |
| Inv. Ex. 17 | A-11 | 100 | B-1 | 10.5 | D-2 | 4.08 | F-1 | 4.4 | 26.7 | 2.52 |
| Comp. Ex. 1 | A-X1 | 100 | B-1 | 10.5 | D-1 | 3.30 | F-1 | 4.4 | 30.4 | 3.55 |
| Comp. Ex. 2 | A-X2 | 100 | B-1 | 10.5 | D-2 | 4.08 | F-1 | 4.4 | 35.1 | 3.61 |
| Comp. Ex. 3 | A-3 | 100 | B-X1 | 9.93 | D-2 | 4.08 | F-1 | 4.4 | 37.5 | 2.53 |
| Comp. Ex. 4 | A-X3 | 100 | B-1 | 10.5 | D-1 | 3.30 | F-1 | 4.4 | 29.4 | 3.72 |
| Comp. Ex. 5 | A-X4 | 100 | B-1 | 10.5 | D-1 | 3.30 | F-1 | 4.4 | 36.0 | 2.33 |
| Comp. Ex. 6 | A-3 | 100 | B-X2 | 7.92 | D-2 | 4.08 | F-1 | 4.4 | 21.7 | 4.12 |

Symbols used in Table 2 have the following meanings. Each numerical value associated with the symbols in Table 2 is the content (parts by mass) of each substance.

A-1 to A-11: the above-described high molecular compounds A-1 to A-11, respectively;

A-X1 to A-X4: the above-described polymer compounds A-X1 to A-X4, respectively;

B-1 to B-4: acid generators that are compounds represented by the following Chemical formulae B-1 to B-4, respectively; B-X1 and B-X2: acid generators that are compounds represented by the following Chemical formulae B-X1 and B-X2, respectively;

D-1 to D-3: acid diffusion control agents represented by the following Chemical formulae D-1 to D-3, respectively; and F-1: a hydrophobic resin that is a compound represented by the following Chemical formula F-1 (composition ratio: (fluorine-containing unit)/(protective group)=80/20, Mw: 25,000, Mw/Mn: 1.5).

B-1

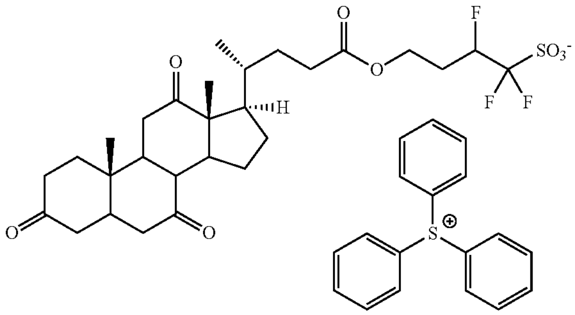

B-2

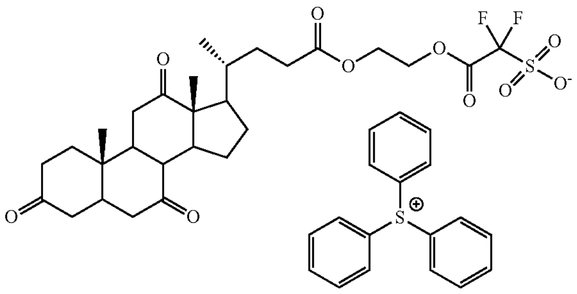

B-3

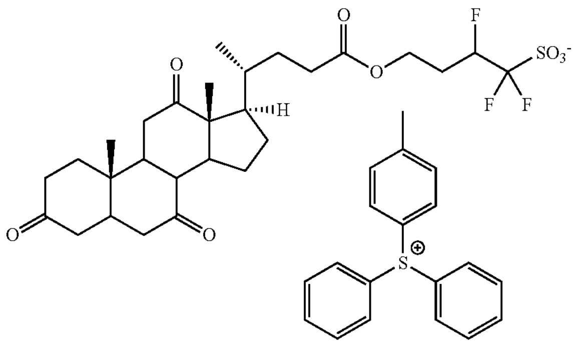

-continued

B-4

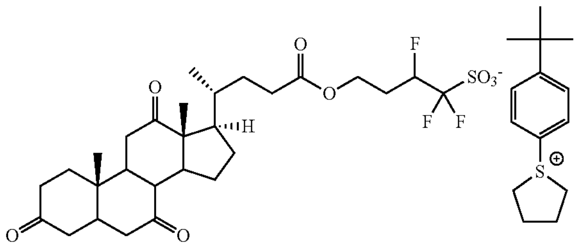

B-X1

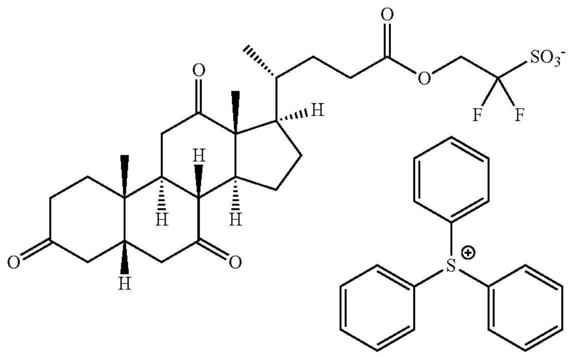

B-X2

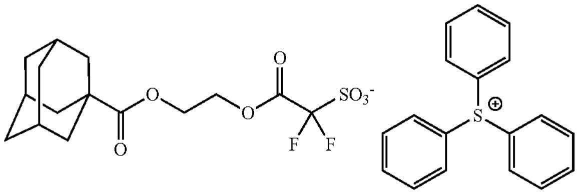

D-1

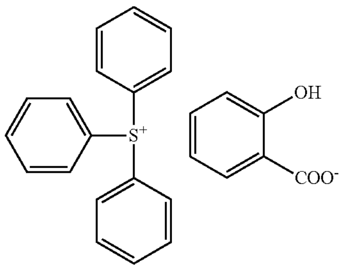

D-2

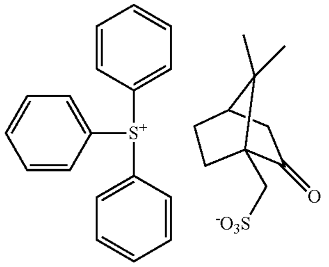

-continued

D-3

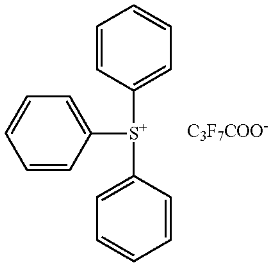

F-1

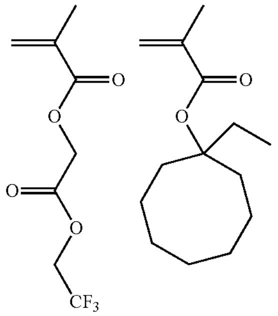

<Formation of Resist Pattern>

A 137-nm-thick organic antireflection film was formed by applying an organic antireflection film composition "SOC110D" (produced by Brewer Science, Inc.) on a 12-inch silicon wafer using a spinner and by drying it by baking it on a hot plate at 205° C. for 60 sec. Furthermore, a 30-nm-thick hard mask layer was formed by applying a hard mask "HM825" (produced by Brewer Science, Inc.) on the antireflection film using a spinner and by drying it by baking it on the hot plate at 205° C. for 60 sec.

A 100-nm-thick resist film was formed by applying a resist composition on the above-formed base substrate using a spinner and by drying it by performing prebaking (PAB) treatment on the hot plate at 100° C. for 60 sec.

The resist film was irradiated selectively with ArF excimer laser light (193 nm) via a photomask (6% halftone) using an immersion ArF exposing apparatus "XT1900Gi" (produced by ASML Holding N.V.; NA (numerical aperture): 1.35, Dipole90X, Sigma (Out 0.97, In 0.78) TE-pol, immersion medium: ultrapure water). PEB treatment was performed thereafter at 120° C. for 60 sec.

Subsequently, alkali development was performed at 23° C. for 15 sec using a 2.38 mass % TMAH aqueous solution (product name "NMD-3" produced by Tokyo Ohka Kogyo Co., Ltd.), followed by pure water rinsing of 15 sec and spin drying. As a result, a line-and-space pattern (hereinafter referred to as an "LS pattern") having a line dimension 40 nm and a pitch 80 nm (mask size: 40 nm) was formed.

[Evaluation of Optimum Exposure Eop]

A measurement was performed using a critical dimension-scanning SEM (scanning electron microscope; acceleration voltage: 300 V, product name "CG5000," produced by Hitachi Hi-Tech Corporation). A line size was observed during the above-described process <Formation of resist pattern> and an optimum exposure (mJ/$cm^2$) at which an LS pattern having a line dimension 40 nm and a pitch 80 nm was formed is shown in Table 2.

[Evaluation of LWR (Linewise Roughness)]

A line width of the LS pattern formed by the above-described process <Formation of resist pattern> was measured at 400 positions arranged in the line longitudinal direction by the critical dimension-scanning SEM (scanning electron microscope; acceleration voltage: 300 V, product name "CG5000," produced by Hitachi Hi-Tech Corporation), a triple value (3 s) of a standard deviation (s) was determined from the measurement values, and an average value (nm) of 3 s values of the 400 positions was calculated as a measure of LWR. A result is shown in Table 2. As the 3s value decreased, the line width roughness became lower, which means that an LS pattern obtained was higher in width uniformity.

It can be confirmed from the results shown in Table 2 that the resist compositions of the Inventive Examples to which the invention was applied were high in sensitivity in the formation of a resist pattern and were so high in lithographic properties as to enable formation of a resist pattern having good shapes.

What is claimed is:

1. A resist composition that generates an acid when the resist composition is exposed and whose solubility with respect to a developing liquid varies by action of the acid, wherein:

the resist composition comprises a base material component (A) whose solubility with respect to a developing liquid is varied by action of an acid and an acid generator component (B) that generates an acid when the acid generator component (B) is exposed;

the base material component (A) comprises a polymer compound (A1) that comprises a constituent (a1) represented by the following general formula (a-1):

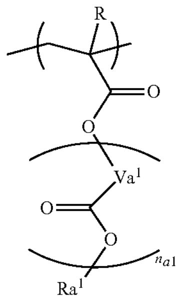

(a-1)

wherein R represents a hydrogen atom, an alkyl group having a carbon atom number of 1 to 5, or an alkyl halide group having a carbon atom number of 1 to 5, $Va^1$ represents a divalent hydrocarbon group that may have an ether bond, $n_{a1}$ represents an integer of 0 to 2, and $Ra^1$ represents a substituent that is represented by one of the following formulae (y-1) and (y-2):

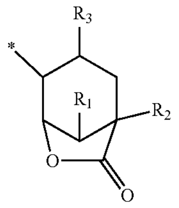

(y-1)

-continued (y-2)

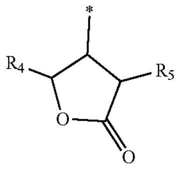

wherein in the formulae (y-1) and (y-2), each of $R_1$, $R_2$ and $R_3$ represents an alkyl group that may include a hetero atom, a hetero atom, a cyano group, or a hydrogen atom, $R_1$ and $R_3$ may be connected to each other to form a ring and may be an alkylene group having a carbon atom number of 1 to 6 that may include an oxygen atom (—O—) or a sulfur atom (—S—), an ether bond, or a thioether bond, with the proviso that at least one of $R_1$ and $R_2$ includes a hetero atom or $R_1$ and $R_3$ are connected to each other so as to represent a hetero atom, each of $R_4$ and $R_5$ represents an alkyl group that may include a hydrogen atom or a hetero atom, and symbol "*" represents a bond;

the polymer compound (A1) further comprises a constituent (a2) represented by the following general formula (a-2):

(a-2)

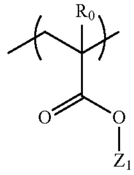

wherein in the general formula (a-2), $R_0$ represents a hydrogen atom, an alkyl group having a carbon atom number of 1 to 5, or an alkyl halide group having a carbon atom number of 1 to 5, $Z_1$ represents an organic group including a polycyclic hydrocarbon group to which at least two hydroxyl groups are connected, and a carbon atom of the organic group may be replaced by a hetero atom; and the acid generator component (B) comprises a compound that is represented by the following general formula (b1):

(b1)

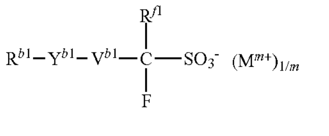

wherein in the general formula (b1), $R^{b1}$ represents a monovalent hydrocarbon group having a carbon atom number of 17 to 50 that has a steroid framework and may include a heteroatom, $Y^{b1}$ represents a divalent linking group including a hetero atom, $V^{b1}$ represents an ester group, or $Y^{b1}$—$V^{b1}$ is $Y^{b1}$—$(CH_2)_n$—CHF— wherein n is an integer of 0 to 2, $R^{f1}$ represents a hydrogen atom, a fluorine atom, or an alkyl group that may include a fluorine atom, m is an integer of 1 or larger, and $M^{m+}$ represents an m-valent organic cation.

2. The resist composition according to claim 1, wherein $M^{m+}$ in the general formula (b1) is a cation that is represented by the following formula (b-2):

(b-2)

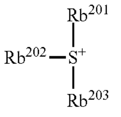

wherein in the formula (b-2), each of $Rb^{201}$ and $Rb^{202}$ represents an aryl group that may include a substituent, $Rb^{203}$ represents an aryl group that may include a substituent, an alkyl group that may include a substituent, or an alkenyl group that may include a substituent, and $Rb^{201}$ to $Rb^{203}$ may be connected to each other to form a ring together with a sulfur atom in the formula (b-2).

3. The resist composition according to claim 1, wherein the polymer compound (A1) further comprises a constituent (a3) represented by the following general formula (a-3):

(a-3)

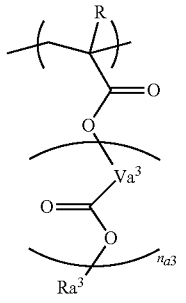

wherein in the general formula (a-3), R represents a hydrogen atom, an alkyl group having a carbon atom number of 1 to 5, or an alkyl halide group having a carbon atom number of 1 to 5, $Va^3$ represents a divalent hydrocarbon group that may have an ether bond, $n_{a3}$ represents an integer of 0 to 2, and $Ra^3$ represents an acid-dissociable group including an alicyclic hydrocarbon group.

4. A resist pattern forming method comprising:

forming a resist film on a support body using the resist composition according to claim 1;

exposing the resist film; and forming a resist pattern by developing the resist film.

* * * * *